(12) United States Patent
Ko et al.

(10) Patent No.: US 8,964,866 B2
(45) Date of Patent: Feb. 24, 2015

(54) METHOD AND APPARATUS FOR TRANSMITTING SIGNALS USING CODEBOOKS IN A WIRELESS COMMUNICATION SYSTEM THAT SUPPORTS MULTIPLE ANTENNAS

(75) Inventors: Hyunsoo Ko, Anyang-si (KR); Jaehoon Chung, Anyang-si (KR); Moonil Lee, Anyang-si (KR)

(73) Assignee: LG Electronics Inc., Seoul (KR)

( * ) Notice: Subject to any disclaimer, the term of this patent is extended or adjusted under 35 U.S.C. 154(b) by 144 days.

(21) Appl. No.: 13/807,219

(22) PCT Filed: Jul. 1, 2011

(86) PCT No.: PCT/KR2011/004842
§ 371 (c)(1),
(2), (4) Date: Mar. 8, 2013

(87) PCT Pub. No.: WO2012/002767
PCT Pub. Date: Jan. 5, 2012

(65) Prior Publication Data
US 2013/0156125 A1    Jun. 20, 2013

Related U.S. Application Data

(60) Provisional application No. 61/361,291, filed on Jul. 2, 2010, provisional application No. 61/373,864, filed on Aug. 15, 2010, provisional application No. 61/374,229, filed on Aug. 16, 2010.

(51) Int. Cl.
| | | |
|---|---|---|
| H04K 1/10 | (2006.01) | |
| H04L 27/28 | (2006.01) | |
| H04B 7/04 | (2006.01) | |
| H04L 25/03 | (2006.01) | |
| H04B 7/06 | (2006.01) | |
| H03M 13/09 | (2006.01) | |
| H04L 27/26 | (2006.01) | |

(52) U.S. Cl.
CPC ........ *H04B 7/0456* (2013.01); *H04L 25/03343* (2013.01); *H04L 25/0391* (2013.01); *H04L25/03949* (2013.01); *H04B 7/0478* (2013.01); *H04B 7/065* (2013.01); *H04B 7/0639* (2013.01); *H03M 13/09* (2013.01); *H04B 7/0465* (2013.01); *H04B 7/0469* (2013.01); *H04L 27/2613* (2013.01)
USPC ........... 375/260; 375/267; 375/299; 375/347; 370/330; 370/322; 370/333; 455/500; 455/501; 455/101

(58) Field of Classification Search
CPC .............. H04L 27/2647; H04L 5/0007; H04L 27/2657; H04L 27/2662; H04L 5/0048; H04L 1/0618; H04L 1/06; H04L 25/0204; H04L 1/0071; H04L 1/0002; H04L 1/20; H04B 7/0845; H04B 7/0854; H04B 7/0857; H04B 7/0417; H04B 7/0669; H04B 7/0617; H04B 7/0634; H04B 7/0671; H04B 7/0413; H04B 1/1027; H04B 15/00; H04B 17/0057; H04W 72/0446; H04W 88/08; H04W 72/0453; H04W 36/30; H04W 36/18; H04W 24/00; H04W 48/16; H04W 36/14; H04W 28/04; H04W 28/22; H04W 52/12; H04W 52/42; H04W 16/28; H04W 88/02; H04W 16/14; H04W 72/082
USPC .......... 375/260, 267, 299, 347; 370/330, 332, 370/333; 455/500, 501, 101
See application file for complete search history.

(56) References Cited

U.S. PATENT DOCUMENTS

| 8,509,338 B2 * | 8/2013 | Sayana et al. ................. 375/267 |
| 2007/0274411 A1 * | 11/2007 | Lee et al. ...................... 375/267 |

FOREIGN PATENT DOCUMENTS

| KR | 10-2008-0076744 | 8/2008 |
| KR | 10-2009-0073758 | 7/2009 |
| KR | 10-2009-0117583 | 11/2009 |
| KR | 10-2010-0032806 | 3/2010 |

* cited by examiner

Primary Examiner — Phuong Phu
(74) Attorney, Agent, or Firm — McKenna Long & Aldridge LLP

(57) ABSTRACT

The present invention relates to a wireless communication system, and more particularly, to a method and apparatus for transmitting signals using codebooks in a wireless communication system that supports multiple antennas. A method in which a base station transmits downlink signals according to one embodiment of the present invention comprises the following steps: receiving a first precoding matrix indicator (PMI) and a second precoding matrix indicator from a terminal; determining a first matrix (W1) from a first codebook including precoding matrixes indicated by the first PMI, determining a second matrix (W2) from a second codebook, including precoding matrices indicated by the second PMI, and determining a precoding matrix (W) based on the first matrix (W1) and second matrix (W2); performing precoding on one or more layers, to which the downlink signals are mapped, using the determined precoding matrix (W); and transmitting the precoded signals to the terminal. Each of the precoding matrices included in the first codebook is a block diagonal matrix, and one block has, as compared to the other block, a form multiplied by a predetermined phase value.

10 Claims, 24 Drawing Sheets

FIG. 13
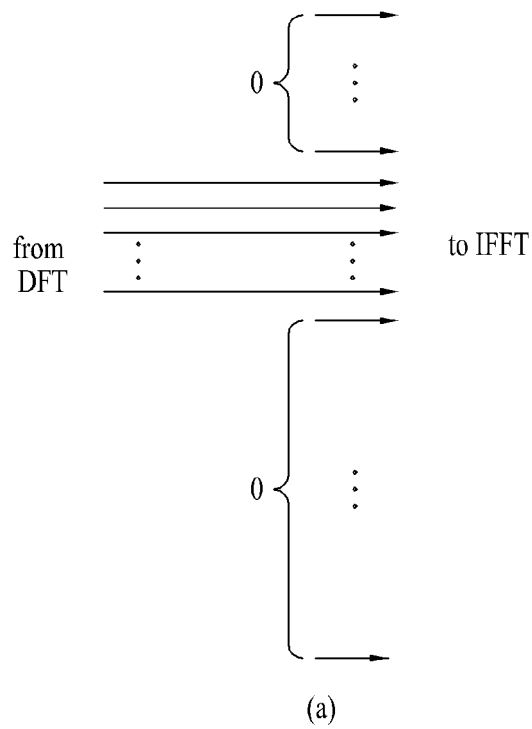
(a)
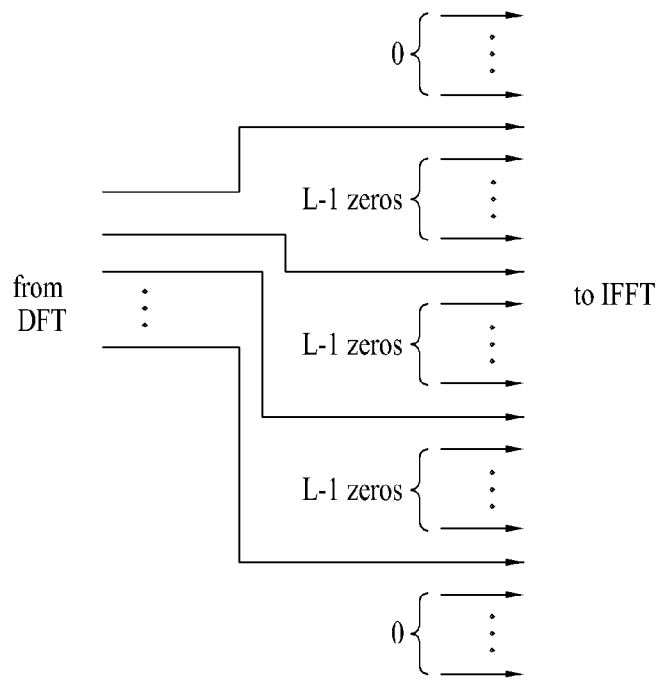
(b)

FIG. 15
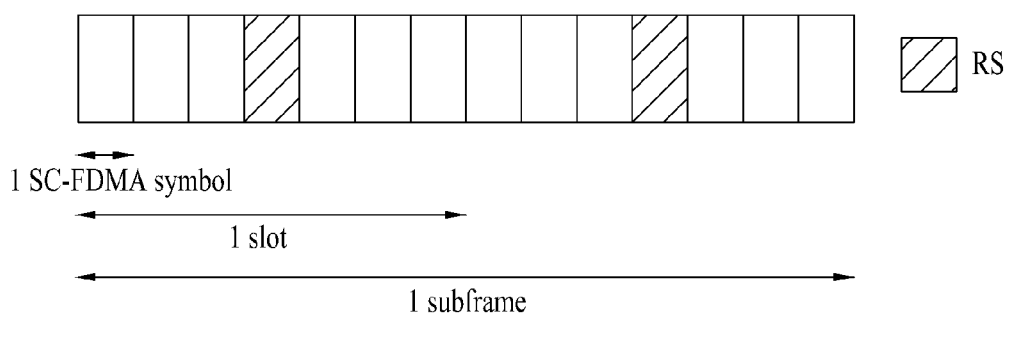
(a)
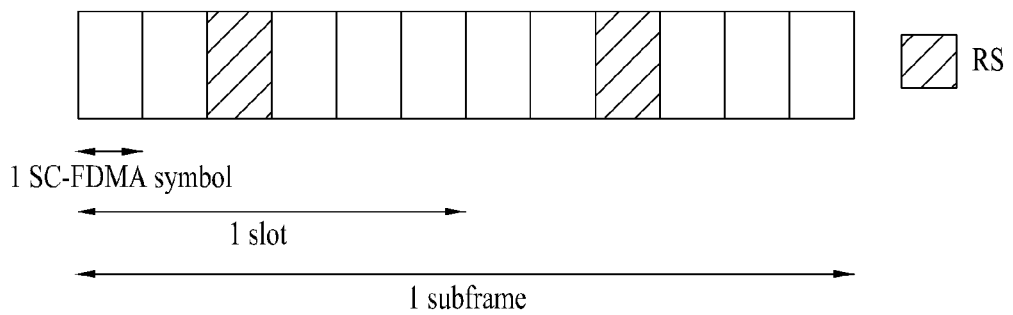
(b)

FIG. 23
(a) 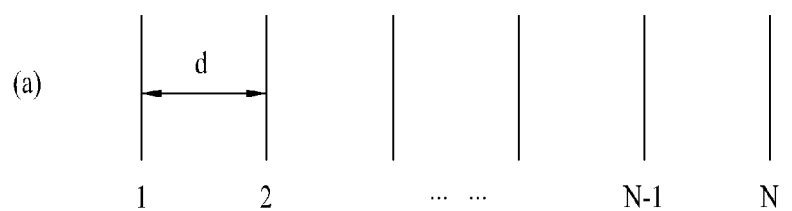
(b) 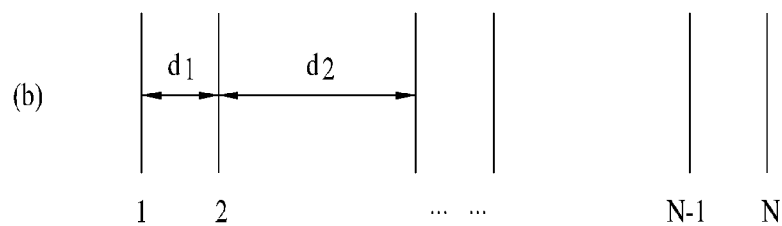
(c) 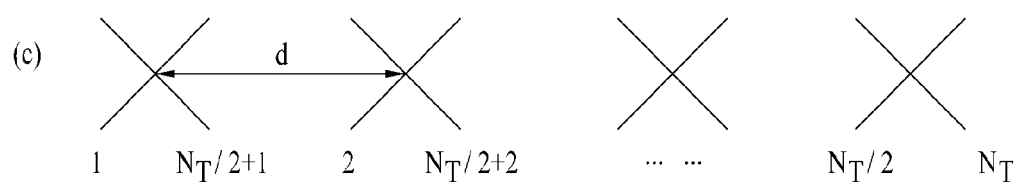

METHOD AND APPARATUS FOR TRANSMITTING SIGNALS USING CODEBOOKS IN A WIRELESS COMMUNICATION SYSTEM THAT SUPPORTS MULTIPLE ANTENNAS

This application is a 35 U.S.C. §371 National Stage Entry of International Application No. PCT/KR2011/004842, filed Jul. 1, 2011 and claims the benefit of U.S. Provisional Application Nos. 61/361,291, filed Jul. 2, 2010; 61/373,864, filed Aug. 15, 2010; and 61/374,229, filed Aug. 16, 2010, all of which are incorporated by reference in their entirety herein.

TECHNICAL FIELD

The present invention relates to a wireless communication system, and more particularly, to a method and apparatus for transmitting a signal using a codebook in a multi-antenna supportive wireless communication system.

BACKGROUND ART

MIMO (multi-input multi-output) technology means a method of improving data transceiving efficiency by adopting multiple transmitting antennas and multiple receiving antennas instead of a single transmitting antenna and a single receiving antenna. In particular, this technology increases capacity or enhances performance using multiple antennas in a transmitting or receiving end of a wireless communication system. This MIMO technology may be called multi-antenna technology.

In order to support MIMO transmission, it may be able to use a precoding matrix to appropriately distribute transmission information to each antenna in accordance with a channel status and the like. In the conventional 3GPP ($3^{rd}$ generation partnership project) LTE (long term evolution) system, maximum 4 transmitting antennas are supported for downlink transmission and a corresponding precoding codebook is defined.

DISCLOSURE OF THE INVENTION

Technical Task

In the conventional 3GPP LTE system (e.g., system by 3GPP LTE Release-8 or -9 standard), a codebook is designed to support maximum 4 transmitting antennas in downlink (DL). In 3GPP LTE-A system evolved from the conventional 3GPP LTE, introduction of an extended antenna configuration is taken into consideration for advanced capacity (e.g., advanced spectral efficiency) and the ongoing discussion is made to support maximum 8 transmitting antennas in DL. In order to provide high throughput, Closed-Loop MIMO scheme may be usable for DL 8 antenna transmission. In case of Closed-Loop MIMO transmission by FDD (frequency division duplex), it may be able to consider applying codebook based Closed-Loop MIMO. Hence, it may be requested to design a precoding codebook that provides good capacity for DL transmission via maximum 8 transmitting antennas.

The technical task of the present invention is to provide a method and apparatus for transmitting a signal using a codebook, by which MIMO transmission supportive of extended antenna configuration can be efficiently supported. Another technical task of the present invention is to provide a method and apparatus for transmitting a signal using a codebook, by which feedback overhead can be reduced while system performance is maintained for MIMO transmission via multiple transmitting antennas.

Technical tasks obtainable from the present invention are non-limited the above-mentioned technical task. And, other unmentioned technical tasks can be clearly understood from the following description by those having ordinary skill in the technical field to which the present invention pertains.

Technical Solutions

To achieve these and other advantages and in accordance with the purpose of the present invention, as embodied and broadly described, a method of transmitting a downlink signal, which is transmitted by a base station, according to one embodiment of the present invention may include the steps of receiving a $1^{st}$ PMI (precoding matrix indicator) and a $2^{nd}$ PMI from a user equipment, determining a $1^{st}$ matrix (W1) from a $1^{st}$ codebook including precoding matrixes indicated by the $1^{st}$ PMI, determining a $2^{nd}$ matrix (W2) from a $2^{nd}$ codebook including precoding matrixes indicated by the $2^{nd}$ PMI, determining a precoding matrix (W) based on the $1^{st}$ matrix (W1) and the $2^{nd}$ matrix (W2), performing a precoding on at least one layer having the downlink signal mapped thereto using the determined precoding matrix (W), and transmitting the precoded signal to the user equipment, wherein each of the precoding matrixes included in the $1^{st}$ code book is configured with a block diagonal matrix and wherein one block is multiplied by a prescribed phase value while the other is not.

To further achieve these and other advantages and in accordance with the purpose of the present invention, a method of receiving a downlink signal, which is received by a user equipment, according to another embodiment of the present invention may include the steps of transmitting a $1^{st}$ PMI (precoding matrix indicator) and a $2^{nd}$ PMI to a base station, receiving a signal having a precoding performed on at least one layer having the downlink signal mapped thereto from the base station using a precoding matrix (W) determined based on a $1^{st}$ matrix (W1) determined from a $1^{st}$ codebook including precoding matrixes indicated by the $1^{st}$ PMI and a $2^{nd}$ matrix (W2) determined from a $2^{nd}$ codebook including precoding matrixes indicated by the $2^{nd}$ PMI, and processing the received downlink signal using the precoding matrix (W), wherein each of the precoding matrixes included in the $1^{st}$ code book is configured with a block diagonal matrix and wherein one block is multiplied by a prescribed phase value while the other is not.

To further achieve these and other advantages and in accordance with the purpose of the present invention, a base station, which transmits a downlink signal, according to another embodiment of the present invention may include a transmitting module transmitting a downlink signal to a user equipment, a receiving module receiving an uplink signal from the user equipment, a memory storing a codebook including precoding matrixes, and a processor controlling the base station, the processor configured to receive a 1st PMI (precoding matrix indicator) and a $2^{nd}$ PMI from the user equipment via the receiving module, the processor configured to determine a $1^{st}$ matrix (W1) from a $1^{st}$ codebook including precoding matrixes indicated by the $1^{st}$ PMI, determine a $2^{nd}$ matrix (W2) from a $2^{nd}$ codebook including precoding matrixes indicated by the $2^{nd}$ PMI, and determine a precoding matrix (W) based on the $1^{st}$ matrix (W1) and the $2^{nd}$ matrix (W2), the processor configured to perform a precoding on at least one layer having the downlink signal mapped thereto using the determined precoding matrix (W), the processor configured to transmit the precoded signal to the user equipment, wherein each of the precoding matrixes included in the 1$^{st}$ code book is configured with a block diagonal matrix and wherein one block is multiplied by a prescribed phase value while the other is not.

To further achieve these and other advantages and in accordance with the purpose of the present invention, a user equipment, which receives a downlink signal, according to a further embodiment of the present invention may include a receiving module receiving the downlink signal from a base station, a transmitting module transmitting an uplink signal to the base station, a memory storing a codebook including precoding matrixes, and a processor controlling the user equipment, the processor configured to transmit a 1$^{st}$ PMI (precoding matrix indicator) and a 2$^{nd}$ PMI to the base station via the transmitting module, the processor configured to receive a signal having a precoding performed on at least one layer having the downlink signal mapped thereto from the base station via the receiving module using a precoding matrix (W) determined based on a 1$^{st}$ matrix (W1) determined from a 1$^{st}$ codebook including precoding matrixes indicated by the 1$^{st}$ PMI and a 2$^{nd}$ matrix (W2) determined from a 2$^{nd}$ codebook including precoding matrixes indicated by the 2$^{nd}$ PMI, the processor configured to process the received downlink signal using the precoding matrix (W), wherein each of the precoding matrixes included in the 1$^{st}$ code book is configured with a block diagonal matrix and wherein one block is multiplied by a prescribed phase value while the other is not.

The following matters may be applicable in common to the above-mentioned embodiments of the present invention.

Preferably, the 1$^{st}$ matrix (W1) is configured as a following formula:

$$W_1^{(n)} = \begin{bmatrix} X^{(n)} & 0 \\ 0 & \alpha^{(n)} X^{(n)} \end{bmatrix},$$

wherein the $X^{(n)}$ and the $\alpha^{(n)} X^{(n)}$ correspond to the blocks of the block diagonal matrix, and wherein the $\alpha^{(n)}$ corresponds to the prescribed phase value.

More preferably, the $X^{(n)}$ is configured with a DFT (Discrete Fourier Transform) vector defined as a following formula:

$$X^{(n)} = \frac{1}{\sqrt{K}} e^{j\frac{2\pi nk}{N}}$$
$$n = 0, \ldots, N-1$$
$$k = 0, \ldots, K-1,$$

wherein the N indicates the number of the DFT vectors, and wherein the K indicates a length of the DFT vector.

More preferably, the $\alpha^{(n)}$ is defined as a following formula:

$$\alpha^{(n)} = e^{j\frac{2\pi nk}{N}}$$
$$n = 0, \ldots, N-1.$$

More preferably, the $\alpha^{(n)}$ is defined as a phase diagonal matrix represented as a following formula:

$$\alpha^{(n)} = \text{diag}(e^{j\theta_0(n)} \ldots e^{j\theta_{K-1}(n)}) = \begin{bmatrix} e^{j\theta_0(n)} & 0 & \ldots & 0 \\ 0 & e^{j\theta_1(n)} & \ldots & 0 \\ \vdots & \vdots & \ddots & \vdots \\ 0 & 0 & \ldots & e^{j\theta_{K-1}(n)} \end{bmatrix}.$$

The above-mentioned general description of the present invention and the following details of the present invention are exemplary and may be provided for the additional description of the invention disclosed in claims.

Advantageous Effects

Accordingly, the present invention provides a method and apparatus for transmitting a signal using a codebook, by which MIMO transmission supportive of extended antenna configuration can be efficiently supported. And, the present invention provides a method and apparatus for transmitting a signal using a codebook, by which feedback overhead can be reduced while system performance is maintained for MIMO transmission via multiple transmitting antennas.

Effects obtainable from the present invention are non-limited by the above mentioned effect. And, other unmentioned effects can be clearly understood from the following description by those having ordinary skill in the technical field to which the present invention pertains.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention.

FIG. 13 is a diagram to describe a scheme of mapping DFT processed signal to a frequency region.

FIG. 15 is a diagram to illustrate a symbol position having a reference signal mapped thereto.

FIG. 23 is a diagram for examples of configuration of 8 transmitting antennas.

BEST MODE FOR INVENTION

Figure 1:
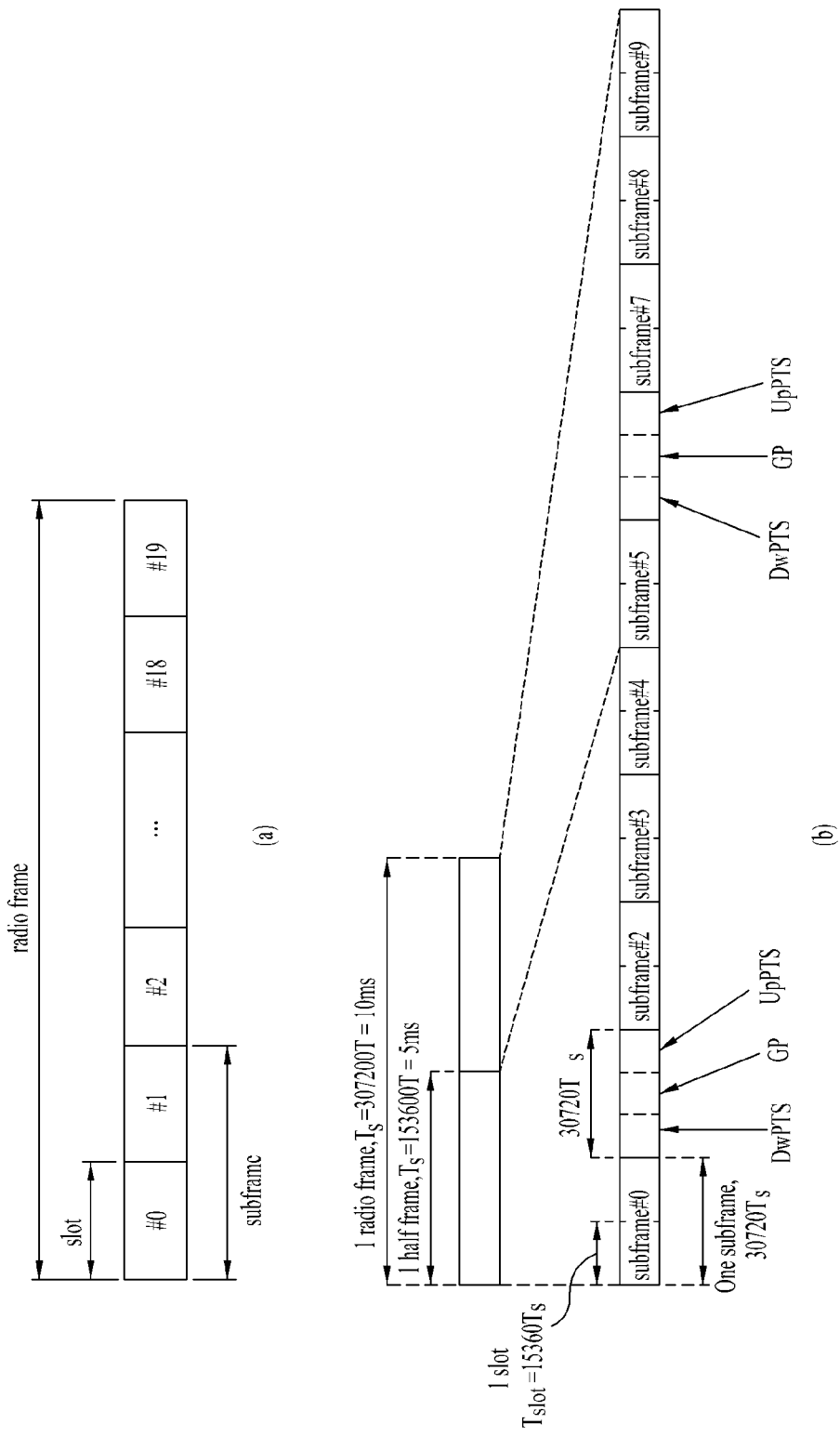
FIG. 1 is a diagram to describe a structure of a downlink radio frame.

First of all, the following embodiments correspond to combinations of elements and features of the present invention in prescribed forms. And, the respective elements or features may be considered as selective unless they are explicitly mentioned. Each of the elements or features can be implemented in a form failing to be combined with other elements or features. Moreover, an embodiment of the present invention may be implemented by combining elements and/or features together in part. A sequence of operations explained for each embodiment of the present invention may be modifiable. Some configurations or features of one embodiment may be included in another embodiment or substituted with corresponding configurations or features of another embodiment.

In this specification, embodiments of the present invention are described centering on the data transmission/reception relations between a base station and a terminal. In this case, the base station may be meaningful as a terminal node of a network which directly performs communication with the terminal. In this disclosure, a specific operation explained as performed by a base station may be performed by an upper node of the base station in some cases.

In particular, in a network constructed with a plurality of network nodes including a base station, it is apparent that various operations performed for communication with a terminal can be performed by a base station or other networks except the base station. 'Base station (BS)' may be substituted with such a terminology as a fixed station, a Node B, an eNode B (eNB), an access point (AP) and the like. Moreover, in this specification, a terminology called a base station may be conceptionally used as including a cell or a sector. Meanwhile, a relay may be substituted with such a terminology as a relay node (RN), a relay station (RS) and the like. And, 'terminal' may be substituted with such a terminology as a user equipment (UE), a mobile station (MS), a mobile subscriber station (MSS), a subscriber station (SS) and the like. In this specification, an uplink transmission entity may mean a terminal or a relay. And, an uplink reception entity may mean a base station or a relay. Similarly, a downlink transmission entity may mean a base station or a relay. And, a downlink reception entity may mean a terminal or a relay. So to speak, an uplink transmission may mean a transmission from a terminal to a base station, a transmission from a terminal to a relay, or a transmission from a relay to a base station. Similarly, a downlink transmission may mean a transmission from a base station to a terminal, a transmission from a base station to a relay, or a transmission from a relay to a terminal.

Specific terminologies used for the following description may be provided to help the understanding of the present invention. And, the use of the specific terminology may be modified into other forms within the scope of the technical idea of the present invention.

Occasionally, to prevent the present invention from getting vaguer, structures and/or devices known to the public may be skipped or represented as block diagrams centering on the core functions of the structures and/or devices. Wherever possible, the same reference numbers will be used throughout the drawings to refer to the same or like parts in this specification.

Embodiments of the present invention may be supported by the disclosed standard documents of at least one of wireless access systems including IEEE 802 system, 3GPP system, 3GPP LTE and LTE-A (LTE-Advanced) system and 3GPP2 system. In particular, the steps or parts, which are not explained to clearly reveal the technical idea of the present invention, in the embodiments of the present invention may be supported by the above documents. Moreover, all terminologies disclosed in this document may be supported by the above standard documents.

The following description of embodiments of the present invention may apply to various wireless access systems including CDMA (code division multiple access), FDMA (frequency division multiple access), TDMA (time division multiple access), OFDMA (orthogonal frequency division multiple access), SC-FDMA (single carrier frequency division multiple access) and the like. CDMA can be implemented with such a radio technology as UTRA (universal terrestrial radio access), CDMA 2000 and the like. TDMA can be implemented with such a radio technology as GSM/GPRS/EDGE (Global System for Mobile communications)/General Packet Radio Service/Enhanced Data Rates for GSM Evolution). OFDMA can be implemented with such a radio technology as IEEE 802.11 (Wi-Fi), IEEE 802.16 (WiMAX), IEEE 802.20, E-UTRA (Evolved UTRA), etc. UTRA is a part of UMTS (Universal Mobile Telecommunications System). 3GPP (3rd Generation Partnership Project) LTE (long term evolution) is a part of E-UMTS (Evolved UMTS) that uses E-UTRA. The 3GPP LTE adopts OFDMA in downlink (hereinafter abbreviated) DL and SC-FDMA in uplink (hereinafter abbreviated UL). And, LTE-A (LTE-Advanced) is an evolved version of 3GPP LTE. WiMAX may be explained by IEEE 802.16e standard (e.g., WirelessMAN-OFDMA reference system) and advanced IEEE 802.16m standard (e.g., WirelessMAN-OFDMA advanced system). For clarity, the following description mainly concerns 3GPP LTE system or 3GPP LTE-A system, by which the technical idea of the present invention may be non-limited.

A structure of a downlink (DL) radio frame is described with reference to FIG. 1 as follows.

In a cellular OFDM radio packet communication system, UL/DL (uplink/downlink) data packet transmission is performed by a unit of subframe. And, one subframe is defined as a predetermined time interval including a plurality of OFDM symbols. In the 3GPP LTE standard, a type-1 radio frame structure applicable to FDD (frequency division duplex) and a type-2 radio frame structure applicable to TDD (time division duplex) are supported.

FIG. 1(*a*) is a diagram for a structure of a downlink radio frame of type 1. A DL (downlink) radio frame includes 10 subframes. Each of the subframes includes 2 slots. And, a time taken to transmit one subframe is defined as a transmission time interval (hereinafter abbreviated TTI). For instance, one subframe may have a length of 1 ms and one slot may have a length of 0.5 ms. One slot may include a plurality of OFDM symbols in time domain or may include a plurality of resource blocks (RBs) in frequency domain. Since 3GPP system uses OFDMA in downlink, OFDM symbol indicates one symbol duration. The OFDM symbol may be named SC-FDMA symbol or symbol duration. Resource block (RB)

is a resource allocation unit and may include a plurality of contiguous subcarriers in one slot.

The number of OFDM symbols included in one slot may vary in accordance with a configuration of CP. The CP may be categorized into an extended CP and a normal CP. For instance, in case that OFDM symbols are configured by the normal CP, the number of OFDM symbols included in one slot may be 7. In case that OFDM symbols are configured by the extended CP, since a length of one OFDM symbol increases, the number of OFDM symbols included in one slot may be smaller than that of the case of the normal CP. In case of the extended CP, for instance, the number of OFDM symbols included in one slot may be 6. If a channel status is unstable (e.g., a UE is moving at high speed), it may be able to use the extended CP to further reduce the inter-symbol interference.

When a normal CP is used, since one slot includes 7 OFDM symbols, one subframe includes 14 OFDM symbols. In this case, first 2 or 3 OFDM symbols of each subframe may be allocated to PDCCH (physical downlink control channel), while the rest of the OFDM symbols are allocated to PDSCH (physical downlink shared channel).

FIG. 1(b) is a diagram for a structure of a downlink radio frame of type 2. A type-2 radio frame includes 2 half frames. Each of the half frame includes 5 subframes, DwPTS (downlink pilot time slot), GP (guard period) and UpPTS (uplink pilot time slot). And, one of the subframes includes 2 slots. The DwPTS is used for initial cell search, synchronization or channel estimation in a user equipment. The UpPTS is used for channel estimation in a base station and uplink transmission synchronization of a user equipment. The guard period is a period for eliminating interference generated in uplink due to multipath delay of a downlink signal between uplink and downlink. Meanwhile, 1 subframe is constructed with 2 slots irrespective of a type of a radio frame.

The above-described structures of the radio frame are just exemplary. And, the number of subframes included in a radio frame, the number of slots included in the subframe and the number of symbols included in the slot may be modified in various ways.

Figure 2:
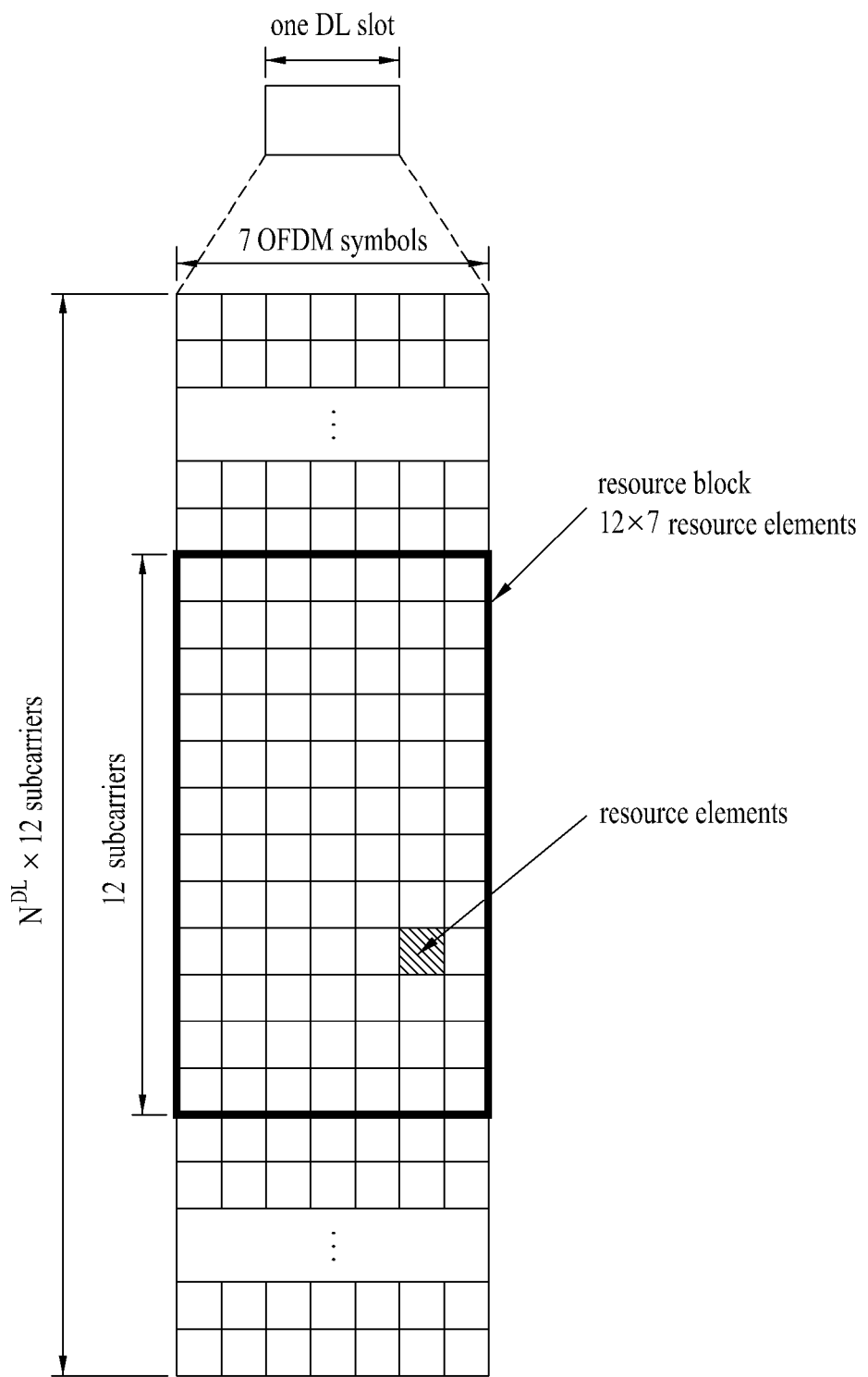
FIG. 2 is a diagram for one example of a resource grid for a single downlink slot.

FIG. 2 is a diagram for one example of a resource grid for a downlink (DL) slot. This corresponds to a case that OFDM symbol includes a normal CP. Referring to FIG. 2, a downlink slot includes a plurality of OFDM symbols in time domain and includes a plurality of resource blocks in frequency domain. In this case, for example, a single downlink slot includes 7 OFDM symbols and a single resource block includes 12 subcarriers, by which configurations of the downlink slot and the resource block are non-limited. Each element on a resource grid is called a resource element (RE). for instance, a resource element a (k, 1) becomes a resource element located at $k^{th}$ subcarrier and $1^{th}$ OFDM symbol. In case of a normal CP, a single resource block includes 12×7 resource elements [in case of an extended CP, 12×6 resource elements are included]. Since an interval of each subcarrier is 15 kHz, a single resource block includes about 180 kHz in frequency domain. $N^{DL}$ indicates the number of resource blocks included in a downlink slot. And, the value of $N^{DL}$ may be determined depending on a downlink transmission bandwidth set up by scheduling of a base station.

Figure 3:
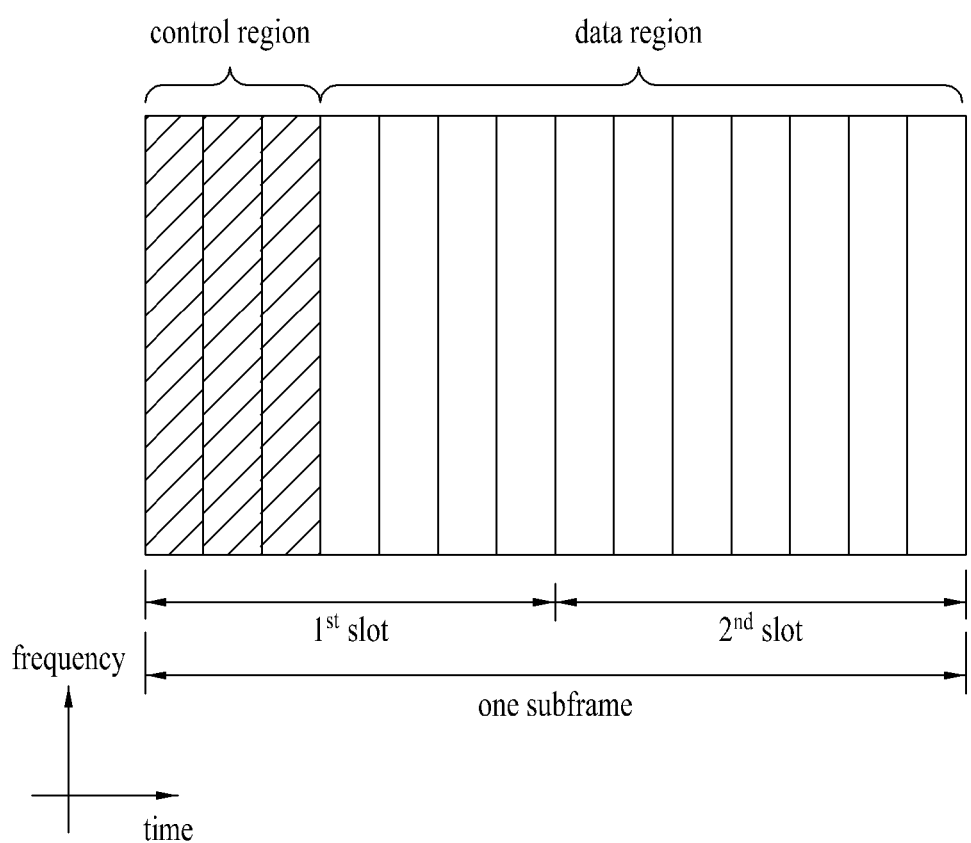
FIG. 3 is a diagram for a structure of a downlink subframe.

FIG. 3 is a diagram for a structure of a downlink (DL) subframe. Maximum 3 OFDM symbols situated in a head part of a first slot of one subframe correspond to a control region to which a control channel is allocated. The rest of OFDM symbols correspond to a data region to which PDSCH (physical downlink shared channel) is allocated. A basic unit of transmission becomes one subframe. In particular, PDCCH and PDSCH are assigned across 2 slots. Examples of DL control channels used by 3GPP LTE system may include PCFICH (Physical Control Format Indicator Channel), PDCCH (Physical Downlink Control Channel), PHICH (Physical hybrid automatic repeat request indicator Channel) and the like. The PCFICH is transmitted in a first OFDM symbol of a subframe and includes information on the number of OFDM symbols used for a transmission of a control channel within the subframe. The PHICH includes HARQ ACK/NACK signal in response to a UL transmission. Control information carried on PDCCH may be called downlink control information (DCI). The DCI may include UL or DL scheduling information or a UL transmission power control command for a random UE (user equipment) group. The PDCCH may include transmission format and resource allocation information of DL-SCH (downlink shared channel), resource allocation information on UL-SCH (uplink shared channel), paging information on PCH (paging channel), system information on DL-SCH, resource allocation of such a higher layer control message as a random access response transmitted on PDSCH, transmission power control command set for individual UEs within a random UE group, transmission power control information, activation of VoIP (voice over IP) and the like. A plurality of PDCCHs can be transmitted within the control region. A user equipment may be able to monitor a plurality of the PDCCHs. The PDCCH is transmitted as an aggregation of at least one or more contiguous CCEs (control channel elements). The CCE is a logical allocation unit used to provide the PDCCH at a coding rate based on a radio channel status. The CCE may correspond to a plurality of REGs (resource element groups). A format of the PDCCH and the number of available PDCCH bits may be determined in accordance with correlation between the number of CCEs and a coding rate provided by the CCE. A base station determines a PDCCH format in accordance with a DCI which is to be transmitted to a user equipment and attaches a CRC (cyclic redundancy check) to control information. The CRC is masked with an identifier named RNTI (radio network temporary identifier) in accordance with an owner or usage of the PDCCH. For instance, if the PDCCH is provided for a specific user equipment, the CRC may be masked with an identifier (e.g., cell-RNTI (C-RNTI)) of the corresponding user equipment. In case that the PDCCH is provided for a paging message, the CRC may be masked with a paging indicator identifier (e.g., P-RNTI). If the PDCCH is provided for system information (particularly, for a system information block (SIC)), the CRC may be masked with a system information identifier and a system information RNTI (SI-RNTI). In order to indicate a random access response to a transmission of a random access preamble of a user equipment, the CRC may be masked with RA-RNTI (random access-RNTI).

Figure 4:
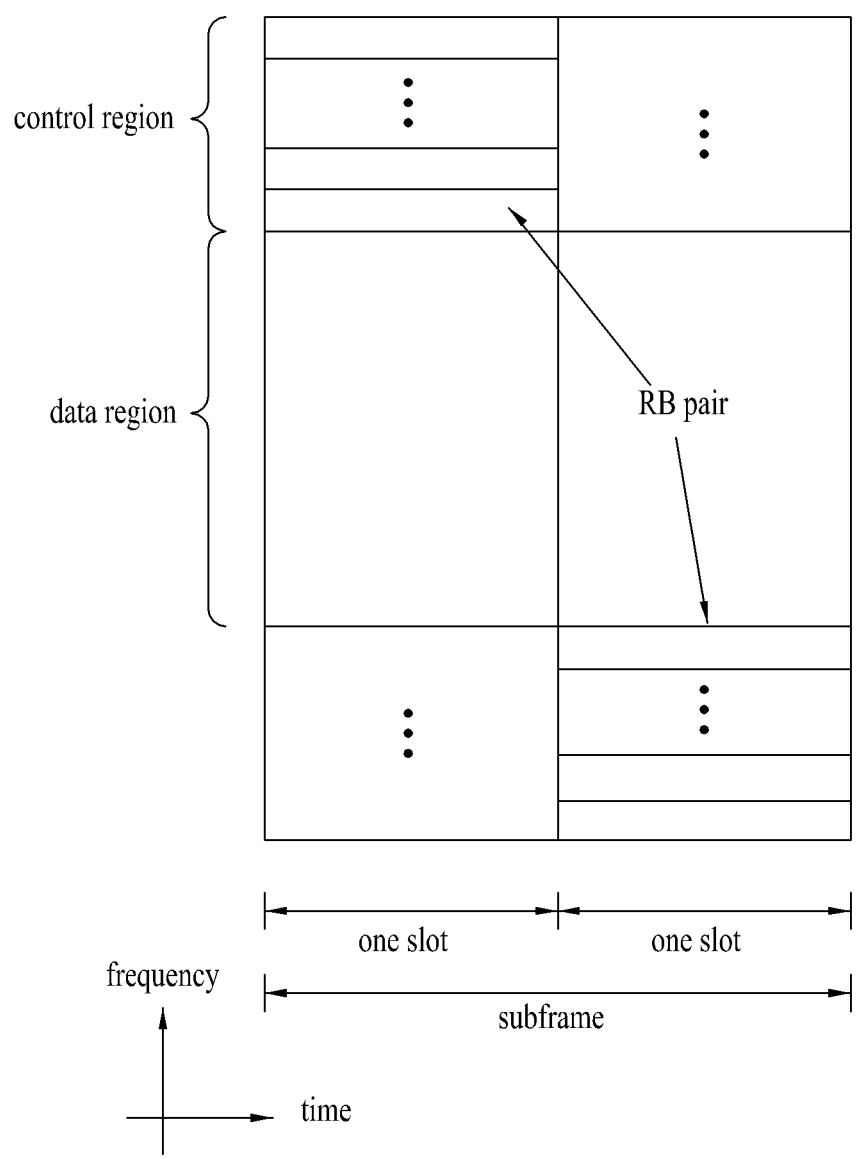
FIG. 4 is a diagram for a structure of an uplink subframe.

FIG. 4 is a diagram for a structure of an uplink (UL) subframe. A UL subframe may be divided into a control region and a data region in frequency domain. A physical UL control channel (PUCCH) including UL control information may be allocated to the control region. And, a physical UL shared channel (PUSCH) including user data may be allocated to the data region. In order to maintain single carrier property, one user equipment does not transmit PUCCH and PUSCH simultaneously. PUCCH for one user equipment may be allocated to a resource block pair (RB pair) in subframe. Resource blocks belonging to the resource block pair may occupy different subcarriers for 2 slots. Namely, a resource block pair allocated to PUCCH is frequency-hopped on a slot boundary.

Reference Signal

In MIMO system, each transmitting antenna has an independent data channel. A transmitting antenna may mean a virtual antenna or a physical antenna. A receiver receives data transmitted from each transmitting antenna in a manner of estimating a channel for the corresponding transmitting antenna. Channel estimation means a process for reconstructing a received signal by compensating for distortion of a signal caused by fading. In this case, the fading indicates an effect that strength of a signal rapidly fluctuates due to multipath-time delay in a wireless communication system environment. For the channel estimation, a reference signal known to both a transmitter and a receiver is necessary. The reference signal may be simply named RS or a pilot in accordance with an applicable standard.

In the legacy 3GPP LTE Release-8 or -9 system, a downlink reference signal transmitted by a base station is defined. Downlink reference signal is a pilot signal for coherent demodulation of such a channel as PDSCH (Physical Downlink Shared CHannel), PCFICH (Physical Control Format Indicator CHannel), PHICH (Physical Hybrid Indicator CHannel), PDCCH (Physical Downlink Control CHannel) and the like. The downlink reference signal may be categorized into a common reference signal (CRS) shared by all user equipments in a cell and a dedicated reference signal (DRS) for a specific user equipment only. The common reference signal may be called a cell-specific reference signal. And, the dedicated reference signal may be called a user equipment-specific (UE-specific) reference signal or a demodulation reference signal (DMRS).

Downlink reference signal assignment in the legacy 3GPP LTE system is described as follows. First of all, a position (i.e., a reference signal pattern) of a resource element for carrying a reference signal is described with reference to one resource block pair (i.e., 'one subframe length in time domain'×'12-subcarrier length in frequency domain'). A single subframe is configured with 14 OFDM symbols (in case of a normal CP) or 12 OFDM symbols (in case of an extended CP). The number of subcarriers in a single OFDM symbol is set to one of 128, 256, 512, 1024, 1536 and 2048 to use.

Figure 5:
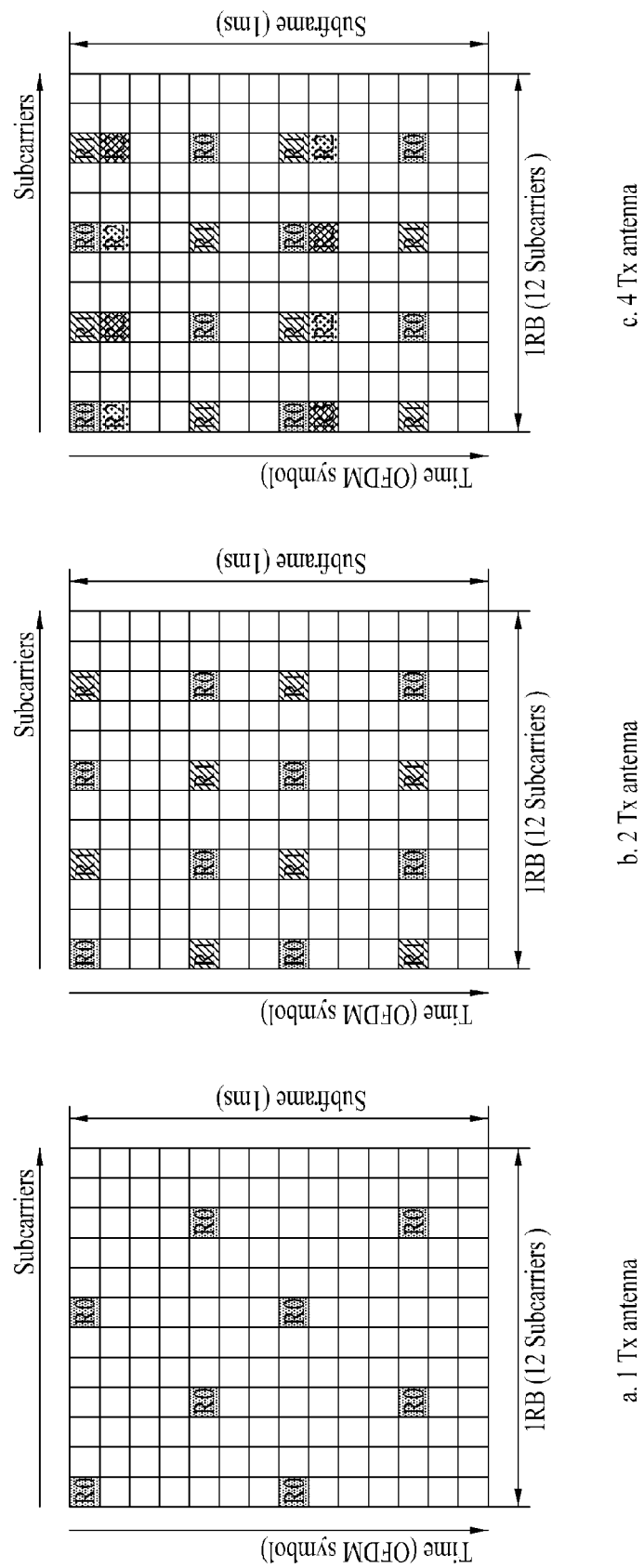
FIG. 5 is a diagram for a pattern of a common reference signal (CRS).

FIG. 5 shows a pattern of a common reference signal (CRS) in case that 1-TTI (i.e., 1 subframe) has 14 OFDM symbols. FIG. 5(a), FIG. 5(b) and FIG. 5(c) relates to a CRS pattern for a system having 1 Tx (transmitting) antenna, a CRS pattern for a system having 2 Tx antennas and a CRS pattern for a system having 4 Tx antennas, respectively.

In FIG. 5, R0 indicates a reference signal for an antenna port index 0. In FIG. 5, R1 indicates a reference signal for an antenna port index 1, R2 indicates a reference signal for an antenna port index 2, and R3 indicates a reference signal for an antenna port index 3. Regarding a position of an RE for carrying a reference signal for each of the antenna ports, no signal is transmitted from the rest of all antenna ports except the antenna port for transmitting a reference signal to prevent interference.

Figure 6:
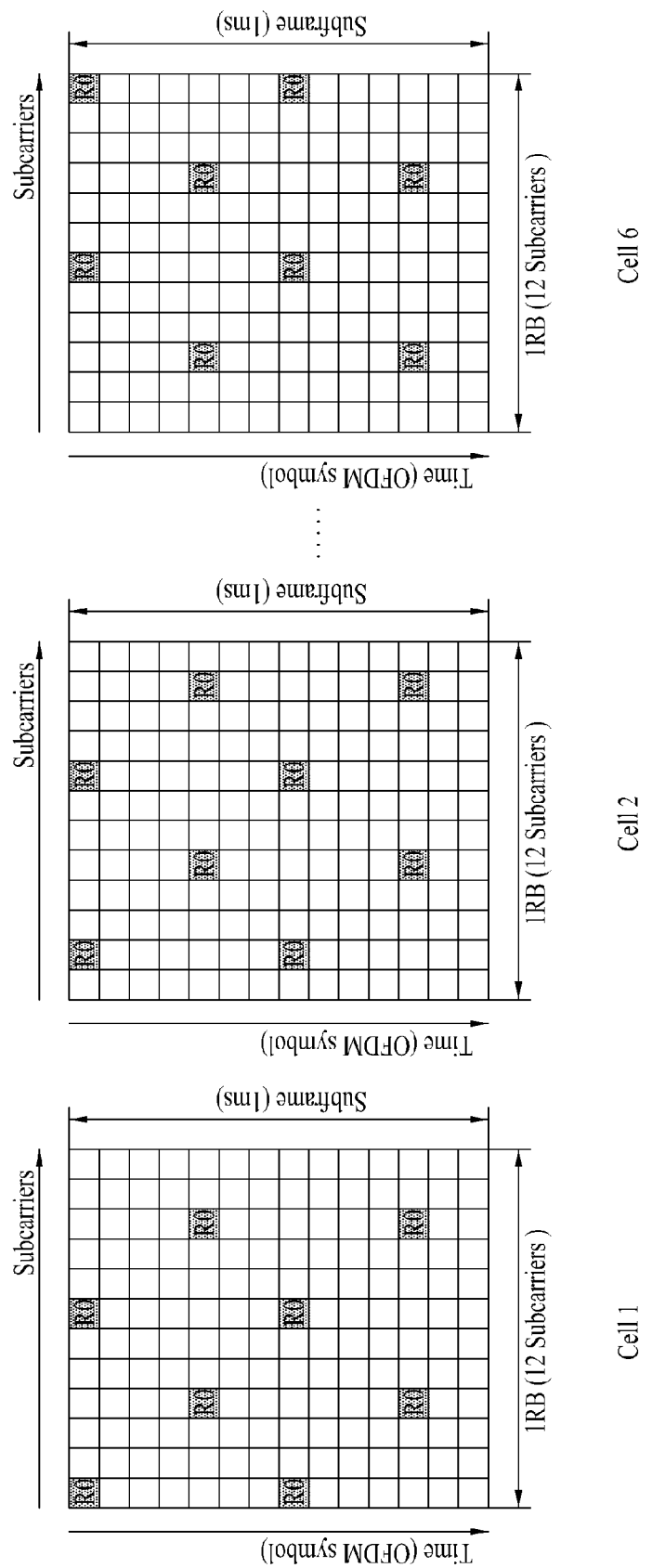
FIG. 6 is a diagram to describe a shift of a reference signal pattern.

FIG. 6 shows that a reference signal pattern is shifted in each cell to prevent reference signals of various cells from colliding with each other. Assuming that a reference signal pattern for one antenna port shown in FIG. 5(a) is used by a cell #1 (Cell 1) shown in FIG. 6, in order to prevent collision of reference signals between cells including a cell #2 adjacent to the cell #1, a cell #3 adjacent to the cell #1 and the like, it is able to protect a reference signal pattern by subcarrier or OFDM symbol unit in frequency or time domain. For instance, in case of 1 Tx antenna transmission, since a reference signal is situated in 6-subcarrier interval on a single OFDM symbol, if a shift by subcarrier unit in frequency domain is applied to each cell, at least 5 adjacent cells may be able to situate reference signals on different resource elements, respectively. For instance, a frequency shift of a reference signal may be represented as the cell #2 and the cell #6 in FIG. 6.

Moreover, by multiplying a downlink reference signal per cell by a pseudo-random (PN) sequence and then transmitting the multiplied signal, interference caused to a receiver by a reference signal received from an adjacent cell can be reduced to enhance channel estimation performance. This PN sequence may be applicable by OFDM symbol unit in a single subframe. Regarding the PN sequence, a different sequence may be applicable per cell ID, subframe number or OFDM symbol position.

In a system [e.g., 8-Tx antenna supportive wireless communication system (e.g., 3GPP LTE Release-10 system, a systems according to 3GPP LTE Releases next to Release-10, etc.)] having antenna configuration more extended than a legacy 4-Tx antenna supportive communication system (e.g., 3GPP LTE Release-8 system, 3GPP LTE Release-9 system, etc.), DMRS based data demodulation is taken into consideration to support efficient management & operation and developed transmission scheme of reference signals. In particular, in order to support data transmission via extended antennas, it may be able to define DMRS for at least two layers. Since DMRS is precoded by the same precoder of data, it is easy for a receiving side to estimate channel information for demodulating data without separate precoding information. Meanwhile, a downlink receiving side is able to acquire channel information precoded for the extended antenna configuration through DMRS. Yet, a separate reference signal other than the DMRS is requested to acquire non-precoded channel information. Hence, in a system by LTE-A standards, a reference signal (i.e., CSI-RS) for a receiving side to acquire channel state information (CSI) can be defined. In particular, CSI-RS may be transmitted via 8 antenna ports. In order to discriminate a CSI-RS transmitted antenna port from an antenna port of 3GPP LTE Release-8/9, it may be able to use antenna port indexes 15 to 22.

Configuration of Downlink Control Channel

As a region for transmitting a downlink control channel, first three OFDM symbols of each subframe are available. In particular, 1 to 3 OFDM symbols are available in accordance with overhead of the downlink control channel. In order to adjust the number of OFDM symbols for a downlink control channel in each subframe, it may be able to use PCFICH. And, it is able to use PHICH to provide an acknowledgment response [ACK/NACK (acknowledgement/negative-acknowledgement)] to an uplink transmission in downlink. Moreover, it is able to use PDCCH to transmit control information for a downlink or uplink data transmission.

Figure 7:
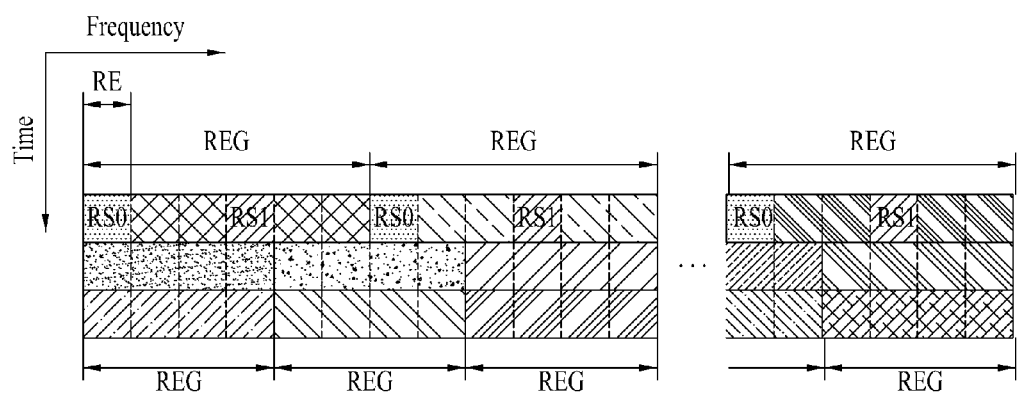
FIG. 7 and FIG. 8 are diagrams to describe a resource element group (REG) corresponding to a unit for assigning downlink control channels.
Figure 8:
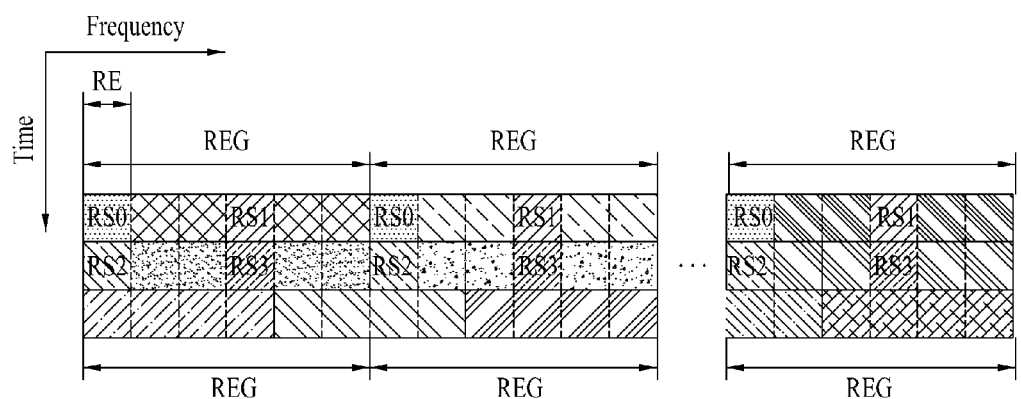

FIG. 7 and FIG. 8 show that the above-configured downlink control channels are assigned by resource element group (REG) unit in a control region of each subframe. FIG. 7 relates to a system having 1- or 2-Tx antenna configuration and FIG. 8 relates to a system having 4-Tx antenna configuration. Referring to FIG. 7 and FIG. 8, REG corresponding to a basic resource unit for assigning a control channel is configured with 4 contiguous Res in frequency domain except a resource element for assigning a reference signal. A specific number of REGs are available for a transmission of a downlink control channel in accordance with overhead of the downlink control channel.

PCFICH (Physical Control Format Indicator Channel)

In order to provide every subframe with resource allocation information of the corresponding subframe and the like, it is able to transmit PDCCH between OFDM symbol indexes 0 to 2. In accordance with overhead of a control channel, it may be able to use the OFDM symbol index 0, the OFDM symbol indexes 0 and 1, or the OFDM symbol indexes 0 to 2. Thus, the number of OPFDM symbols used for a control channel is changeable for each subframe. And, information on the OFDM symbol number may be provided via PCFICH. Hence, the PCFICH should be transmitted in every subframe.

Three kinds of informations can be provided through the PCFICH. Table 1 in the following shows CFI (control format indicator) of PCFICH. 'CFI=1' indicates that PDCCH is transmitted on OFDM symbol index 0, 'CFI=2' indicates that PDCCH is transmitted on OFDM symbol indexes 0 and 1, and 'CFI=3' indicates that PDCCH is transmitted on OFDM symbol indexes 0 to 2.

TABLE 1

| CFI | CFI codeword $<b_0, b_1, \ldots, b_{31}>$ |
|---|---|
| 1 | <0, 1, 1, 0, 1, 1, 0, 1, 1, 0, 1, 1, 0, 1, 1, 0, 1, 1, 0, 1, 1, 0, 1, 1, 0, 1, 1, 0, 1, 1, 0, 1> |
| 2 | <1, 0, 1, 1, 0, 1, 1, 0, 1, 1, 0, 1, 1, 0, 1, 1, 0, 1, 1, 0, 1, 1, 0, 1, 1, 0, 1, 1, 0, 1, 1, 0> |
| 3 | <1, 1, 0, 1, 1, 0, 1, 1, 0, 1, 1, 0, 1, 1, 0, 1, 1, 0, 1, 1, 0, 1, 1, 0, 1, 1, 0, 1, 1, 0, 1, 1> |
| 4 (Reserved) | <0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0> |

Information carried on PCFICH may be defined different in accordance with a system bandwidth. For instance, in case that a bandwidth of a system is smaller than a specific threshold, 'CFI=1' may indicate that 2 OFDM symbols are used for PDCCH. 'CFI=2' may indicate that 3 OFDM symbols are used for PDCCH. And, 'CFI=3' may indicate that 4 OFDM symbols are used for PDCCH.

Figure 9:
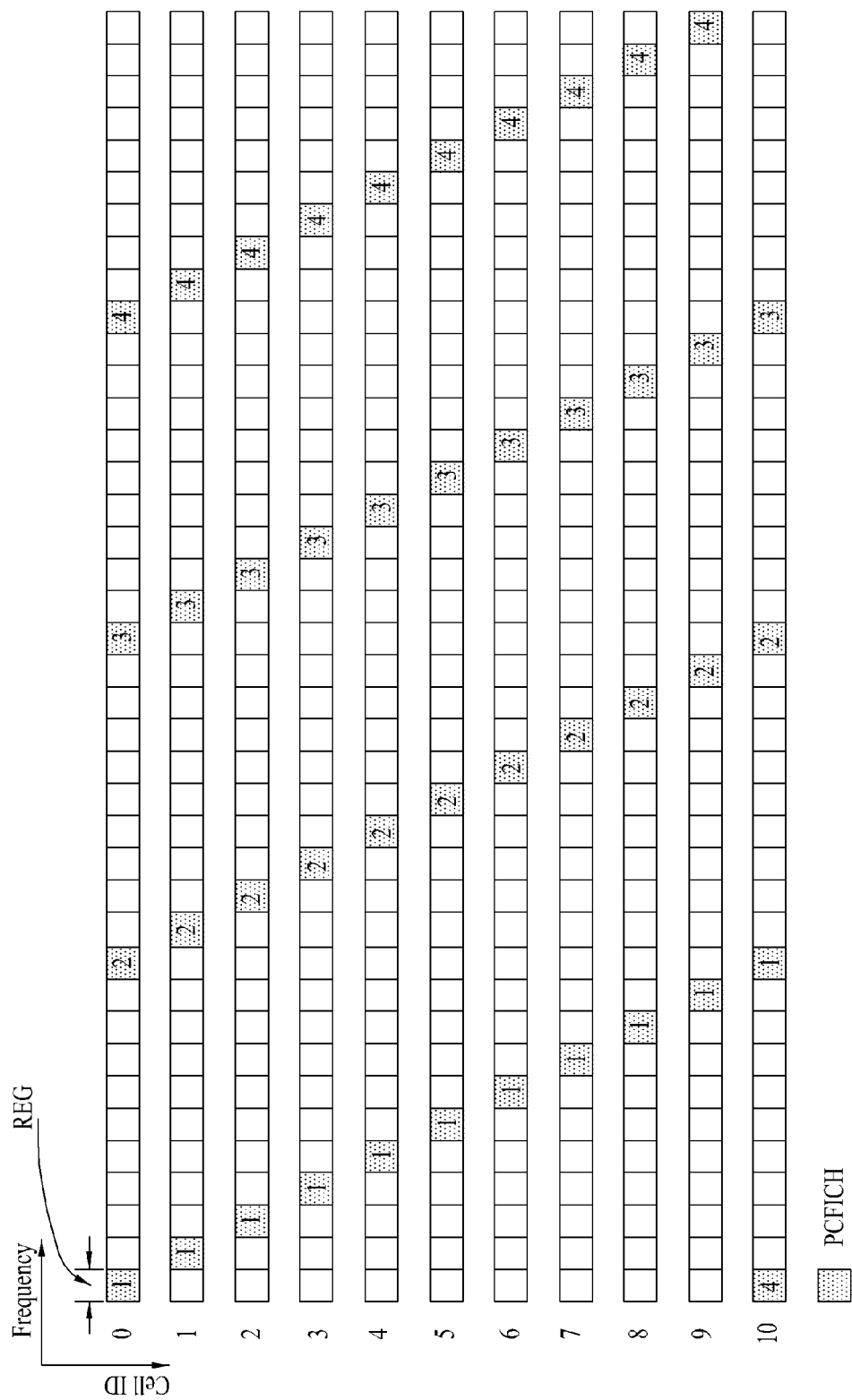
FIG. 9 is a diagram for a scheme of transmitting PCIFCH.

FIG. 9 is a diagram for a scheme of transmitting PCIFCH. REG shown in FIG. 9 is configured with 4 subcarriers, and more particularly, with data subcarriers except RS (reference signal). Generally, a transmit diversity scheme may apply thereto. A position of the REG may be frequency-shifted per cell (i.e., in accordance with a cell identifier) not to cause interference between cells. Additionally, PCFICH is always transmitted on a 1$^{st}$ OFDM symbol (i.e., OFDM symbol index 0) of a subframe. Hence, when a receiving end receives a subframe, the receiving end acquires the number of OFDM symbols for carrying PDCCH by checking information of PCFICH and is then able to receive control information transmitted on the PDCCH.

PHICH (Physical Hybrid-ARQ Indicator Channel)

Figure 10:
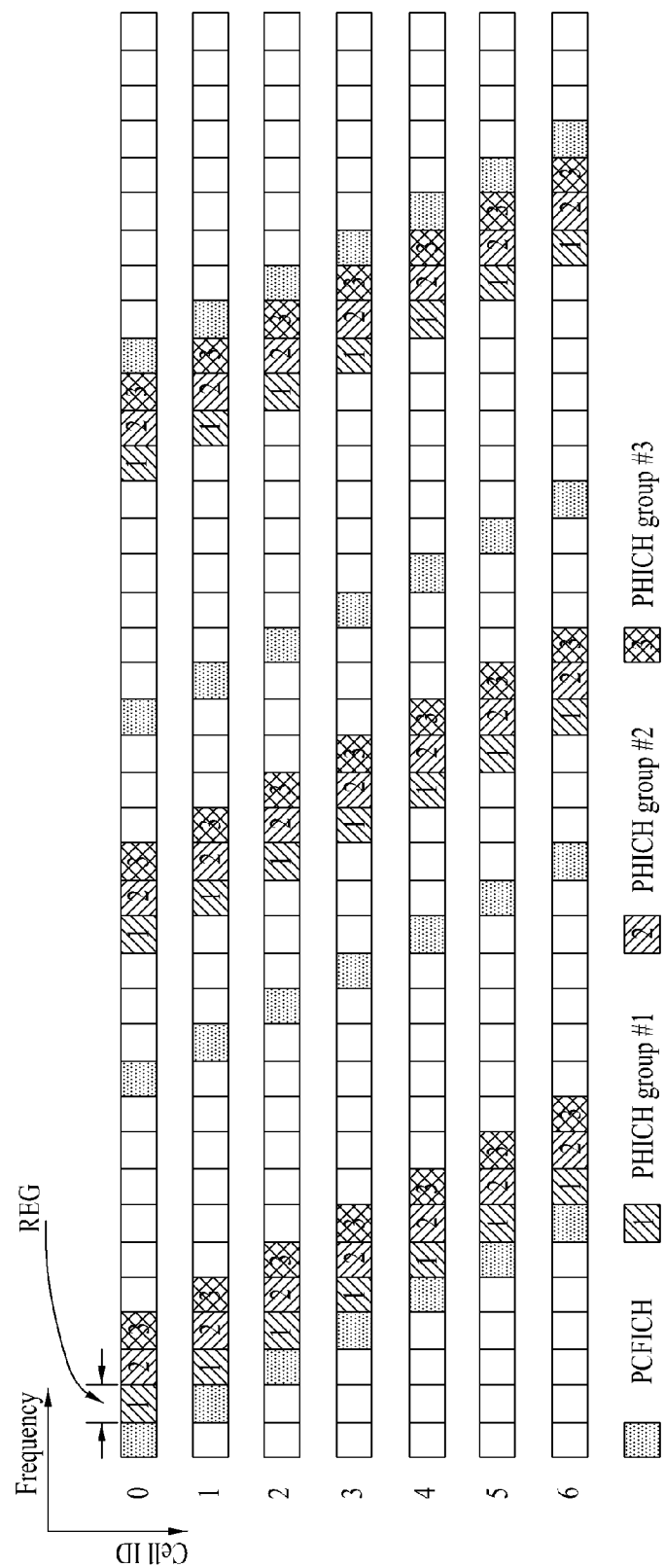
FIG. 10 is a diagram to illustrate positions of PCFICH and PHICH.

FIG. 10 is a diagram to illustrate positions of PCFICH and PHICH generally applied for a specific bandwidth. ACK/NACK information on an uplink data transmission is transmitted on PHICH. Several PHICH groups are created in a single subframe and several PHICHs exist in a single PHICH group. Hence, PHICH channels for several user equipments are included in the single PHICH group.

Referring to FIG. 10, PHICH assignment for each user equipment in several PHICH groups are performed using a lowest PRB (physical resource block) index of PUSCH resource allocation and a cyclic shift index for a demodulation reference signal (DMRS) transmitted on a UL (uplink) grant PDCCH. In this case, the DMRS is a UL reference signal and is the signal provided together with a UL transmission for channel estimation for demodulation of UL data. Moreover, PHICH resource is known through such an index pair as $(n_{PHICH}^{group}, n_{PHICH}^{seq})$. In $(n_{PHICH}^{group}, n_{PHICH}^{seq})$, $n_{PHICH}^{group}$ means a PHICH group number) and $n_{PHICH}^{seq}$ means an orthogonal sequence index in the corresponding PHICH group. $n_{PHICH}^{group}$ and $n_{PHICH}^{seq}$ is defined in Formula 1.

$$n_{PHICH}^{group} = (I_{PRB\_RA}^{lowest\_index} + n_{DMRS}) \bmod N_{PHICH}^{group}$$

$$n_{PHICH}^{seq} = (\lfloor I_{PRB\_RA}^{lowest\_index}/N_{PHICH}^{group}\rfloor + n_{DMRS}) \bmod 2N_{SF}^{PHICH} \quad \text{[Formula 1]}$$

In Formula 1, $n_{DMRS}$ indicates a cyclic shift of DMRS used for a PHICH associated UL transmission. And, $N_{SF}^{PHICH}$ indicates a spreading factor size used for PHICH. $I_{PRB\_RA}^{lowest\_index}$ indicates a lowest PRB index of a UL resource allocation. $N_{PHICH}^{group}$ indicates the number of the configured PHICH groups and may be defined as Formula 2.

$$N_{PHICH}^{group} = \begin{cases} \lceil N_g(N_{RB}^{DL}/8)\rceil & \text{for normal cyclic prefix} \\ 2 \cdot \lceil N_g(N_{RB}^{DL}/8)\rceil & \text{for extended cyclic prefix} \end{cases} \quad \text{[Formula 2]}$$

In Formula 2, $N_g$ indicates an amount of PHICH resource transmitted on PBCH (Physical Broadcast Channel) and $N_g$ is represented as $N_g \in \{1/6, 1/2, 1, 2\}$ in 2-bit size.

One example of an orthogonal sequence defined by the legacy 3GPP LTE Release-8/9 is shown in Table 2.

TABLE 2

| | Orthogonal sequence | |
|---|---|---|
| Sequence index $n_{PHICH}^{seq}$ | Normal cyclic prefix $N_{SF}^{PHICH} = 4$ | Extended cyclic prefix $N_{SF}^{PHICH} = 2$ |
| 0 | [+1 +1 +1 +1] | [+1 +1] |
| 1 | [+1 −1 +1 −1] | [+1 −1] |
| 2 | [+1 +1 −1 −1] | [+j +j] |
| 3 | [+1 −1 −1 +1] | [+j −j] |
| 4 | [+j +j +j +j] | — |
| 5 | [+j −j +j −j] | — |
| 6 | [+j +j −j −j] | — |
| 7 | [+j −j −j +j] | — |

Figure 11:
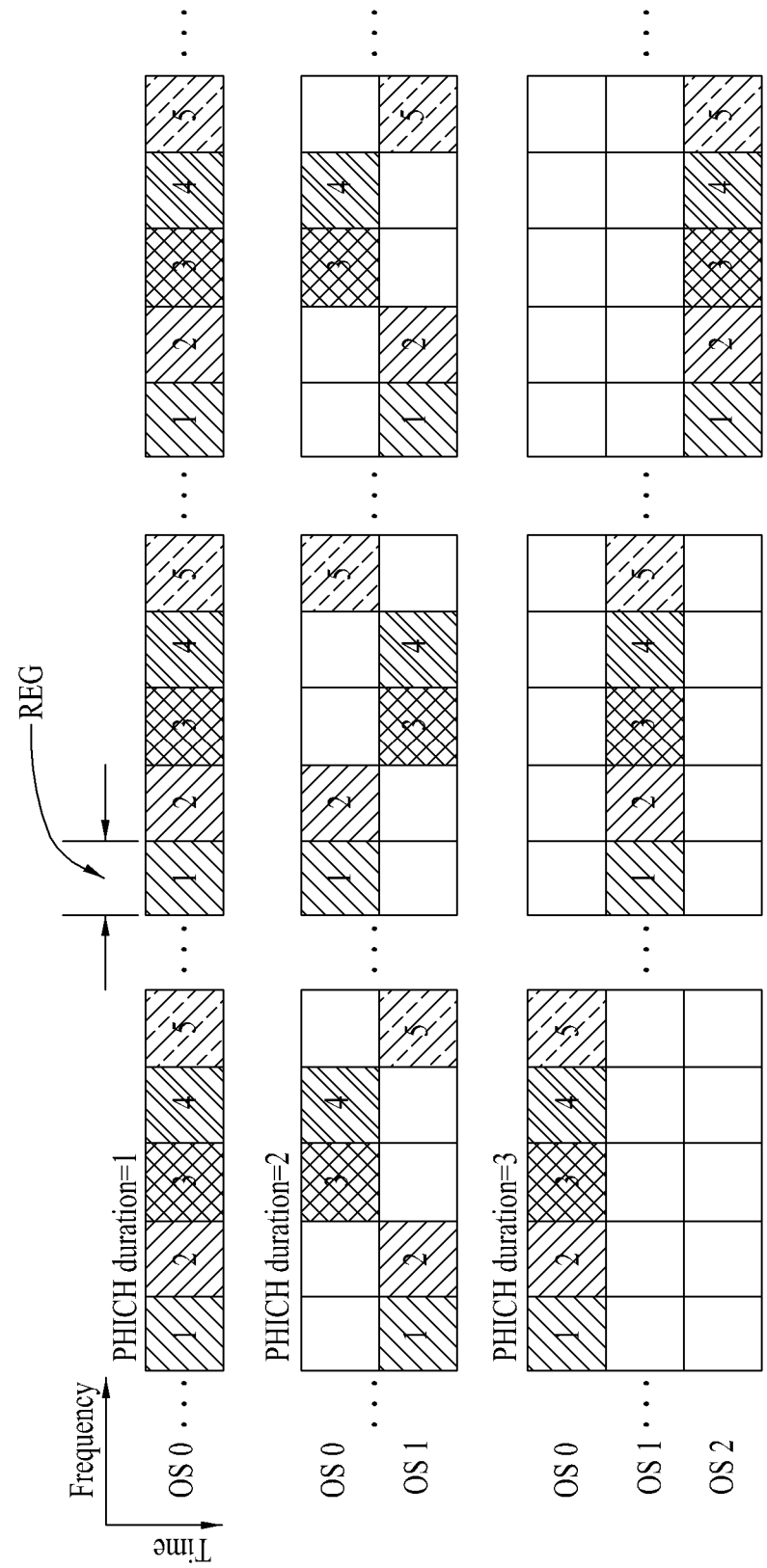
FIG. 11 is a diagram to illustrate a position of a downlink resource element having PHICH group mapped thereto.

FIG. 11 is a diagram to illustrate a position of a downlink (DL) resource element having PHICH group mapped thereto. Referring to FIG. 11, PHICH group may be configured in different time region (i.e., a different OS (OFDM symbol)) within a single subframe.

PDCCH (Physical Downlink Control Channel)

Control information transmitted on PDCCH may have control information size and usage differing in accordance with a DCI (downlink control information) format. And, a size of the PDCCH may vary in accordance with a coding rate. For instance, DCI formats used by the legacy 3GPP LTE Release-8/9 may be defined as Table 3.

TABLE 3

| DCI format | Objectives |
|---|---|
| 0 | Scheduling of PUSCH |
| 1 | Scheduling of one PDSCH codeword |
| 1A | Compact scheduling of one PDSCH codeword |
| 1B | Closed-loop single-rank transmission |
| 1C | Paging, RACK response and dynamic BCCH |
| 1D | MU-MIMO |
| 2 | Scheduling of rank-adapted closed-loop spatial multiplexing mode |
| 2A | Scheduling of rank-adapted open-loop spatial multiplexing mode |
| 3 | TPC commands for PUCCH and PUSCH with 2 bit power adjustments |

TABLE 3-continued

| DCI format | Objectives |
|---|---|
| 3A | TPC commands for PUCCH and PUSCH with single bit power adjustments |

The DCI format shown in Table 3 is independently applied per user equipment and PDCCHs of several user equipments can be simultaneously multiplexed within a single subframe. The multiplexed PDCCH of each of the user equipments is independently channel-coded and CRC is applied thereto. The CRC of the PDCCH is masked with a unique identifier of each of the user equipments and can be applied to enable the corresponding user equipment to receive the PDCCH of its own. Yet, since a user equipment is basically unable to know a position of its PDCCH channel, the user equipment checks whether each of the entire PDCCH channels of the corresponding DCI format matches the PDCCH channel having the ID of the corresponding user equipment for each subframe and needs to perform blind detection until receiving the corresponding PDCCH. A basic resource allocation unit of the PDCCH is CCE (control channel element) and a single CCE is configured with 9 TEGs. A single PDCCH may be configured with 1, 2, 4 or 8 CCEs. PDCCH configured in accordance with each user equipment is interleaved into a control channel region of each subframe and then mapped by a CCE-to-RE mapping rule. This may vary an RE position having a CCE mapped thereto in accordance with the OFDM symbol number for a control channel of each subframe, the PHICH group number, Tx antennas, a frequency shift and the like.

Uplink Retransmission

Uplink (UL) retransmission may be indicated via the aforementioned PHICH and the DCI format 0 (i.e., DCI format for scheduling PUSCH transmission). A user equipment receives ACK/NACK for a previous UL transmission via PHICH and is then able to perform a synchronous non-adaptive retransmission. Alternatively, a user equipment receives a UL grant via DCI format 0 PDCCH from a base station and is then able to perform a synchronous adaptive retransmission.

The synchronous transmission means that a retransmission is performed at a predetermined timing point (e.g., $(n+k)^{th}$ subframe) after a timing point (e.g., $n^{th}$ subframe) of transmitting a data packet. In both cases of the retransmission by PHICH and the retransmission by UL grant PDCCH, the synchronous retransmission is performed.

Regarding the non-adaptive retransmission of performing a retransmission on PHICH, the same frequency resource and transmitting method of the former frequency resource (e.g., physical resource block (PRB) region) and transmitting method (e.g., modulation scheme, etc.) used for a previous transmission are applied to the retransmission. Meanwhile, regarding the adaptive retransmission of performing a retransmission via UL grant PDCCH, a frequency resource and transmitting method for performing a retransmission may be set different from those of a previous transmission in accordance with a scheduling control information indicated by a UL grant.

In case that a user equipment receives a UL grant PDCCH as soon as receives PHICH, the user equipment may be able to perform a UL transmission in accordance with control information of the UL grant PDCCH by ignoring the PHICH. Since a new data indicator (NDI) is included in the UL grant PDCCH (e.g., DCI format 0), if NDI bit is toggled more than a previously provided NDI value, the user equipment regards a previous transmission as successful and is then able to transmit new data. Meanwhile, although the user equipment receives ACK for a previous transmission via PHICH, unless the NDI value is toggled in the UL grant PDCCH received simultaneously with or after the PHICH reception, the user equipment is configured not to flush a buffer for the previous transmission.

Uplink Transmission Configuration

Figure 12:
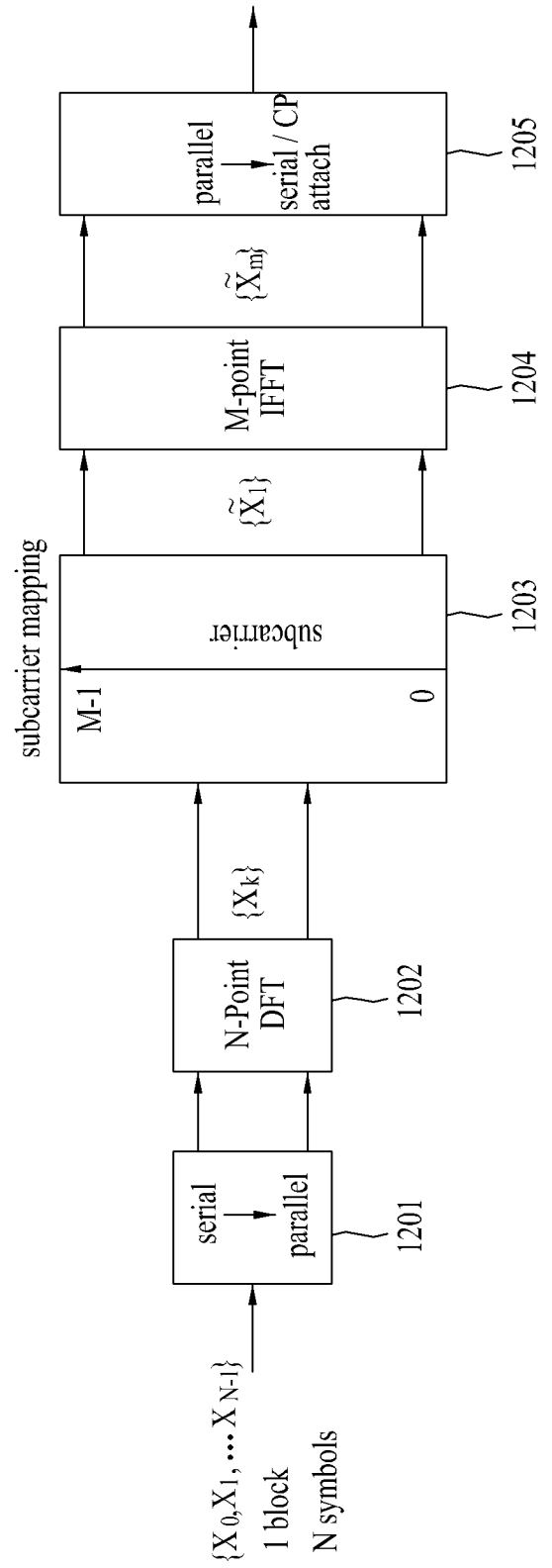
FIG. 12 is a diagram for a structure of a transmitter by SC-FDMA.

FIG. 12 is a diagram for a structure of a transmitter by SC-FDMA.

First of all, a single block configured with N symbols inputted to a transmitter is converted to a parallel signal via a serial-to-parallel converter 1201. The parallel signal spreads via an N-point DFT module 1202. The spreading signal is mapped to a frequency region via a subcarrier mapping module 1203. Signals on subcarriers configure linear combination of N symbols. The signal mapped to the frequency region is transformed into a time-domain signal via an M-point IFFT module 1204. The time-domain signal is converted to a parallel signal via a parallel-to-serial converter 1205 and then has a CP added thereto. The effect of the IFFT processing by the M-point IFFT module 1204 is cancelled out by the DFT processing of the N-point DFT module 1202 to some extent. In this point, the SC-FDMA may be named DFT-s-OFDMA (DFT-spread-OFDMA). Moreover, although the signal inputted to the DFT module 1202 has a low PAPR (peak-to-average power ratio) or CM (cubic metric), it may have a high PAPR after DFT processing. And, the signal outputted by the IFFT processing of the IFFT module 1204 may have a low PAPR again. In particular, according to the SC-FDMA, transmission is performed by avoiding a non-linear distortion interval of a power amplifier (PA), whereby a cost for implementation of a transmitting end can be reduced.

FIG. 13 is a diagram to describe a scheme of mapping a signal outputted from the DFT module 1202 to a frequency region. By performing one of the two schemes shown in FIG. 13, a signal outputted from an SC-FDMA transmitter can meet the single carrier property. FIG. 13(a) shows a localized mapping scheme of locally mapping signals outputted from the DFT module 1202 to a specific part of a subcarrier region. FIG. 13(b) shows a distributed mapping scheme of mapping signals outputted from the DFT module 1202 to a whole subcarrier region by being distributed. In the legacy 3GPP LTE Release-8/9 system, it is defined that the localized mapping scheme is used.

Figure 14:
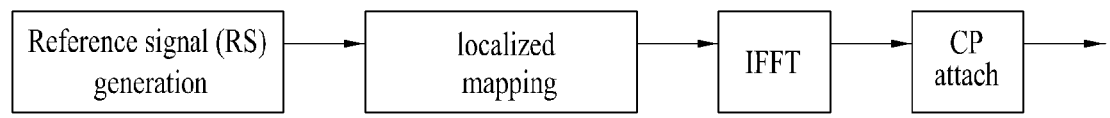
FIG. 14 is a block diagram to describe a transmission processing of a reference signal.

FIG. 14 is a block diagram to describe a transmission processing of a reference signal to demodulate a transmitted signal by SC-FDMA. In the legacy 3GPP LTE Release-8/9 system, a data part is transmitted in a manner of transforming a signal generated from a time domain into a frequency-domain signal by DFT processing, performing subcarrier mapping on the frequency-domain signal, and then performing IFFT processing on the mapped signal [cf. FIG. 12]. Yet, a reference signal (RS) is defined as directly generated in frequency domain without DFT processing, mapped to subcarrier, undergoing IFFT processing, and then having CP addition thereto.

FIG. 15 is a diagram to illustrate a symbol position having a reference signal (RS) mapped thereto in a subframe structure according to SC-FDMA. FIG. 15(a) shows that RS is located at $4^{th}$ SC-FDMA symbol of each of 2 slots in a single subframe in case of a normal CP. FIG. 15(b) shows that RS is located at $3^{rd}$ SC-FDMA symbol of each of 2 slots in a single subframe in case of an extended CP.

Clustered DFT-s-OFDMA scheme is described with reference to FIGS. 16 to 19 as follows. The clustered DFT-s-OFDMA is the modification of the aforementioned SC-FDMA. According to the clustered DFT-s-OFDMA, a DFT-processed signal is segmented into a plurality of sub-blocks and then mapped to a spaced position in frequency domain.

Figure 16:
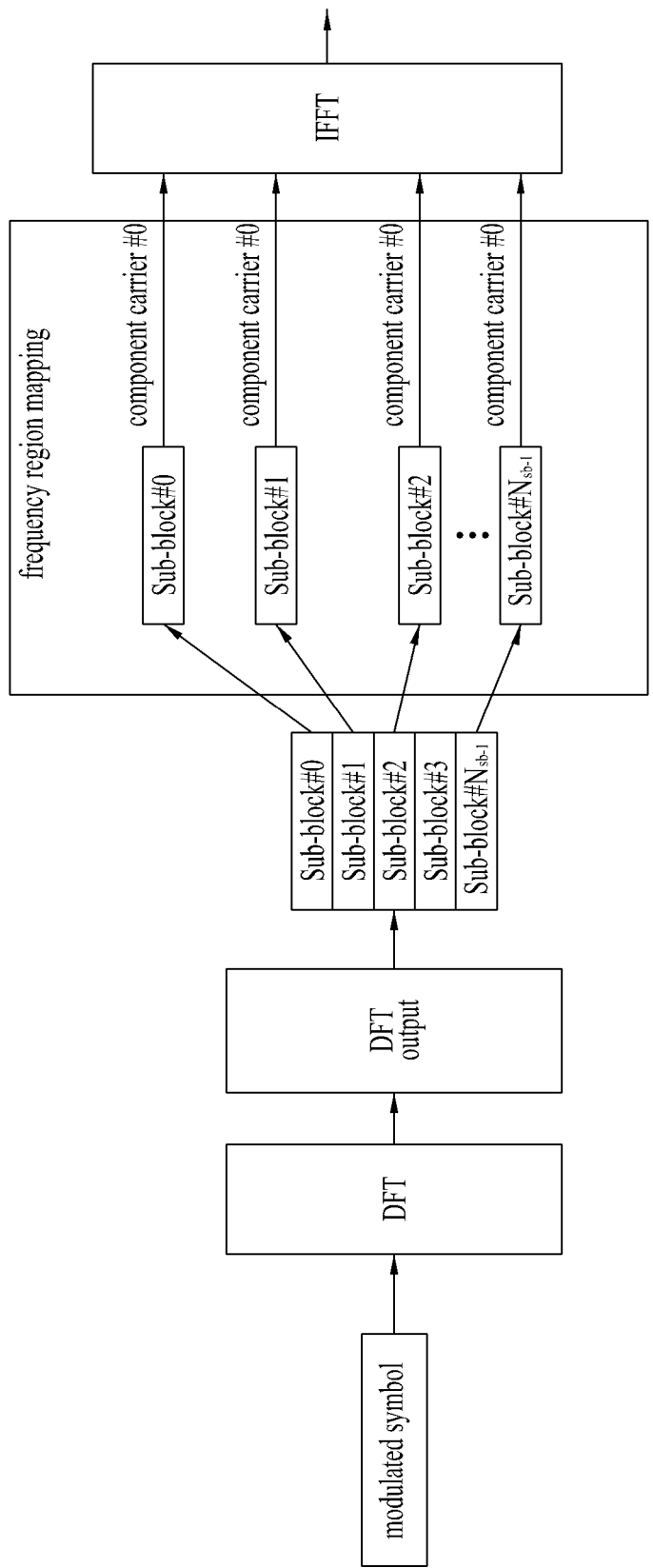
FIGS. 16 to 19 are diagrams to illustrate clustered DFT-s-OFDMA scheme.

FIG. 16 is a diagram to describe a clustered DFT-s-OFDMA scheme on a single carrier. For instance, a DFT output may be partitioned into Nsb sub-blocks (sub-blocks #0 to #Nsb-1). When sub-blocks are mapped to a frequency region, the sub-blocks #0 to #NSb-1 are mapped to a single carrier (e.g., carrier of 20 MHz bandwidth, etc.) and each of the sub-blocks may be mapped to a position spaced in the frequency region. And, each of the sub-blocks may be locally mapped to the frequency region.

Figure 17:
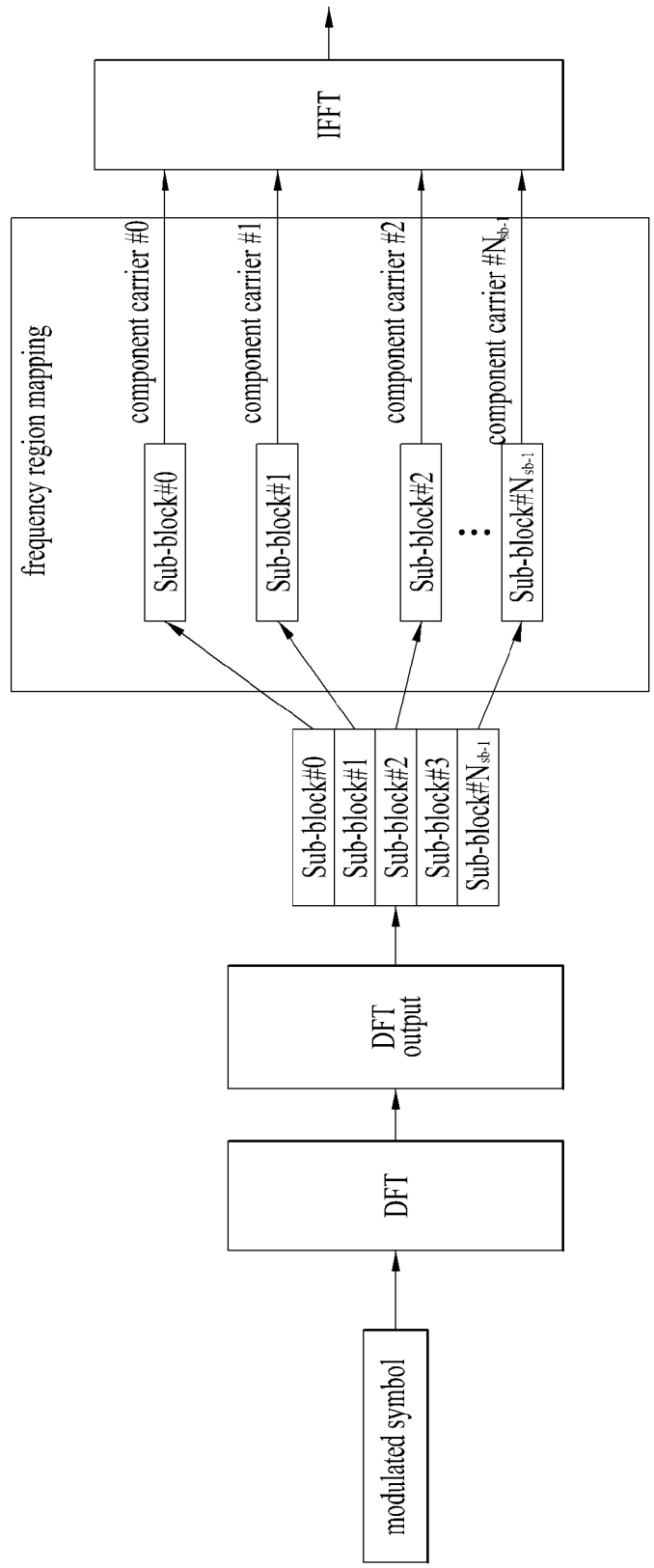
Figure 18:
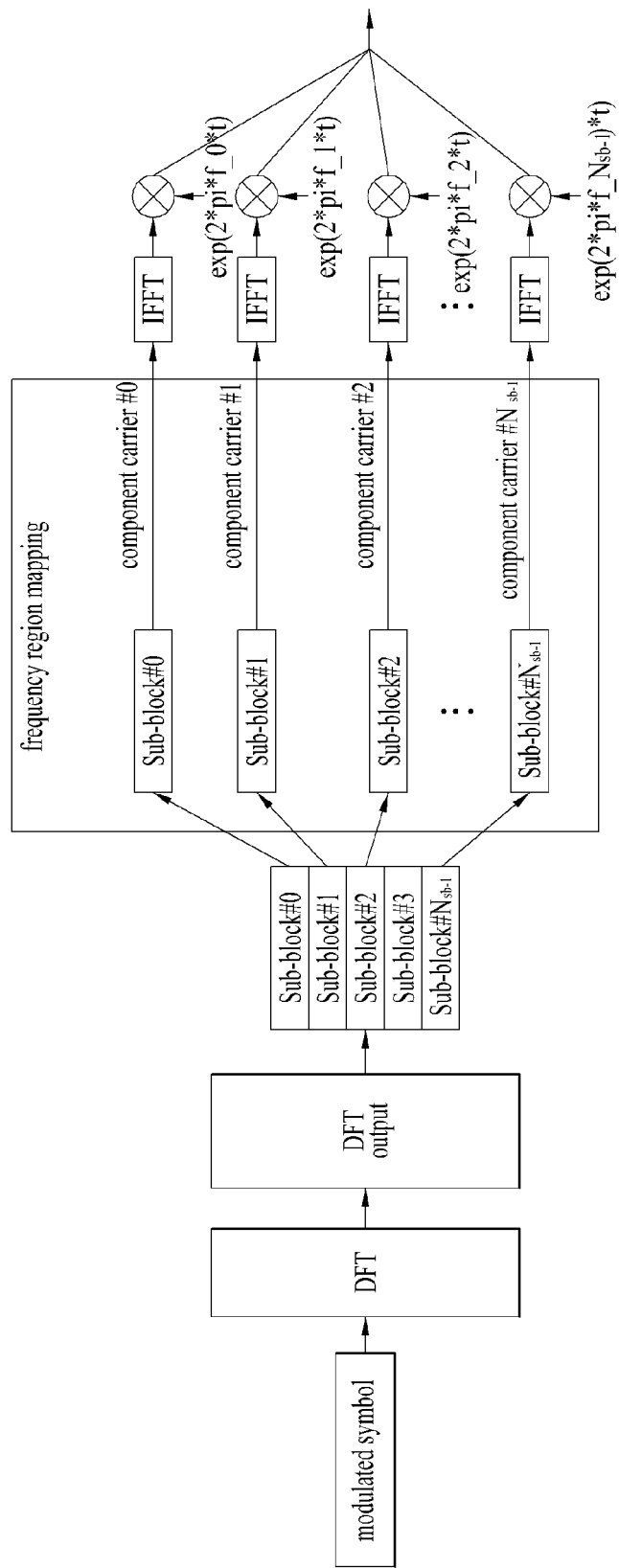

FIG. 17 and FIG. 18 are diagrams to describe a clustered DFT-s-OFDMA scheme on multiple carriers.

In a situation (i.e., frequency bands of multiple carriers (cells) are contiguously assigned) that multiple carriers (or multiple cells) are configured contiguously, if a subcarrier interval between contiguous carriers is aligned, FIG. 17 is a diagram for one example that a signal can be generated through a single IFFT module. For instance, a DFT output may be segmented into Nsb sub-blocks (sub-blocks #0 to #NSb-1). In mapping sub-blocks to a frequency region, the sub-blocks #0 to #NSb-1 can be mapped to component carriers #0 to #NSb-1, respectively [e.g., each carrier (or cell) may have a bandwidth of 20 MHz]. moreover, each of the sub-blocks may be mapped to a frequency region by being localized. And, the sub-blocks mapped to the carriers (or cells) may be transformed into a time-domain signal through a single IFFT module.

In a situation (i.e., frequency bands of multiple carriers (cells) are non-contiguously assigned) that multiple carriers (or multiple cells) are configured non-contiguously, FIG. 18 is a diagram for one example that a signal is generated using a plurality of IFFT modules. For instance, a DFT output may be segmented into Nsb sub-blocks (sub-blocks #0 to #NSb-1). In mapping sub-blocks to a frequency region, the sub-blocks #0 to #NSb-1 can be mapped to carriers #0 to #NSb-1, respectively [e.g., each carrier (or cell) may have a bandwidth of 20 MHz]. moreover, each of the sub-blocks may be mapped to a frequency region by being localized. And, the sub-blocks mapped to the carriers (or cells) may be transformed into a time-domain signal through the IFFT modules, respectively.

If the clustered DFT-s-OFDMA on the single carrier mentioned with reference to FIG. 16 is called intra-carrier (or intra-cell) DFT-s-OFDMA, the DFT-s-OFDMA on the multiple carriers (or cells) mentioned with reference to FIG. 17 or FIG. 18 may be called inter-carrier (or inter-cell) DFT-s-OFDMA. Thus, the intra-carrier DFT-s-OFDMA and the inter-carrier DFT-s-OFDMA may be interchangeably usable.

Figure 19:
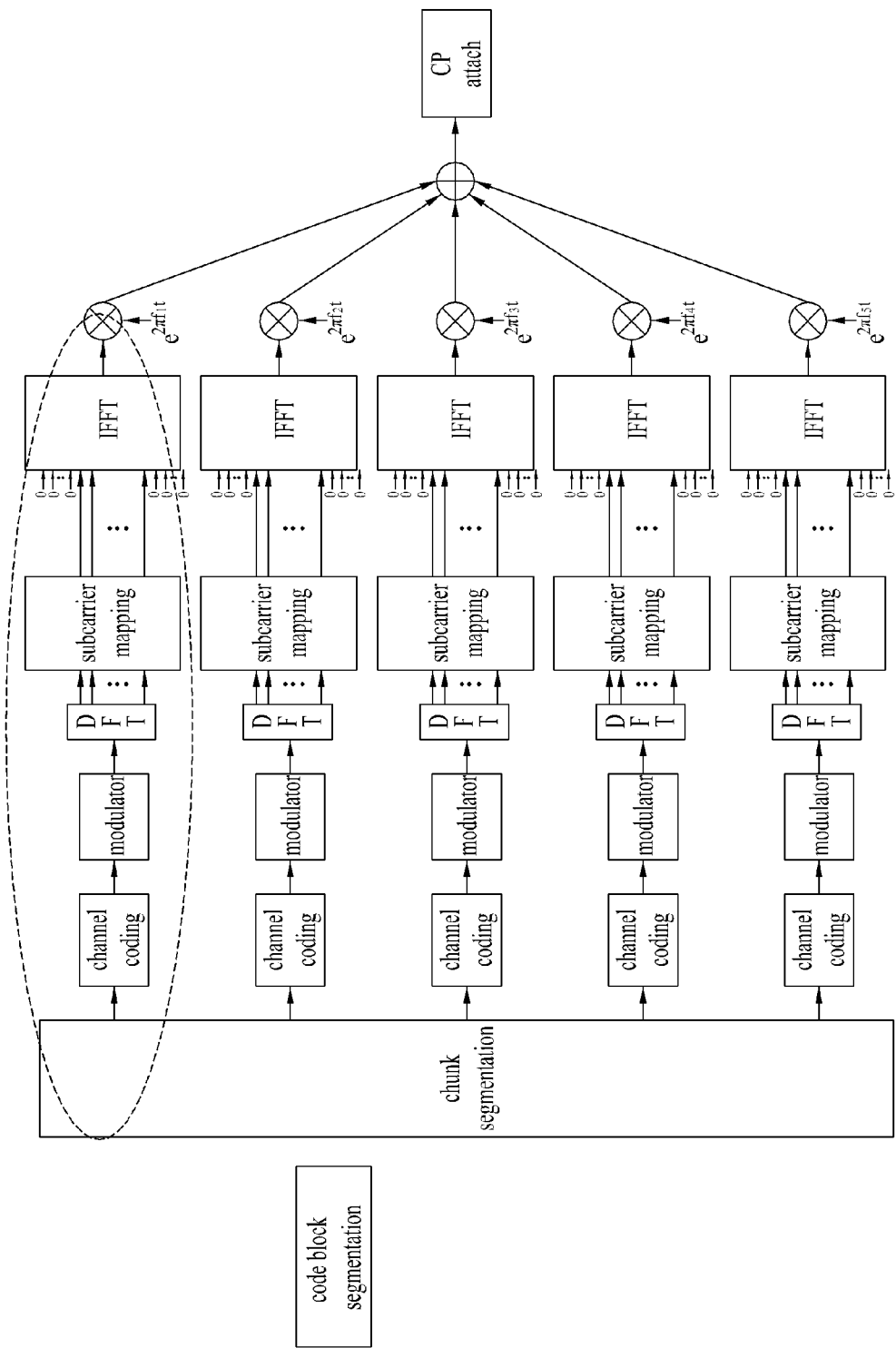

FIG. 19 is a diagram to describe a chuck-specific DFT-s-OFDMA scheme of performing DFT processing, frequency domain mapping and IFFT processing by chunk unit. The chunk-specific DFT-s-OFDMA may be called Nx SC-FDMA. A code block segmented signal is chunk-segmented into parts and channel coding and modulation is performed on each of the parts. The modulated signal undergoes the DFT processing, the frequency domain mapping and the IFFT processing in the same manner described with reference to FIG. 12, outputs from the respective IFFTs are added up, and CP may be added thereto. The Nx SC-FDMA scheme mentioned with reference to FIG. 19 may be applicable to a contiguous multi-carrier (or multi-cell) case and a non-contiguous multi-carrier (or multi-cell) case both.

Structure of MIMO System

Figure 20:
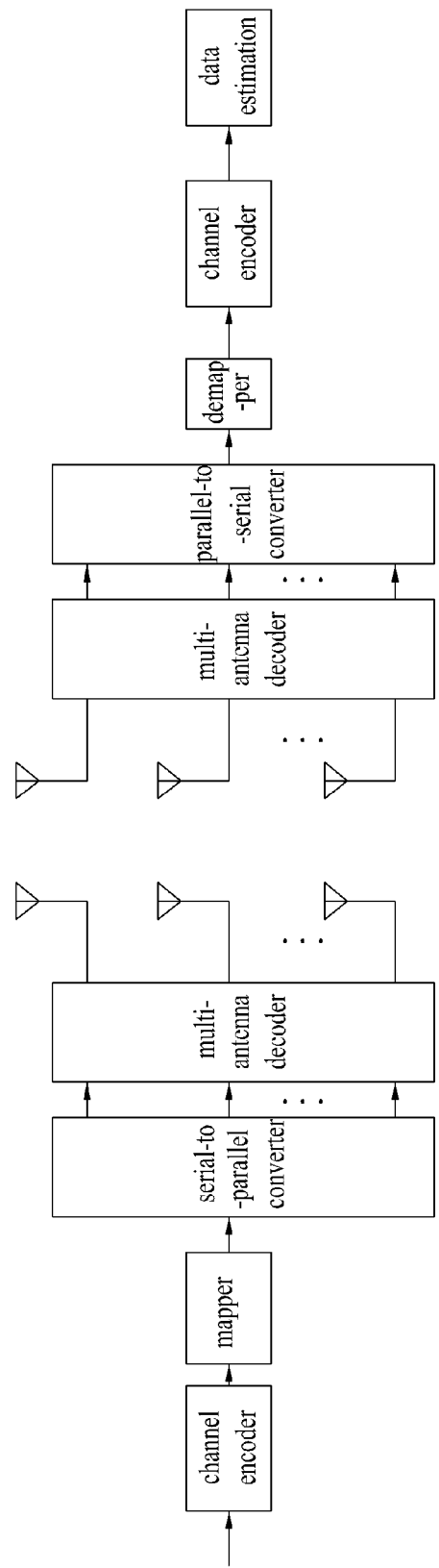
FIG. 20 is a diagram to illustrate a structure of MIMO system.

FIG. 20 is a diagram to illustrate a basic structure of MIMO system having multiple Tx antennas and/or multiple Rx (receiving) antennas. Each block shown in FIG. 20 conceptionally indicates a function or operation in a transmitting/receiving end for MIMO transmission.

A channel encoder shown in FIG. 20 indicates an operation of attaching a redundancy bit to an input data bit, whereby effect of noise and the like from a channel can be reduced. A mapper indicates an operation of converting data bit information to data symbol information. A serial-to-parallel converter indicates an operation of converting serial data to parallel data. A multi-antenna encoder indicates an operation of transforming a data symbol into a time-spatial signal. A multi-antenna of a transmitting end plays a role in transmitting this time-spatial signal on a channel, while a multi-antenna of a receiving end plays a role in receiving the signal on the channel.

A multi-antenna decoder shown in FIG. 20 indicates an operation of transforming the received time-spatial signal into each data symbol. A parallel-to-serial converter indicates an operation of converting a parallel signal to a serial signal. A demapper indicates an operation of transforming a data symbol to a bit information. A decoding operation for a channel code is performed by a channel decoder, whereby data can be estimated.

The MIMO transceiving system mentioned in the above description may have a single or several codewords spatially in accordance with a space multiplexing ratio. A case of having a single codeword spatially is called a single codeword (SCW) structure. And, a case of having several codewords is called a multiple codeword (MCW) structure.

Figure 21:
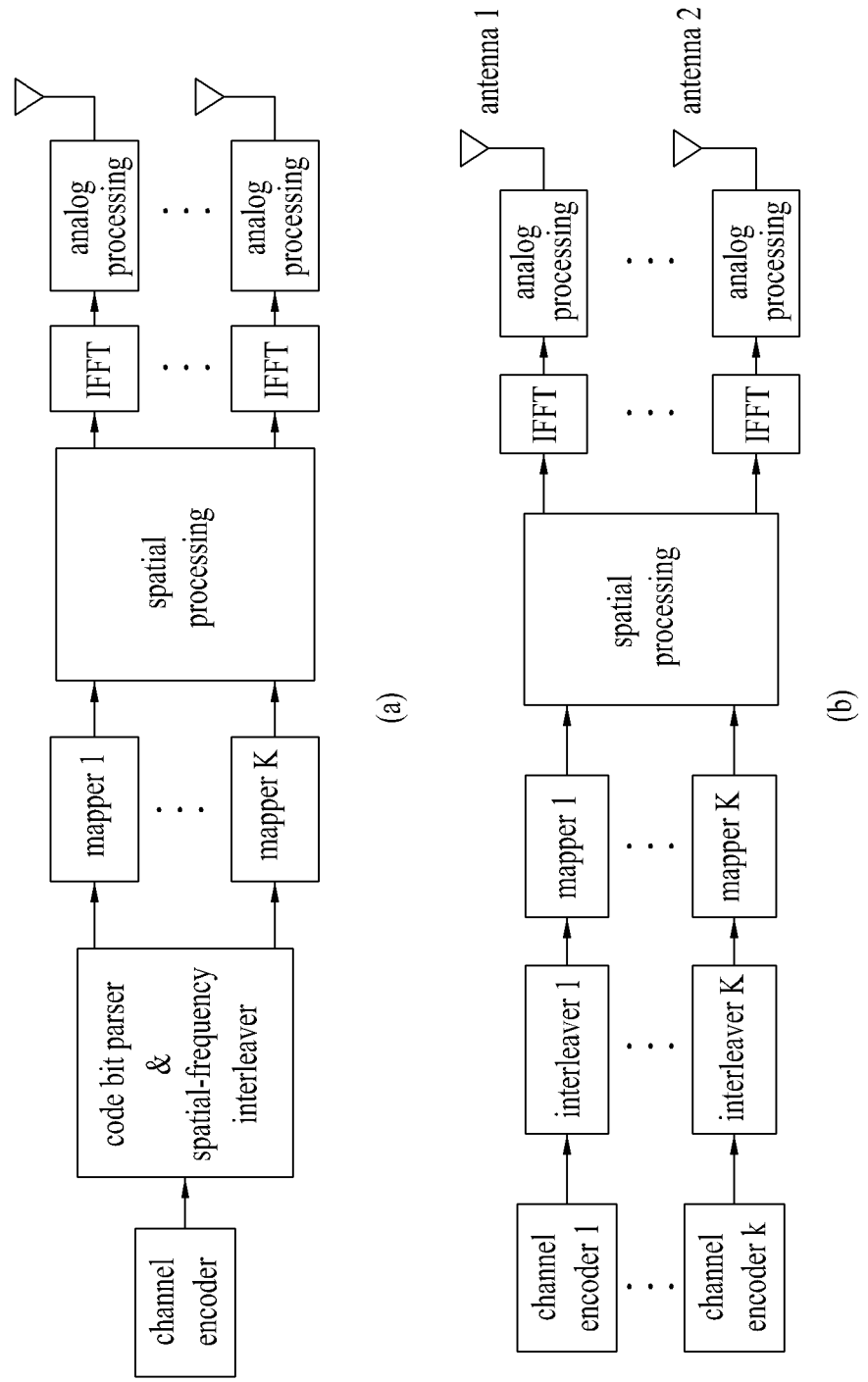
FIG. 21 is a block diagram to describe functionality of MIMO system.

FIG. 21(a) is a block diagram to represent functionality of a transmitting end of an MIMO system having the SCW structure. And, FIG. 21(b) is a block diagram to represent functionality of a transmitting end of an MIMO system having the MCW structure.

Codebook Based Precoding Scheme

In order to support multi-antenna transmission, it may be able to apply precoding of appropriately distributing transmission information to each antenna in accordance with a channel status and the like. A codebook based precoding scheme means the scheme performed in a following manner. First of all, a set of precoding matrixes is determined in a transmitting end and a receiving end. Secondly, the transmitting end measures channel information from the transmitting end and then feeds back information (i.e., a precoding matrix index (PMI)) indicating what is a most appropriate precoding matrix to the transmitting end. Finally, the transmitting end applies an appropriate precoding to a signal transmission based on the PMI. Since the appropriate precoding matrix is selected from the previously determined precoding matrix set, although an optimal precoding is not always applied, this is more advantageous than the explicit feedback of optimal precoding information actually carried on channel information in reducing feedback overhead.

Figure 22:
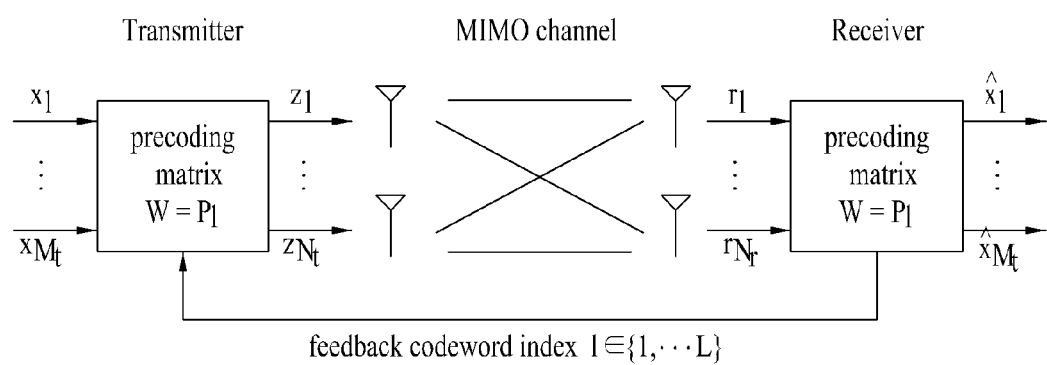
FIG. 22 is a diagram to describe basic concept of codebook based precoding.

FIG. 22 is a diagram to describe basic concept of codebook based precoding.

According to a codebook based precoding scheme, a transmitting and a receiving end share codebook information including a prescribed number of precoding matrixes in accordance with a transmission rank, the number of antennas and the like. In particular, in case that feedback information is finite, it is able to use the precoding based codebook scheme. The receiving end measures a channel status via a received signal and is then able to deed back information (i.e., indexes of the corresponding precoding matrixes) on the finite number of preferred precoding matrixes based on the above-mentioned codebook information to the transmitting end. For instance, the receiving end is able to select an optimal precoding matrix in a manner of measuring a received signal by ML (maximum likelihood) or MMSE (minimum mean square error) scheme. FIG. 22 shows that the receiving end transmits the precoding matrix information per codeword to the transmitting end, by which the present invention may be non-limited.

Having received the feedback information from the receiving end, the transmitting end may be able to select a specific precoding matrix from the codebook based on the received information. Having selected the precoding matrix, the transmitting end performs a precoding in a manner of multiplying layer signals, of which number corresponds to the transmission rank, by the selected precoding matrix and may be then able to transmit a precoded transmission signal via a plurality of antennas. In the precoding matrix, the number of rows is equal to that of the antennas and the number of columns is equal to a rank value. Since the rank value is equal to the number of the layers, the number of the columns is equal to the number of layers. For instance, if the number of the Tx antennas and the number of the transmission layers are 4 and 2, respectively, the precoding matrix can be configured with 4×2 matrix. Information transmitted via each layer can be mapped to each antenna via the precoding matrix.

Having received the signal precoded and transmitted by the transmitting end, the receiving end is able to reconstruct the received signal by performing a processing inverse to that of the precoding performed by the transmitting end. Generally, since the precoding matrix meets such a unitary matrix (U) condition as $U*U^H=I$, the inverse processing of the precoding may be performed in a manner of multiplying the received signal by Hermit matrix ($P^H$) of the precoding matrix (P) used for the precoding of the transmitting end.

For instance, Table 4 in the following indicates a codebook used for a downlink transmission using 2 Tx antennas in 3GPP LTE Release-8/9 and Table 5 indicates a codebook used for a downlink transmission using 4 Tx antennas in 3GPP LTE Release-8/9.

TABLE 4

| Codebook index | Number of rank | |
|---|---|---|
| | 1 | 2 |
| 0 | $\frac{1}{\sqrt{2}}\begin{bmatrix}1\\1\end{bmatrix}$ | $\frac{1}{\sqrt{2}}\begin{bmatrix}1 & 0\\0 & 1\end{bmatrix}$ |
| 1 | $\frac{1}{\sqrt{2}}\begin{bmatrix}1\\-1\end{bmatrix}$ | $\frac{1}{2}\begin{bmatrix}1 & 1\\1 & -1\end{bmatrix}$ |
| 2 | $\frac{1}{\sqrt{2}}\begin{bmatrix}1\\j\end{bmatrix}$ | $\frac{1}{2}\begin{bmatrix}1 & 1\\j & -j\end{bmatrix}$ |
| 3 | $\frac{1}{\sqrt{2}}\begin{bmatrix}1\\-j\end{bmatrix}$ | — |

TABLE 5

| Codebook index | $u_n$ | Number of layers v | | | |
|---|---|---|---|---|---|
| | | 1 | 2 | 3 | 4 |
| 0 | $u_0 = [1\ -1\ -1\ -1]^T$ | $W_0^{\{1\}}$ | $W_0^{\{14\}}/\sqrt{2}$ | $W_0^{\{124\}}/\sqrt{3}$ | $W_0^{\{1234\}}/2$ |
| 1 | $u_1 = [1\ -j\ 1\ j]^T$ | $W_1^{\{1\}}$ | $W_1^{\{12\}}/\sqrt{2}$ | $W_1^{\{123\}}/\sqrt{3}$ | $W_1^{\{1234\}}/2$ |
| 2 | $u_2 = [1\ 1\ -1\ 1]^T$ | $W_2^{\{1\}}$ | $W_2^{\{12\}}/\sqrt{2}$ | $W_2^{\{123\}}/\sqrt{3}$ | $W_2^{\{3214\}}/2$ |
| 3 | $u_3 = [1\ j\ 1\ -j]^T$ | $W_3^{\{1\}}$ | $W_3^{\{12\}}/\sqrt{2}$ | $W_3^{\{123\}}/\sqrt{3}$ | $W_3^{\{3214\}}/2$ |
| 4 | $u_4 = [1\ (-1-j)/\sqrt{2}\ -j\ (1-j)/\sqrt{2}]^T$ | $W_4^{\{1\}}$ | $W_4^{\{14\}}/\sqrt{2}$ | $W_4^{\{124\}}/\sqrt{3}$ | $W_4^{\{1234\}}/2$ |
| 5 | $u_5 = [1\ (1-j)/\sqrt{2}\ j\ (-1-j)/\sqrt{2}]^T$ | $W_5^{\{1\}}$ | $W_5^{\{14\}}/\sqrt{2}$ | $W_5^{\{124\}}/\sqrt{3}$ | $W_5^{\{1234\}}/2$ |
| 6 | $u_6 = [1\ (1+j)/\sqrt{2}\ -j\ (-1+j)/\sqrt{2}]^T$ | $W_6^{\{1\}}$ | $W_6^{\{13\}}/\sqrt{2}$ | $W_6^{\{134\}}/\sqrt{3}$ | $W_6^{\{1324\}}/2$ |
| 7 | $u_7 = [1\ (-1+j)/\sqrt{2}\ j\ (1+j)/\sqrt{2}]^T$ | $W_7^{\{1\}}$ | $W_7^{\{13\}}/\sqrt{2}$ | $W_7^{\{134\}}/\sqrt{3}$ | $W_7^{\{1324\}}/2$ |
| 8 | $u_8 = [1\ -1\ 1\ 1]^T$ | $W_8^{\{1\}}$ | $W_8^{\{12\}}/\sqrt{2}$ | $W_8^{\{124\}}/\sqrt{3}$ | $W_8^{\{1234\}}/2$ |
| 9 | $u_9 = [1\ -j\ -1\ -j]^T$ | $W_9^{\{1\}}$ | $W_9^{\{14\}}/\sqrt{2}$ | $W_9^{\{134\}}/\sqrt{3}$ | $W_9^{\{1234\}}/2$ |
| 10 | $u_{10} = [1\ 1\ 1\ -1]^T$ | $W_{10}^{\{1\}}$ | $W_{10}^{\{13\}}/\sqrt{2}$ | $W_{10}^{\{123\}}/\sqrt{3}$ | $W_{10}^{\{1324\}}/2$ |
| 11 | $u_{11} = [1\ j\ -1\ j]^T$ | $W_{11}^{\{1\}}$ | $W_{11}^{\{13\}}/\sqrt{2}$ | $W_{11}^{\{134\}}/\sqrt{3}$ | $W_{11}^{\{1324\}}/2$ |
| 12 | $u_{12} = [1\ -1\ -1\ 1]^T$ | $W_{12}^{\{1\}}$ | $W_{12}^{\{12\}}/\sqrt{2}$ | $W_{12}^{\{123\}}/\sqrt{3}$ | $W_{12}^{\{1234\}}/2$ |
| 13 | $u_{13} = [1\ -1\ 1\ -1]^T$ | $W_{13}^{\{1\}}$ | $W_{13}^{\{13\}}/\sqrt{2}$ | $W_{13}^{\{123\}}/\sqrt{3}$ | $W_{13}^{\{1324\}}/2$ |
| 14 | $u_{14} = [1\ 1\ -1\ -1]^T$ | $W_{14}^{\{1\}}$ | $W_{14}^{\{13\}}/\sqrt{2}$ | $W_{14}^{\{123\}}/\sqrt{3}$ | $W_{14}^{\{3214\}}/2$ |
| 15 | $u_{15} = [1\ 1\ 1\ 1]^T$ | $W_{15}^{\{1\}}$ | $W_{15}^{\{12\}}/\sqrt{2}$ | $W_{15}^{\{123\}}/\sqrt{3}$ | $W_{15}^{\{1234\}}/2$ |

In Table 5, $W_n^{\{s\}}$ is obtained from a set $\{S\}$ configured from a formula expressed as $W_n = I - 2u_n u_n^H / u_n^H u_n$. In this case, I indicates 4×4 unitary matrix and $u_n$ indicates a value given by Table 5.

Referring to Table 4, when a codebook for 2 Tx antennas has total 7 precoding vectors/matrixes, since a unitary matrix is provided for an open-loop system, there are total 6 precoding vectors/matrixes for the precoding of a closed-loop system. Moreover, referring to Table 5, a codebook for 4 Tx antennas has total 64 precoding vectors/matrixes.

The above-mentioned codebooks have such a common property as a constant modulus (CM) property, a nested property, a constrained alphabet property and the like. According to the CM property, each element of every precoding matrix within a codebook does not contain '0' and is configured to have the same size. According to the nested property, a precoding matrix of a low rank is designed to be configured with a subset of a specific column of a precoding matrix of a high rank. According to the constrained alphabet property, each element of every precoding matrix within a codebook is constrained. For instance, each element of a precoding matrix is limited only to an element (±1) used for BPSH (binary phase shift keying), elements (±1,±j) used for QPSK (quadrature phase shift keying), or elements $$\left(\pm 1, \pm j, \pm \frac{(1+j)}{\sqrt{2}}, \pm \frac{(-1+j)}{\sqrt{2}}\right)$$

used for 8-PSK. In the example of the codebook shown in Table 5, since alphabet of each element of every precoding matrix within the codebook is configured with $$\left\{\pm 1, \pm j, \pm \frac{(1+j)}{\sqrt{2}}, \pm \frac{(-1+j)}{\sqrt{2}}\right\},$$

it may be represented as having the constrained alphabet property.

Feedback Channel Structure

Basically, since a base station is unable to know information on a DL channel in FDD system, channel information fed back by a user equipment is used for a DL transmission. In case of the legacy 3GPP LTE Release-8/9 system, it is able to feed back DL channel information via PUCCH or PUSCH. In case of the PUCCH, channel information is periodically fed back. In case of the PUSCH, channel information is aperiodically fed back in accordance with a request made by a base station. Moreover, feedback of channel information may be performed in a manner of feeding back the channel information on a whole frequency band (i.e., wideband (WB)) or the channel information on a specific number of RBs (i.e., sub-band (SB)).

Extended Antenna Configuration

FIG. 23 shows examples of configuration of 8 Tx (transmitting) antennas.

FIG. 23(a) shows a case that N antennas configure independent channels without being grouped, which is generally called ULA (uniform linear array). In case that the number of antennas is small, the ULA configuration may be available. In case that the number of antennas is big, multiple antennas are arranged in a manner being spaced apart from each other. Hence, it may be insufficient for a space of a transmitter and/or receiver to configure independent channels.

FIG. 23(b) shows an antenna configuration (i.e., paired ULA) of ULA type in which 2 antennas form a pair. In this case, an associated channel is established between a pair of the antennas and may be independent from that of antennas of another pair.

Meanwhile, unlike the fact that the legacy 3GPP LTE Release-8/9 system uses 4 Tx antennas in DL, the 3GPP LTE Release-10 system is able to use 8 Tx antennas in DL. In order to apply this extended antenna configuration, it is necessary to install several Tx antennas in insufficient space. Thus, the ULA antenna configuration shown FIG. 23(a) or FIG. 23(b) may become inappropriate. Therefore, it may be able to consider applying a dual-polarized (or cross-polarized) antenna configuration shown in FIG. 23(c). In case of this configuration of Tx antennas, even if a distance 'd' between antennas is relatively short, it is able to configure independent channels by lowering correlation. Therefore, data transmission of high throughput can be achieved.

Codebook Structures

If a transmitting end and a receiving end share a pre-defined codebook with each other, it is able to lower an overhead for the receiving end to feed back precoding information to be used for MIMO transmission from the transmitting end. Hence, it is able to apply efficient precoding.

For one example of configuring a pre-defined codebook, it is able to configure a precoder matrix using DFT (discrete Fourier transform) matrix or Walsh matrix. Alternatively, it is able to configure precoders of various types by combination with a phase shift matrix, a shift diversity matrix or the like.

In configuring a DFT matrix based codebook, n×n DFT matrix can be defined as Formula 3.

$$DFTn: D_n(k, l) = \frac{1}{\sqrt{n}}\exp(-j2\pi kl/n),$$ [Formula 3]

$$k, l = 0, 1, \ldots, n-1$$

In the DFT matrix of Formula 3, a single matrix exists for a specific size n only. Hence, in order to appropriately define and use various kinds of precoding matrixes in accordance with a situation, it may be able to consider configuring to use a rotated version of the DFTn matrix in addition. One example of the rotated DFTn matrix is shown in Formula 4.

$$\text{rotated } DFTn: D_n^{(G,g)}(k, \ell) =$$ [Formula 4]

$$\frac{1}{\sqrt{n}}\exp(-j2\pi k(\ell + g/G)/n),$$

$$k, \ell = 0, 1, \ldots, n-1,$$

$$g = 0, 1, \ldots, G.$$

In case that the DFT matrix shown in Formula 4 is configured, it is able to create G rotated DFTn matrixes. And, the created matrixes may meet the property of the DFT matrix.

In the following description, a householder-based codebook structure is explained. The householder-based codebook structure may mean the codebook configured with householder matrix. In particular, the householder matrix is the matrix used for householder transform. The householder transform is a sort of linear transformation and may be usable in performing QR decomposition. The QR decomposition may mean that a prescribed matrix is decomposed into an orthogonal matrix (Q) and an upper triangular matrix (R). The upper triangular matrix means a square matrix of which components below main diagonal components are all zeros. One example of the 4×4 householder matrix is shown in Formula 5.

$$M_1 = I_4 - 2u_0 u_1^H I / \|u_0\|^2 = \frac{1}{\sqrt{4}} * \begin{bmatrix} 1 & 1 & 1 & 1 \\ 1 & 1 & -1 & -1 \\ 1 & -1 & 1 & -1 \\ 1 & -1 & -1 & 1 \end{bmatrix},$$ [Formula 5]

$$u_0^T = [1 \quad -1 \quad -1 \quad -1]$$

It is able to create 4×4 unitary matrix having the CM property by householder transformation Like the codebook for the 4 Tx antennas shown in Table 5, n×n precoding matrix is created using the householder transformation and a column subset of the created precoding matrix can be configured to be used as a precoding matrix for a transmission of a rank smaller than n.

Multi-Codebook Based Precoder Creation

A precoding operation used for a multi-antenna transmission may be explained as an operation of mapping a signal transmitted via layer(s) to antenna(s). In particular, by X×Y precoding matrix, Y transmission layers (or streams) can be mapped to X Tx antennas.

In order to configure $N_t \times R$ precoding matrix used in transmitting R streams (i.e., Rank R) via $N_t$ Tx antennas, a transmitting end receives a feedback of at least one precoding matrix index (PMI) from a receiving end and is then able to configure a precoder matrix. Formula 6 shows one example of a codebook configured with $n_c$ matrixes.

$$P_{N_t \times R}(k) \in \{P_1^{N_t \times R}, P_2^{N_t \times R}, P_3^{N_t \times R}, \ldots, P_{n_c}^{N_t \times R}\} \quad \text{[Formula 6]}$$

In Formula 6, k indicates a specific resource index (e.g., a subcarrier index, a virtual resource index, a subband index, etc.). Formula 6 may be configured in form of Formula 7.

$$P_{N_t \times R}(k) = \begin{bmatrix} P_{M_t \times R,1} \\ P_{M_t \times R,2} \end{bmatrix}, \quad \text{[Formula 7]}$$

$$N_t = 2 \cdot M_t$$

In Formula 7, $P_{M_t \times R,2}$ may be configured in form of shifting $P_{M_t \times R,1}$ by a specific complex weight $w_2$. Hence, if a difference between $P_{M_t \times R,1}$ and $P_{M_t \times R,2}$ is represented as a specific complex weight, it may be expressed as Formula 8.

$$P_{N_t \times R}(k) = \begin{bmatrix} w_1 \cdot P_{M_t \times R,1} \\ w_2 \cdot P_{M_t \times R,1} \end{bmatrix} \quad \text{[formula 8]}$$

Moreover, Formula 8 may be represented as Formula 9 using Kroneker product ($\otimes$).

$$P_{N_t \times R,n,m}(k) = \begin{bmatrix} w_1 \\ w_2 \end{bmatrix} \otimes P_{M_t \times R,1} = W_n \otimes P_m \quad \text{[Formula 9]}$$

Kroneker product is an operation for 2 matrixes in random size. As a result of Kroneker product operation, it is able to obtain a block matrix. For instance, Kroneker product of an m×n matrix A and a p×q matrix B (i.e., A⊗B) may be represented as Formula 10. In Formula 10, $a_{mn}$ indicates an element of the matrix A and $b_{pq}$ indicates an element of the matrix B.

A partial matrix $$\begin{bmatrix} w_1 \\ w_2 \end{bmatrix}$$

of precoding and $P_{M_t \times R,1}$ in Formula 9 may be independently fed back from a receiving end. And, a transmitting end is able to configure and use a precoder like Formula 8 or Formula 9 using each feedback information. In case of applying the form of Formula 8 or Formula 9, W is always configured in form of 2×1 vector and may be configured in form of a codebook shown I Formula 11.

$$W \in \begin{bmatrix} 1 \\ e^{j\frac{2\pi}{N}i} \end{bmatrix}, i = 0, \ldots, N-1 \quad \text{[Formula 11]}$$

In Formula 11, N indicates the total number of precoding vectors contained in the codebook and i may be used as an index of a vector. In order to obtain proper performance by minimizing feedback overhead, i may be usable by being set to 2, 4 or 8. Moreover, $P_{M_t \times R,1}$ may be configured as a codebook for 4 Tx antennas or a codebook for 2 Tx antennas. For this, the codebook of Table 4 or Table 5 (e.g., the codebook for 2 or 4 Tx antennas defined in 3GPP LTE Release-8/9) is usable. And, $P_{M_t \times R,1}$ may be configured in rotated DFT form as well.

Moreover, a matrix W may be available in form of 2×2 matrix. Formula 12 shows one example of the 2×2 matrix W.

$$P_{N_t \times 2R,n,m}(k) = \begin{bmatrix} w_1 & w_3 \\ w_2 & w_4 \end{bmatrix} \otimes P_{M_t \times R,1} = W_n \otimes P_m, N_t = 2 \cdot M_t \quad \text{[Formula 12]}$$

In case of the configuration of Formula 12, if a maximum rank of the codebook $P_{M_t \times R,1}$ is R, it may be able to design a codebook of a rank up to 2R. For instance, in case of using the codebook shown in Table 4 as $P_{M_t \times R,1}$, according to Formula 9, it may be usable up to 4 (R=4) as a maximum rank. On the other hand, according to Formula 12, it may be able to use a maximum rank up to 8 (2R=8). Hence, in the system configured with 8 Tx antennas, it is able to configure a precoder capable of 8×8 transmission. In this case, W may be configured in form of a codebook shown in Formula 13.

$$A \otimes B = \begin{bmatrix} a_{11}b_{11} & a_{11}b_{12} & \ldots & a_{11}b_{1q} & \ldots & \ldots & a_{1n}b_{11} & a_{1n}b_{12} & \ldots & a_{1n}b_{1q} \\ a_{11}b_{21} & a_{11}b_{22} & \ldots & a_{11}b_{2q} & \ldots & \ldots & a_{1n}b_{21} & a_{1n}b_{22} & \ldots & a_{1n}b_{2q} \\ \vdots & \vdots & \ddots & \vdots & & & \vdots & \vdots & \ddots & \vdots \\ a_{11}b_{p1} & a_{11}b_{p2} & \ldots & a_{11}b_{pq} & \ldots & \ldots & a_{1n}b_{p1} & a_{1n}b_{p2} & \ldots & a_{1n}b_{pq} \\ \vdots & \vdots & & \vdots & \ddots & & \vdots & \vdots & & \vdots \\ \vdots & \vdots & & \vdots & & \ddots & \vdots & \vdots & & \vdots \\ a_{m1}b_{11} & a_{m1}b_{12} & \ldots & a_{m1}b_{1q} & \ldots & \ldots & a_{mn}b_{11} & a_{mn}b_{12} & \ldots & a_{mn}b_{1q} \\ a_{m1}b_{21} & a_{m1}b_{22} & \ldots & a_{m1}b_{2q} & \ldots & \ldots & a_{mn}b_{21} & a_{mn}b_{22} & \ldots & a_{mn}b_{2q} \\ \vdots & \vdots & \ddots & \vdots & & & \vdots & \vdots & \ddots & \vdots \\ a_{m1}b_{p1} & a_{m1}b_{p2} & \ldots & a_{m1}b_{pq} & \ldots & \ldots & a_{mn}b_{p1} & a_{mn}b_{p2} & \ldots & a_{mn}b_{pq} \end{bmatrix} \quad \text{[Formula 10]}$$

$$W \in \begin{bmatrix} 1 & 1 \\ e^{j\frac{2\pi}{N}i} & -e^{j\frac{2\pi}{N}i} \end{bmatrix},$$ [Formula 13]

$$i = 0, \ldots, N-1$$

The precoder configuring method according to Formula 9 or Formula 12 may apply differently in accordance with each rank. For instance, the method of Formula 9 is used for a case of a rank equal to or lower than 4 (R≤4). And, the method of Formula 12 may be used for a case of a rank equal to or higher than 5 (R≥5). Alternatively, the method of Formula 9 is used only for a case of a rank 1 (R=1). In other cases (i.e., rank 2 or higher (R≥2)), it may be able to use the method of Formula 12. The W and P mentioned in association with Formula 9 and Formula 12 may be fed back to have the property as shown in Table 6.

TABLE 6

| Case | W/P |
| --- | --- |
| Frequency granularity 1 | One of two matrixes may be configured to be fed back on subband and the other may be configured to be fed back on wideband. |
| Frequency granularity 2 | One of two matrixes may be configured to be fed back on nest-M band and the other may be configured to be fed back on wideband. |
| Time granularity | One of two matrixes may be configured to be fed back by periods N and the other may be configured to be fed back by periods M. |
| Feedback channel 1 | One of two matrixes may be configured to be fed back on PUSCH and the other may be configured to be fed back on PUCCH. |
| Feedback channel 2 | In case of feedback on PUSCH, one (e.g., W) of two matrixes may be configured to be fed back on subband and the other (e.g., P) may be configured to be fed back on wideband. In case of feedback on PUCCH, both Q and P may be configured to be fed back on wideband. |
| Unequal protection | One (e.g., P) of two matrixes may be configured to be coded at a more reliable rating rate and the other (e.g., W) may be configured to be coded at a relatively low coding rate. |
| Alphabet restriction 1 | Alphabet of a matrix W may be configured to be constrained by BPSK and alphabet of a matrix P may be configured to be constrained by QPSK or 8 PSK. |
| Alphabet restriction 2 | Alphabet of a matrix W may be configured to be constrained by QPSK and alphabet of a matrix P may be configured to be constrained by QPSK or 8 PSK. |

In the following description, a multi-codebook based precoder having the nested property is explained.

First of all, it is able to configure a codebook using the method of Formula 9 and the method of Formula 12 appropriately. Yet, in some cases, it may be impossible to configure a precoder unless using two kinds of combinations. To solve this problem, it may be able to configure and use a precoder as shown in Formula 14.

$$P_{N_t \times N_t, n, m} = \begin{bmatrix} w_1 & w_3 \\ w_2 & w_4 \end{bmatrix} \otimes P_{M_t \times M_t} = W_n \otimes P_m, N_t = 2 \cdot M_t$$ [Formula 14]

A precoder for a case that a rank value is equal to the number of Tx antennas (R=$N_t$) is configured using the $P_{N_t \times N_t}$ obtained from Formula 14 and a column subset of the configured precoder may be usable as a precoder for a lower rank. If the precoder is configured in the above manner, the nested property can be met to simplify the CQI calculation. In Formula 14, $P_{N_t \times N_t, n, m}$ indicates the precoder in case of R=$N_t$. In this case, for example, a subset configured with $0^{th}$ and $2^{nd}$ columns of $P_{N_t \times N_t, n, m}$ may be usable for a precoder for R=2, which can be represented as $P_{N_t \times N_t, n, m}$ (0,2). In this case, $P_{M_t \times M_t}$ may be configured with a rotated DFT matrix or a codebook of another type.

Meanwhile, in order to raise a diversity gain in an open-loop environment, based on the precoder configured in the above manner, it is able to maximize the beam diversity gain by exchanging to use a precoder in accordance with a specific resource. For instance, in case of using the precoder according to the method of Formula 9, a method of applying a precoder in accordance with a specific resource may be represented as Formula 15.

$$P_{N_t \times R, n, m}(k) = W_{k \bmod n_c} \otimes P_{k \bmod m_c}$$ [Formula 15]

In Formula 15, k indicates a specific resource region. A precoding matrix for a specific resource region k is determined by such a modulo operation as Formula 15. In this case, $n_c$ and $m_c$ may indicate a size or subset of a codebook for matrix W and a size or subset of a codebook for a matrix P, respectively.

Like Formula 15, if cycling is applied to each of the two matrixes, complexity may increase despite maximizing a diversity gain. Hence, long-term cycling may be set to be applied to a specific matrix and short-term cycling may be set to be applied to the rest of the matrixes.

For instance, the matrix W may be configured to perform a modulo operation in accordance with a physical resource block (PRB) index and the matrix P may be configured to perform a modulo operation in accordance with a subframe index. Alternatively, the matrix W may be configured to perform a modulo operation in accordance with a subframe index and the matrix P may be configured to perform a modulo operation in accordance with a physical resource block (PRB) index.

For another instance, the matrix W may be configured to perform a modulo operation in accordance with a physical resource block (PRB) index and the matrix P may be configured to perform a modulo operation in accordance with a subband index. Alternatively, the matrix W may be configured to perform a modulo operation in accordance with a subband index and the matrix P may be configured to perform a modulo operation in accordance with a physical resource block (PRB) index.

Moreover, a precoder cycling using a modulo operation is applied to one of the two matrixes only and the other may be fixed to use.

Codebook Configuration for 8 Tx Antennas

In the 3GPP LTE Release-10 system having an extended antenna configuration (e.g., 8 Tx antennas), the feedback scheme used by the legacy 3GPP LTE Release-8/9 may be applied in a manner of being extended. For instance, it is able to feed back such channel state information (CSI) as RI (Rank Indicator), PMI (Precoding Matrix Index), CQI (Channel Quality Information) and the like. In the following description, a method of designing a dual precoder based feedback codebook usable for a system supportive of an extended antenna configuration is explained. In the dual precoder based feedback codebook, in order to indicate a precoder to be used for MIMO transmission of a transmitting end, a receiving end may be able to transmit a precoding matrix index (PMI) to the transmitting end. In doing so, a precoding matrix may be indicated by combination of 2 different PMIs. In particular, the receiving end feeds back 2 different PMIs (i.e., $1^{st}$ PMI and $2^{nd}$ PMI) to the transmitting end. Subsequently, the transmitting end determines the precoding matrix indicated by the combination of the $1^{st}$ and $2^{nd}$ PMIs and is then able to apply the determined precoding matrix to the MIMO transmission.

IN designing the dual precoder based feedback codebook, it may be able to consider 8-Tx antenna MIMO transmission, single user-MIMO (SU-MIMO) and multiple user-MIMO (MU-MIMO) supports, compatibility with various antenna configurations, codebook design references, codebook size and the like.

As a codebook applicable to 8-Tx antenna MIMO transmission, it may be able to consider designing a feedback codebook. In particular, this feedback codebook supports SU-MIMO only in case of a rank higher than 2, is optimized for both SU-MIMO and MU-MIMO in case of a rank equal to or lower than 2, and is compatible with various antenna configurations.

In case of MU-MIMO, user equipments participating in MU-MIMO are preferably separated in correlation domain. Hence, the codebook for MU-MIMO needs to be designed to correctly operate on a channel having high correlation. Since DFT vectors provide good performance on a channel having high correlation, it may be able to consider having DFT vector contained in a codebook set of a rank up to a rank-2. In high scattering propagation environment (e.g., an indoor environment having many reflective waves, etc.) capable of producing many space channels, SU-MIMO operation may be preferred as the MIMO transmission scheme. Hence, it may be able to consider designing a codebook for a rank higher than the rank-2 to have god performance in separating multiple layers.

In designing a precoder for MIMO transmission, it is preferable that one precoder structure has good performance for various antenna configurations (e.g., low-correlation, high-correlation, cross-pole, etc.). In arrangement of 8 Tx antennas, a cross-polarized array having an antenna interval of 4λ may be formed in a low-correlation antenna configuration, a ULA having an antenna interval of 0.5λ may be formed in a high-correlation antenna configuration, or a cross-polarized array having an antenna interval of 0.5λ may be formed in a cross-polarized antenna configuration. The DFT based codebook structure may be able to provide good performance for the high-correlation antenna configuration. Meanwhile, block diagonal matrixes may be more suitable for the cross-polarized antenna configuration. Hence, in case that a diagonal matrix is introduced into a codebook for 8 Tx antennas, it is able to configure a codebook that provides god performance for all antenna configurations.

As mentioned in the foregoing description, the codebook design reference is to meet the unitary codebook, the CM property, the constrained alphabet, the proper codebook size, the nested property and the like. This applies to the 3GPP LTE Release-8/9 codebook design. And, it may be able to consider applying such a codebook design reference to the 3GPP LTE Release-10 codebook design supportive of the extended antenna configuration.

Regarding the codebook size, it is necessary to increase the codebook size to sufficiently support the advantage in using 8 Tx antennas. In order to obtain a sufficient precoding gain from 8 Tx antennas in environment with low correlation, a codebook in large size (e.g., a codebook in size over 4 bits for Rank 1 or Rank 2) may be required. In order to obtain a precoding gain in an environment with high correlation, a codebook in 4-bit size may be sufficient. Yet, in order to achieve a multiplexing gain of MU-MIMO, it may be able to increase a codebook size for Rank 1 or Rank 2.

Based on the above description, general structures of a codebook for 8 Tx antennas are explained as follows.

Codebook Structure (1)

In applying multi-granular feedback, a method of configuring a codebook for 8 Tx antennas by combination of 2 base matrixes and a method of configuring the combination of 2 base matrixes using an inner product are described as follows.

First of all, a method of using an inner product of 2 base matrixes may be represented as Formula 16.

$$W = \tilde{W}_1 \tilde{W}_2 \quad \text{[Formula 16]}$$

In case that codebook for 8 Tx antennas is represented in form of an inner product, a $1^{st}$ base matrix may be represented as a diagonal matrix shown in Formula 17 for a co-polarized antenna group.

$$\tilde{W}_1 = \begin{bmatrix} W_1 & 0 \\ 0 & W_1 \end{bmatrix} (W_1: 4 \times N) \quad \text{[Formula 17]}$$

Moreover, in case that a $2^{nd}$ base matrix is used to adjust a relative phase between polarizations, the $2^{nd}$ base matrix may be represented using an identity matrix. For an upper rank of a codebook for 8 Tx antennas, the $2^{nd}$ base matrix may be represented as Formula 18. In Formula 18, a relation between a coefficient '1' of a $1^{st}$ row of the $2^{nd}$ base matrix and a coefficient 'a' or '−a' of a $2^{nd}$ row thereof may be able to reflect the adjustment of a relative phase between orthogonal polarizations.

$$\tilde{W}_2 = \begin{bmatrix} I & I \\ aI & -aI \end{bmatrix} (I: N \times N) \quad \text{[Formula 18]}$$

Hence, if the codebook for 8 Tx antennas is represented using the $1^{st}$ base matrix and the $2^{nd}$ base matrix, it can be represented as Formula 19.

$$W = \begin{bmatrix} W_1 & 0 \\ 0 & W_1 \end{bmatrix} \begin{bmatrix} I & I \\ aI & -aI \end{bmatrix} = \begin{bmatrix} W_1 & W_1 \\ aW_1 & -aW_1 \end{bmatrix} \quad \text{[Formula 19]}$$

The codebook expressed using the inner product like Formula 19 can be simplified into Formula 20 using Kroneker product.

$$W = W_2 \otimes W_1 (W_1: 4 \times N, W_2: 2 \times M) \quad \text{[Formula 20]}$$

In Formula 20, a precoding matrix included in a codebook W includes 4*2 rows and N*M columns. Hence, it can be used as a codebook for 8 Tx antennas and transmission of Rank 'N*M'. For instance, in case of configuring a codebook for 8 Tx antennas and transmission of Rank R, if $W_2$ is configured with 2×M, a value N for $W_1$ becomes R/M. For instance, in case of configuring a codebook for 8 Tx antennas and transmission of Rank 4, if $W_2$ is configured with 2×2 (i.e., M=2) matrix (e.g., the matrix shown in Formula 13), $W_1$ may apply 4×2 (i.e., N=R/M=4/2=2) matrix (e.g., DFT matrix).

Codebook Structure (2)

Another method of configuring a codebook for 8 Tx antennas by combination of 2 base matrixes is described as follows. Assuming that the 2 base matrixes are set to W1 and W2, respectively, a precoding matrix W for configuring a codebook may be defined in form of W1*W2. For Rank 1 to Rank 8, W1 may be able to have such a form of a block diagonal matrix as $$\begin{bmatrix} X & 0 \\ 0 & X \end{bmatrix}.$$

For Rank 1 to Rank 4, X corresponding to a block of a block diagonal matrix W1 may be configured with a matrix in size of 4×Nb. And, 16 4Tx DFT beams can be defined for the X. In this case, beams indexes may be given as 0, 1, 2, . . . , and 15, respectively. For each W1, the adjacent overlapping beams may be usable to reduce an edge effect in frequency-selective precoding. Hence, even if a codebook is configured using the same W1 for an identical or different W2, optimal performance can be secured for several subbands.

For Rank 1 and Rank 2, X corresponding to a block diagonal matrix W1 may be configured with a matrix in size of 4×4 (i.e., Nb=4). For each of Rank 1 and Rank 2, 8 W1 matrixes can be defined. And, one W1 may include beams overlapping with the adjacent W1. In case that beam indexes are given as 0, 1, 2, . . . , and 15, respectively, for example, it is able to configure 8 W1 matrixes, of which beams overlapping with the adjacent W1 matrix, such as {0, 1, 2, 3}, {2, 3, 4, 5}, {4, 5, 6, 7}, {6, 7, 8, 9}, {8, 9, 10, 11}, {10, 11, 12, 13}, {12, 13, 14, 15}, and {14, 15, 0, 1}. For instance, a W1 codebook for Rank 1 or Rank 2 may be defined as Formula 21.

$$X^{(n)} = \frac{1}{2} \times \begin{bmatrix} 1 & 0 & 0 & 0 \\ 0 & e^{j\frac{\pi}{4}n} & 0 & 0 \\ 0 & 0 & e^{j(2)\frac{\pi}{4}n} & 0 \\ 0 & 0 & 0 & e^{j(3)\frac{\pi}{4}n} \end{bmatrix}$$ [Formula 21]

$$\begin{bmatrix} 1 & 1 & 1 & 1 \\ 1 & e^{j\frac{\pi}{8}} & e^{j(2)\frac{\pi}{8}} & e^{j(3)\frac{\pi}{8}} \\ 1 & e^{j(2)\frac{\pi}{8}} & e^{j(2)(2)\frac{\pi}{8}} & e^{j(3)(2)\frac{\pi}{8}} \\ 1 & e^{j(3)\frac{\pi}{8}} & e^{j(2)(3)\frac{\pi}{8}} & e^{j(3)(3)\frac{\pi}{8}} \end{bmatrix},$$

$n = 0, 1, 2, \ldots, 7$ $$W_1^{(n)} = \begin{bmatrix} X^{(n)} & 0 \\ 0 & X^{(n)} \end{bmatrix},$$

$$CB_1 = \{W_1^{(0)}, W_1^{(1)}, W_1^{(2)}, \ldots, W_1^{(7)}\}$$

In Formula 21, X(n) corresponding to a block of a block diagonal matrix $W1^{(n)}$ is defined and a W1 codebook ($CB_1$) can be configured with 8 different W1's.

Considering the selection and common-phase component of W2, the selection of 4 kinds of different matrixes is possible for Rank 1 and 4 kinds of different QPSK co-phases are applicable for Rank 1. Hence, total 16 W2 matrixes can be defined. For instance, the W2 codebook ($CB_2$) for Rank 1 can be configured as Formula 22.

$$W_2 \in CB_2 = \left\{ \frac{1}{\sqrt{2}}\begin{bmatrix} Y \\ Y \end{bmatrix}, \frac{1}{\sqrt{2}}\begin{bmatrix} Y \\ jY \end{bmatrix}, \frac{1}{\sqrt{2}}\begin{bmatrix} Y \\ -Y \end{bmatrix}, \frac{1}{\sqrt{2}}\begin{bmatrix} Y \\ -jY \end{bmatrix} \right\}$$ [Formula 22]

$$Y \in \left\{ \begin{bmatrix} 1 \\ 0 \\ 0 \\ 0 \end{bmatrix}, \begin{bmatrix} 0 \\ 1 \\ 0 \\ 0 \end{bmatrix}, \begin{bmatrix} 0 \\ 0 \\ 1 \\ 0 \end{bmatrix}, \begin{bmatrix} 0 \\ 0 \\ 0 \\ 1 \end{bmatrix} \right\}$$

For Rank 2, the selection of 4 kinds of different matrixes is possible and 2 kinds of different QPSK co-phases are applicable. Hence, total 8 W2 matrixes can be defined. For instance, the W2 codebook ($CB_2$) for Rank 2 can be configured as Formula 23.

$$W_2 \in CB_2 = \left\{ \frac{1}{\sqrt{2}}\begin{bmatrix} Y & Y \\ Y & -Y \end{bmatrix}, \frac{1}{\sqrt{2}}\begin{bmatrix} Y & Y \\ jY & -jY \end{bmatrix} \right\}$$ [Formula 23]

$$Y \in Y \in \left\{ \begin{bmatrix} 1 \\ 0 \\ 0 \\ 0 \end{bmatrix}, \begin{bmatrix} 0 \\ 1 \\ 0 \\ 0 \end{bmatrix}, \begin{bmatrix} 0 \\ 0 \\ 1 \\ 0 \end{bmatrix}, \begin{bmatrix} 0 \\ 0 \\ 0 \\ 1 \end{bmatrix} \right\}$$

Subsequently, for Rank 3 and Rank 4, X corresponding to a block diagonal matrix W1 may be configured with a matrix in size of 4×8 (i.e., Nb=8). For each of Rank 3 and Rank 4, 4 W1 matrixes can be defined. And, one W1 may include beams overlapping with the adjacent W1. In case that beam indexes are given as 0, 1, 2, . . . , and 15, respectively, for example, it is able to configure 4 W1 matrixes, of which beams overlapping with the adjacent W1 matrix, such as {0, 1, 2, . . . , 7}, {4, 5, 6, . . . , 11}, {8, 9, 10, . . . , 15}, and {12, . . . , 15,0, . . . , 3}. For instance, a W1 codebook for Rank 3 or Rank 4 may be defined as Formula 24.

$$X^{(n)} = \frac{1}{2} \times \begin{bmatrix} 1 & 0 & 0 & 0 \\ 0 & (j)^n & 0 & 0 \\ 0 & 0 & (-1)^n & 0 \\ 0 & 0 & 0 & (-j)^n \end{bmatrix}$$ [Formula 24]

$$\begin{bmatrix} 1 & 1 & 1 & \ldots & 1 \\ 1 & e^{j\frac{\pi}{8}} & e^{j(2)\frac{\pi}{8}} & \ldots & e^{j(7)\frac{\pi}{8}} \\ 1 & e^{j(2)\frac{\pi}{8}} & e^{j(2)(2)\frac{\pi}{8}} & \ldots & e^{j(7)(2)\frac{\pi}{8}} \\ 1 & e^{j(3)\frac{\pi}{8}} & e^{j(2)(3)\frac{\pi}{8}} & \ldots & e^{j(7)(3)\frac{\pi}{8}} \end{bmatrix},$$

$n = 0, 1, 2, 3$ $$W_1^{(n)} = \begin{bmatrix} X^{(n)} & 0 \\ 0 & X^{(n)} \end{bmatrix},$$

$$CB_1 = \{W_1^{(0)}, W_1^{(1)}, W_1^{(2)}, W_1^{(3)}\}$$

In Formula 24, X(n) corresponding to a block of a block diagonal matrix $W1^{(n)}$ is defined and a W1 codebook ($CB_1$) can be configured with 4 different W1's.

Considering the selection and common-phase component of W2, the selection of 8 kinds of different matrixes is possible for Rank 3 and 2 kinds of different QPSK co-phases are applicable for Rank 3. Hence, total 16 W2 matrixes can be defined. For instance, the W2 codebook ($CB_2$) for Rank 3 can be configured as Formula 25.

$$W_2 \in CB_2 = \left\{ \frac{1}{\sqrt{2}}\begin{bmatrix} Y_1 & Y_2 \\ Y_1 & -Y_2 \end{bmatrix}, \frac{1}{\sqrt{2}}\begin{bmatrix} Y_1 & Y_2 \\ jY_1 & -jY_2 \end{bmatrix} \right\} \quad \text{[Formula 25]}$$

$$(Y_1, Y_2) \in \left\{ \begin{array}{l} (e_1, [e_1\ e_5]), (e_2, [e_2\ e_6]), (e_3, [e_3\ e_7]), (e_4, [e_4\ e_8]), \\ (e_5, [e_1\ e_5]), (e_6, [e_2\ e_6]), (e_7, [e_3\ e_7]), (e_8, [e_4\ e_8]) \end{array} \right\}$$

In Formula 24, $e_n$ indicates 8×1 vector, $n^{th}$ element has a value of 1, and the rest of elements mean a selection vector having a value of 0.

For Rank 4, the selection of 4 kinds of different matrixes is possible and 2 kinds of different QPSK co-phases are applicable. Hence, total 8 W2 matrixes can be defined. For instance, the W2 codebook ($CB_2$) for Rank 4 can be configured as Formula 26.

$$W_2 \in CB_2 = \left\{ \frac{1}{\sqrt{2}}\begin{bmatrix} Y & Y \\ Y & -Y \end{bmatrix}, \frac{1}{\sqrt{2}}\begin{bmatrix} Y & Y \\ jY & -jY \end{bmatrix} \right\} \quad \text{[Formula 26]}$$

$$Y \in \{[e_1\ e_5], [e_2\ e_6], [e_3\ e_7], [e_4\ e_8]\}$$

For Rank 5 to Rank 8, X corresponding to a block of a block diagonal matrix W1 can be configured with DFT matrix in size of 4×4 and one W1 matrix can be defined. W2 may be defined as a product of a matrix $$\begin{bmatrix} I & I \\ I & -I \end{bmatrix}$$

and a row selection matrix in a fixed size of 8×r. For Rank 5, since selection of 4 kinds of different matrixes is possible, 4 W2 matrixes can be defined. For Rank 6, since selection of 4 kinds of different matrixes is possible, 4 W2 matrixes can be defined. For Rank 7, since selection of 1 kind of a matrix is possible, one W2 matrix can be defined. For Rank 8, since selection of 1 kind of a matrix is possible, one W2 matrix can be defined. In this case, the matrix $$\begin{bmatrix} I & I \\ I & -I \end{bmatrix}$$

is introduced to enable all polarized groups for each transmission layer to be identically used and good performance may be expected for a transmission of a high rank having a spatial channel having more scattering. In this case, the I means an identity matrix.

For instance, the W1 codebook or the W2 codebook for Rank 5 to Rank 8 can be defined as Formula 27.

$$X = \frac{1}{2} \times \begin{bmatrix} 1 & 1 & 1 & 1 \\ 1 & j & -1 & -j \\ 1 & -1 & 1 & -1 \\ 1 & -j & -1 & j \end{bmatrix}, \quad \text{[Formula 27]}$$

$$W_1 = \begin{bmatrix} X & 0 \\ 0 & X \end{bmatrix},$$

$$CB_1 = \{W_1\}$$

$$W_2 \in CB_2 = \left\{ \frac{1}{\sqrt{2}}\begin{bmatrix} I_4 & I_4 \\ I_4 & -I_4 \end{bmatrix} Y \right\}$$

In Formula 27, the W1 codebook for Rank 5 to Rank 8 is configured with one W1 matrix only. $I_4$ in the W2 codebook for Rank 5 to Rank 8 means an identity matrix in size of 4×4. In Formula 27, a matrix Y can be defined as one of Formula 28 to Formula 31 for example.

The matrix Y for Rank 5 can be defined as Formula 28.

$$Y \in \left\{ \begin{array}{l} [e_1\ e_2\ e_3\ e_4\ e_5], [e_2\ e_3\ e_4\ e_5\ e_6], \\ [e_3\ e_4\ e_5\ e_6\ e_7], [e_4\ e_5\ e_6\ e_7\ e_8] \end{array} \right\} \quad \text{[Formula 28]}$$

The matrix Y for Rank 6 can be defined as Formula 29.

$$Y \in \left\{ \begin{array}{l} [e_1\ e_2\ e_3\ e_4\ e_5\ e_6], [e_2\ e_3\ e_4\ e_5\ e_6\ e_7], \\ [e_3\ e_4\ e_5\ e_6\ e_7\ e_8], [e_4\ e_5\ e_6\ e_7\ e_8\ e_1] \end{array} \right\} \quad \text{[Formula 29]}$$

The matrix Y for Rank 7 can be defined as Formula 30.

$$Y = [e_1\ e_2\ e_3\ e_4\ e_5\ e_6\ e_7] \quad \text{[Formula 30]}$$

The matrix Y for Rank 8 can be defined as Formula 31.

$$Y = I_8 \quad \text{[Formula 31]}$$

In Formula 31, the $I_8$ means 8×8 identity matrix.

As mentioned in the foregoing description, the numbers of W1's, which can be defined for each of Rank 1 to Rank 8, are added up to result in 28 (=8+8+4+4+1+1+1+1).

Details of Codebook Configuration for 8 Tx Antennas

Based on the above description of the precoder configuration applicable to the system having the configuration of maximum 8 Tx antennas, examples of the present invention relating to the details (e.g., precoder sizes, element components, etc.) to apply the precoding to the multi-antenna system are described as follows. And, examples of the present invention relating to the precoding configuration supportive of various antenna configurations are described as well.

A design principle of a precoding codebook according to the present invention for a system having 8 Tx antennas (8Tx) and its detailed examples are described as follows.

1$^{st}$ Embodiment

In case that a precoding weight is determined by combination of 2 base matrixes (e.g., 1$^{st}$ matrix W1 and 2$^{nd}$ matrix W2), one block X of elements of the matrix W1 in a block diagonal form may have a form resulting from multiplying another block X by a prescribed phase α. In this case, every element of the block X is multiplied by the same phase value α. For instance, the block diagonal matrix W1 can be defined as Formula 32.

$$W_1^{(n)} = \begin{bmatrix} X^{(n)} & 0 \\ 0 & \alpha X^{(n)} \end{bmatrix} \quad \text{[Formula 32]}$$

Like Formula 32, in a matrix configured in a block diagonal form, $W_1^{(n)}$ can be defined in a manner of multiplying one random block $X^{(n)}$ by a phase $\alpha$. In this case, the phase $\alpha$ may be defined as a fixed phase value. Alternatively, the phase $\alpha$ may be defined as a value represented as a constrained alphabet (e.g., M-PSK).

The phase value $\alpha$ weighted to the block X may be represented as a function (i.e., $\alpha^{(n)}$) for a variable n to generate the block X. For instance, $W_1^{(n)}$ may be defined as Formula 33.

$$W_1^{(n)} = \begin{bmatrix} X^{(n)} & 0 \\ 0 & \alpha^{(n)} X^{(n)} \end{bmatrix} \quad \text{[Formula 33]}$$

For instance, the block X may use DFT vector oversampled like Formula 34.

$$X^{(n)} = \frac{1}{\sqrt{K}} e^{j\frac{2\pi nk}{N}} \quad \text{[Formula 34]}$$

$n = 0, \ldots, N-1$ $k = 0, \ldots, K-1$

In Formula 34, the N means the number of vectors and the K means a length of the vector (i.e., the number of vector components). In this case, if N DFT vectors having a length K are defined, nth vector is multiplied by a phase $\alpha(n)$ corresponding to a vector index n.

The phase $\alpha^{(n)}$ generated by n may be represented as a function of the vector length K and the vector number N like Formula 35.

$$\alpha^{(n)} = e^{j\frac{2\pi nK}{N}} \quad \text{[Formula 35]}$$

$n = 0, \ldots, N-1$

If Formula 34 and Formula 35 are inserted in Formula 33, $W_1^{(n)}$ can be defined as Formula 36.

$$W_1^{(n)} = \quad \text{[Formula 36]}$$

$$\frac{1}{\sqrt{K}} \begin{bmatrix} e^{j\frac{2\pi nk}{N}} & 0 \\ 0 & e^{j\frac{2\pi nK}{N}} e^{j\frac{2\pi nk}{N}} \end{bmatrix} = \frac{1}{\sqrt{K}} \begin{bmatrix} e^{j\frac{2\pi nk}{N}} & 0 \\ 0 & e^{j\frac{2\pi n(k+K)}{N}} \end{bmatrix}$$

For instance, if K=4, the vector $X^{(n)}$ becomes 4×1 vector. In this case, $W_1^{(n)}$ may be represented as Formula 37.

$$W_1^{(n)} = \frac{1}{\sqrt{K}} \begin{bmatrix} e^{j\frac{2\pi n \cdot 0}{N}} & 0 \\ e^{j\frac{2\pi n \cdot 1}{N}} & 0 \\ e^{j\frac{2\pi n \cdot 2}{N}} & 0 \\ e^{j\frac{2\pi n \cdot 3}{N}} & 0 \\ 0 & e^{j\frac{2\pi n(0+K)}{N}} \\ 0 & e^{j\frac{2\pi n(1+K)}{N}} \\ 0 & e^{j\frac{2\pi n(2+K)}{N}} \\ 0 & e^{j\frac{2\pi n(3+K)}{N}} \end{bmatrix}, \quad \text{[Formula 37]}$$

$K = 4$

The precoding weight W may be generated from a product of the $1^{st}$ matrix $W_1$ and the $2^{nd}$ matrix (or vector) $W_2$, which can be represented as Formula 38.

$$W^{(n,m)} = W_1^{(n)} \cdot W_2^{(m)} \quad \text{[Formula 38]}$$

In Formula 38, the $W_1$ is defined for n and the $W_2$ may be defined for a random variable m different from the n. for instance, if the block diagonal matrix shown in Formula 33 is used as the W1 and a prescribed vector is used as the W2, the precoding weight W may be represented as Formula 39.

$$W^{(n)} = \begin{bmatrix} X^{(n)} & 0 \\ 0 & \alpha(n)X^{(n)} \end{bmatrix} \cdot \frac{1}{\sqrt{2}} \begin{bmatrix} 1 \\ b \end{bmatrix} = \frac{1}{\sqrt{2}} \begin{bmatrix} X^{(n)} \\ b\alpha(n)X^{(n)} \end{bmatrix} \quad \text{[Formula 39]}$$

Formula 39 shows one example that vector $$\frac{1}{\sqrt{2}} \begin{bmatrix} 1 \\ b \end{bmatrix}$$

is used as the $W_2$. In this case, the b may be represented as a random complex value. For instance, in case that the value of b is configured with a constrained alphabet, such a value as $\{1\}, \{1,-1\}, \{j,-j\}, \{1,-1,j,-j\}$, $$\left\{1, -1, j, -j, \frac{1+j}{\sqrt{2}}, \frac{1-j}{\sqrt{2}}, \frac{-1+j}{\sqrt{2}}, \frac{-1-j}{\sqrt{2}}\right\}$$

and the like is available. For instance, if K=4 (i.e., $W_1^{(n)}$ is represented like Formula 37) and b=1, $W^{(n)}$ may be represented as Formula 40.

$$W^{(n)} = \frac{1}{\sqrt{K \cdot 2}} \begin{bmatrix} e^{j\frac{2\pi n \cdot 0}{N}} \\ e^{j\frac{2\pi n \cdot 1}{N}} \\ e^{j\frac{2\pi n \cdot 2}{N}} \\ e^{j\frac{2\pi n \cdot 3}{N}} \\ e^{j\frac{2\pi n(0+K)}{N}} \\ e^{j\frac{2\pi n(1+K)}{N}} \\ e^{j\frac{2\pi n(2+K)}{N}} \\ e^{j\frac{2\pi n(3+K)}{N}} \end{bmatrix}, K = 4 \quad \text{[Formula 40]}$$

If the $2^{nd}$ matrix $W_2$ has Rank 2, it may be represented as Formula 41.

$$W^{(n)} = \begin{bmatrix} X^{(n)} & 0 \\ 0 & \alpha(n)X^{(n)} \end{bmatrix} \cdot \frac{1}{\sqrt{2}} \begin{bmatrix} 1 & 1 \\ b & -b \end{bmatrix} = \quad \text{[Formula 41]}$$

$$\frac{1}{\sqrt{2}} \begin{bmatrix} X^{(n)} & X^{(n)} \\ b\alpha(n)X^{(n)} & -b\alpha(n)X^{(n)} \end{bmatrix}$$

$2^{nd}$ Embodiment

When a block diagonal matrix W1 is represented as a random square matrix, a partial block matrix of a block matrix configuring the W1 may be multiplied by a phase diagonal matrix. In this case, the phase diagonal matrix may be denoted by $\alpha(n)$. For instance, $W_1^{(n)}$ may be represented as Formula 42.

$$W_1^{(n)} = \begin{bmatrix} X^{(n)} & 0 \\ 0 & X^{(n)}\alpha(n) \end{bmatrix} \quad \text{[Formula 42]}$$

In Formula 42, the phase diagonal matrix $\alpha(n)$ may be represented as Formula 43 for example.

$$\alpha(n) = \quad \text{[Formula 43]}$$

$$\text{diag}(e^{j\theta_0(n)} \ldots e^{j\theta_{K-1}(n)}) = \begin{bmatrix} e^{j\theta_0(n)} & 0 & \cdots & 0 \\ 0 & e^{j\theta_1(n)} & \cdots & 0 \\ \vdots & \vdots & \ddots & \vdots \\ 0 & 0 & \cdots & e^{j\theta_{K-1}(n)} \end{bmatrix}$$

For instance, the $X^{(n)}$ may be configured with DFT matrix having 4 rows. And, the $X^{(n)}\alpha(n)$ may be configured with $\alpha_1(n)X^{(n)}\alpha_2(n)$ for example. Formula 44 shows the corresponding $X^{(n)}$ and $\alpha_1(n)X^{(n)}\alpha_2(n)$ for example.

$$X^{(n)} = \frac{1}{\sqrt{K}} \begin{bmatrix} e^{j\frac{2\pi \cdot 0 \cdot 0}{N}} & e^{j\frac{2\pi \cdot 0 \cdot 1}{N}} & e^{j\frac{2\pi \cdot 0 \cdot 2}{N}} & e^{j\frac{2\pi \cdot 0 \cdot 3}{N}} \\ e^{j\frac{2\pi \cdot 1 \cdot 0}{N}} & e^{j\frac{2\pi \cdot 1 \cdot 1}{N}} & e^{j\frac{2\pi \cdot 1 \cdot 2}{N}} & e^{j\frac{2\pi \cdot 1 \cdot 3}{N}} \\ e^{j\frac{2\pi \cdot 2 \cdot 0}{N}} & e^{j\frac{2\pi \cdot 2 \cdot 1}{N}} & e^{j\frac{2\pi \cdot 2 \cdot 2}{N}} & e^{j\frac{2\pi \cdot 2 \cdot 3}{N}} \\ e^{j\frac{2\pi \cdot 3 \cdot 0}{N}} & e^{j\frac{2\pi \cdot 3 \cdot 1}{N}} & e^{j\frac{2\pi \cdot 3 \cdot 2}{N}} & e^{j\frac{2\pi \cdot 3 \cdot 3}{N}} \end{bmatrix}, \quad \text{[Formula 44]}$$

$K = 4$ $$\alpha_1(n)X^{(n)}\alpha_2(n) = \frac{1}{\sqrt{K}} \begin{bmatrix} e^{j\frac{2\pi \cdot b \cdot n \cdot 0}{N}} & 0 & 0 & 0 \\ 0 & e^{j\frac{2\pi \cdot b \cdot n \cdot 1}{N}} & 0 & 0 \\ 0 & 0 & e^{j\frac{2\pi \cdot b \cdot n \cdot 2}{N}} & 0 \\ 0 & 0 & 0 & e^{j\frac{2\pi \cdot b \cdot n \cdot 3}{N}} \end{bmatrix}$$

$$\begin{bmatrix} e^{j\frac{2\pi \cdot 0 \cdot 0}{N}} & e^{j\frac{2\pi \cdot 0 \cdot 1}{N}} & e^{j\frac{2\pi \cdot 0 \cdot 2}{N}} & e^{j\frac{2\pi \cdot 0 \cdot 3}{N}} \\ e^{j\frac{2\pi \cdot 1 \cdot 0}{N}} & e^{j\frac{2\pi \cdot 1 \cdot 1}{N}} & e^{j\frac{2\pi \cdot 1 \cdot 2}{N}} & e^{j\frac{2\pi \cdot 1 \cdot 3}{N}} \\ e^{j\frac{2\pi \cdot 2 \cdot 0}{N}} & e^{j\frac{2\pi \cdot 2 \cdot 1}{N}} & e^{j\frac{2\pi \cdot 2 \cdot 2}{N}} & e^{j\frac{2\pi \cdot 2 \cdot 3}{N}} \\ e^{j\frac{2\pi \cdot 3 \cdot 0}{N}} & e^{j\frac{2\pi \cdot 3 \cdot 1}{N}} & e^{j\frac{2\pi \cdot 3 \cdot 2}{N}} & e^{j\frac{2\pi \cdot 3 \cdot 3}{N}} \end{bmatrix}$$

$$\begin{bmatrix} e^{j\frac{2\pi(b \cdot n+0)K}{N}} & 0 & 0 & 0 \\ 0 & e^{j\frac{2\pi(b \cdot n+1)K}{N}} & 0 & 0 \\ 0 & 0 & e^{j\frac{2\pi(b \cdot n+2)K}{N}} & 0 \\ 0 & 0 & 0 & e^{j\frac{2\pi(b \cdot n+3)K}{N}} \end{bmatrix}$$

In Formula 44, a beam may be shifted by a phase diagonal matrix ahead of the DFT matrix. And, the phase diagonal matrix behind the DFT matrix may provide better resolution of the beam in creating one matrix by stacking $X^{(n)}$. The phase diagonal matrix ahead of the DFT matrix and the phase diagonal matrix behind the DFT matrix may have the relation of $$e^{j\frac{2\pi \cdot b \cdot n \cdot k}{N}}, e^{j\frac{2\pi(b \cdot n+k)K}{N}},$$

k=0, . . . , K−1, in-between.

Moreover, in Formula 44, the K indicates the number of rows. In particular, a precoding weight W generated using the $X^{(n)} \triangleq$ configured as Formula 44 may be usable for 4-Tx transmission.

Meanwhile, if K=2, $X^{(n)}$ and $\alpha_1(n)X^{(n)}\alpha_2(n)$ may be configured as Formula 45.

$$X^{(n)} = \frac{1}{\sqrt{K}} \begin{bmatrix} e^{j\frac{2\pi \cdot 0 \cdot 0}{N}} & e^{j\frac{2\pi \cdot 0 \cdot 1}{N}} \\ e^{j\frac{2\pi \cdot 1 \cdot 0}{N}} & e^{j\frac{2\pi \cdot 1 \cdot 1}{N}} \end{bmatrix}$$ [Formula 45]

$$\alpha_1(n)X^{(n)}\alpha_2(n) = \frac{1}{\sqrt{K}} \begin{bmatrix} e^{j\frac{2\pi \cdot b \cdot n \cdot 0}{N}} & 0 \\ 0 & e^{j\frac{2\pi \cdot b \cdot n \cdot 1}{N}} \end{bmatrix}$$

$$\begin{bmatrix} e^{j\frac{2\pi \cdot 0 \cdot 0}{N}} & e^{j\frac{2\pi \cdot 0 \cdot 1}{N}} \\ e^{j\frac{2\pi \cdot 0 \cdot 1}{N}} & e^{j\frac{2\pi \cdot 1 \cdot 1}{N}} \end{bmatrix} \begin{bmatrix} e^{j\frac{2\pi(b \cdot n+0)K}{N}} & 0 \\ 0 & e^{j\frac{2\pi(b \cdot n+1)K}{N}} \end{bmatrix}, K = 2$$

The precoding weight W generated using the $X^{(n)} \triangleq$ configured as Formula 45 may be used for 2-Tx transmission.

Meanwhile, when the precoding weight W is configured using the 1st matrix W1 and the 2nd matrix W2, it is able to raise resolution of a contiguous vector or matrix using the phase diagonal matrix. In particular, the W can be configured as Formula 46.

$$W^{(l,n,m)} = b(l) \cdot W_1^{(n)} \cdot W_2^{(m)}$$

$$b(l) = \text{diag}(e^{j\theta_0(l)} \ldots e^{j\theta_{K-1}(l)})$$ [Formula 46]

3rd Embodiment

In abovementioned description of the codebook structure (2), the method of configuring the W1 with the block diagonal matrixes is explained. In the following description, when w1 is configured as a block diagonal matrix, examples of the present invention relating to a method of configuring a block matrix in a manner of multiplying a portion of the block matrix by a linear phase value are explained.

First of all, in case that a precoding weight W is configured with a combination of 2 base matrixes W1 and W2, it may be defined as W=W1*W2. In this case, for Rank 1 to Rank 8, the W1 may have such a form of a block diagonal matrix as $$\begin{bmatrix} X & 0 \\ 0 & X \end{bmatrix}.$$

Using the W1 in form of the block diagonal matrix for a precoding matrix, even of an antenna interval has a prescribed value (e.g., λ/2, 4λ, etc.) in a dual-polarized antenna configuration, it is able to meet the spatial covariance indicating correlation of a spatial channel created by each antenna of the antenna configuration. Moreover, by at least 16 8Tx DFT vectors generated from the W1 and the co-phase component via the W2, it is able to meet the spatial covariance in the ULA antenna configuration. Hence, it may be able to expect good performance for both an antenna configuration having high spatial correlation and an antenna configuration having low spatial correlation.

For Rank 1 to Rank 4, X corresponding to a block of a block diagonal matrix W1 may be configured with a matrix in size of 4×Nb. And, 16 4Tx DFT beams can be defined for the X. In this case, beams indexes may be given as 0, 1, 2, . . . , and 15, respectively. For each W1, the adjacent overlapping beams may be usable to reduce an edge effect in frequency-selective precoding. Hence, even if a codebook is configured using the same W1 for an identical or different W2, optimal performance can be secured for several subbands.

For Rank 1 and Rank 2, X corresponding to a block diagonal matrix W1 may be configured with a matrix in size of 4×4 (i.e., Nb=4). For each of Rank 1 and Rank 2, 8 W1 matrixes can be defined. And, one W1 may include beams overlapping with the adjacent W1. In case that beam indexes are given as 0, 1, 2, . . . , and 15, respectively, for example, it is able to configure 8 W1 matrixes, of which beams overlapping with the adjacent W1 matrix, such as {0, 1, 2, 3}, {2, 3, 4, 5}, {4, 5, 6, 7}, {6, 7, 8, 9}, {8, 9, 10, 11}, {10, 11, 12, 13}, {12, 13, 14, 15}, and {14, 15, 0, 1}. For instance, a W1 codebook for Rank 1 or Rank 2 may be defined as Formula 47.

$$B^i = [b_0^i \; b_1^i \; \ldots \; b_{15}^i],$$ [Formula 47]

$$[B^i]_{1+m,1+n} = e^{j\frac{2\pi(m+4i)n}{16}},$$

$$m = 0, 1, 2, 3,$$

$$n = 0, 1, \ldots 15$$

$$X_i^{(k)} \in$$

$$\{[b_{2k \bmod 16}^i \; b_{(2k+1) \bmod 16}^i \; b_{(2k+2) \bmod 16}^i \; b_{(2k+3) \bmod 16}^i]: k = 0, 1, \ldots, 7\}$$

$$W_1^{(k)} = \begin{bmatrix} X_0^{(k)} & 0 \\ 0 & X_1^{(k)} \end{bmatrix}$$

Codebook 1: $C_1 = \{W_1^{(0)}, W_1^{(1)}, W_1^{(2)}, \ldots, W_1^{(7)}\}$

In Formula 47, the $B^i$ corresponds to 16 beam vectors. The $X_i^{(k)}$ may be defined as a matrix containing 4 beam vectors. And, $X_i^{(k)}$ corresponding to a block of a block diagonal matrix $W1^{(k)}$ is defined. In particular, since one block matrix is defined as $X_0^{(k)}$ and the other block matrix is defined as $X_1^{(k)}$, the block matrixes differ from each other in phase. Compared to a case that block matrixes have the same phase, this case enables goo beam formation in UL antenna configuration. Thus, the W1 codebook ($C_1$) can be configured with 8 different W1's.

Considering the selection and common-phase component of W2, the selection of 4 kinds of different matrixes is possible for Rank 1 and 4 kinds of different QPSK co-phases are applicable for Rank 1. Hence, total 16 W2 matrixes can be defined. For instance, the W2 codebook ($CB_2$) for Rank 1 can be configured as Formula 48.

$$W_2 \in C_2 = \quad \text{[Formula 48]}$$

$$\left\{ \frac{1}{\sqrt{2}} \begin{bmatrix} Y \\ Y \end{bmatrix}, \frac{1}{\sqrt{2}} \begin{bmatrix} Y \\ jY \end{bmatrix}, \frac{1}{\sqrt{2}} \begin{bmatrix} Y \\ -Y \end{bmatrix}, \frac{1}{\sqrt{2}} \begin{bmatrix} Y \\ -jY \end{bmatrix} \right\}$$

$$Y \in \{\tilde{e}_1, \tilde{e}_2, \tilde{e}_3, \tilde{e}_4\}$$

In Formula 48 and Formula 49 in the following, the $\tilde{e}_n$ indicates 4×1 vector and means a selection vector having $n^{th}$ element set to a value of 1 and having the rest of the elements set to 0.

For Rank 2, the selection of 8 kinds of different matrixes is possible and 2 kinds of different QPSK co-phases are applicable. Hence, total 16 W2 matrixes can be defined. For instance, the W2 codebook (CB$_2$) for Rank 2 can be configured as Formula 49.

$$W_2 \in C_2 = \left\{ \frac{1}{\sqrt{2}} \begin{bmatrix} Y_1 & Y_2 \\ Y_1 & -Y_2 \end{bmatrix}, \frac{1}{\sqrt{2}} \begin{bmatrix} Y_1 & Y_2 \\ jY_1 & -jY_2 \end{bmatrix} \right\} \quad \text{[Formula 49]}$$

$$(Y_1, Y_2) \in \{(\tilde{e}_1, \tilde{e}_1), (\tilde{e}_2, \tilde{e}_2), (\tilde{e}_3, \tilde{e}_3),$$
$$(\tilde{e}_4, \tilde{e}_4), (\tilde{e}_1, \tilde{e}_2), (\tilde{e}_2, \tilde{e}_3), (\tilde{e}_1, \tilde{e}_4), (\tilde{e}_2, \tilde{e}_4)\}$$

Subsequently, for Rank 3 and Rank 4, X corresponding to a block diagonal matrix W1 may be configured with a matrix in size of 4×8 (i.e., Nb=8). For each of Rank 3 and Rank 4, 4 W1 matrixes can be defined. And, one W1 may include beams overlapping with the adjacent W1. In case that beam indexes are given as 0, 1, 2, . . . , and 15, respectively, for example, it is able to configure 4 W1 matrixes, of which beams overlapping with the adjacent W1 matrix, such as $\{0,1,2, \ldots ,7\}$, $\{4,5,6, \ldots ,11\}$, $\{8,9,10, \ldots ,15\}$, and $\{12, \ldots ,15,0, \ldots ,3\}$. For instance, a W1 codebook for Rank 3 or Rank 4 may be defined as Formula 50.

$$B^j = [b_0^j \quad b_1^j \quad \ldots \quad b_{15}^j], \quad \text{[Formula 50]}$$

$$[B^i]_{1+m,1+n} = e^{j\frac{2\pi(m+jn)}{16}},$$

$$m = 0, 1, 2, 3, n = 0, 1, \ldots 15$$

$$X_i^{(k)} \in \{[b_{4k \bmod 16}^j \quad b_{(4k+1) \bmod 16}^j \quad \ldots \quad b_{(4k+7) \bmod 16}^j]: k = 0, 1, 2, 3\}$$

$$W_1^{(k)} = \begin{bmatrix} X_0^{(k)} & 0 \\ 0 & X_1^{(k)} \end{bmatrix}$$

Codebook 1: $C_1 = \{W_1^{(0)}, W_1^{(1)}, W_1^{(2)}, W_1^{(3)}\}$

In Formula 50, the $B^i$ corresponds to 16 beam vectors. The $X_i^{(k)}$ may be defined as a matrix containing 8 beam vectors. And, $X_i^{(k)}$ corresponding to a block of a block diagonal matrix $W1^{(k)}$ is defined. In particular, since one block matrix is defined as $X_0^{(k)}$ and the other block matrix is defined as $X_1^{(k)}$, the block matrixes differ from each other in phase. Thus, the W1 codebook ($C_1$) can be configured with 4 different W1's.

Considering the selection and common-phase component of W2, the selection of 4 kinds of different matrixes is possible for Rank 3 and 1 kind of QPSK co-phase are applicable for Rank 3. Hence, total 16 W2 matrixes can be defined. For instance, the W2 codebook (CB$_2$) for Rank 3 can be defined as Formula 51.

$$W_2 \in C_2 = \left\{ \frac{1}{\sqrt{2}} \begin{bmatrix} Y_1 & Y_2 \\ Y_1 & -Y_2 \end{bmatrix} \right\} \quad \text{[Formula 51]}$$

$$(Y_1, Y_2)$$

$$\in \begin{cases} (e_1, [e_1 \quad e_5]), (e_2, [e_2 \quad e_6]), (e_3, [e_3 \quad e_7]), (e_4, [e_4 \quad e_8]), \\ (e_5, [e_1 \quad e_5]), (e_6, [e_2 \quad e_6]), (e_7, [e_3 \quad e_7]), (e_8, [e_4 \quad e_8]), \\ ([e_1 \quad e_5], e_5), ([e_2 \quad e_6], e_6), ([e_3 \quad e_7], e_7), ([e_4 \quad e_8], e_8), \\ ([e_5 \quad e_1], e_1), ([e_6 \quad e_2], e_2), ([e_7 \quad e_3], e_3), ([e_8 \quad e_4], e_4), \end{cases}$$

In Formula 51 and Formula 52 in the following, the $e_n$ indicates 8×1 vector and means a selection vector having $n^{th}$ element set to a value of 1 and having the rest of the elements set to 0.

For Rank 4, the selection of 4 kinds of different matrixes is possible and 2 kinds of different QPSK co-phases are applicable. Hence, total 8 W2 matrixes can be defined. For instance, the W2 codebook and the W1 codebook for Rank 4 and can be configured as Formula 52.

$$W_2 \in C_2 = \left\{ \frac{1}{\sqrt{2}} \begin{bmatrix} Y & Y \\ Y & -Y \end{bmatrix}, \frac{1}{\sqrt{2}} \begin{bmatrix} Y & Y \\ jY & -jY \end{bmatrix} \right\} \quad \text{[Formula 52]}$$

$$Y \in \{[e_1 \quad e_5], [e_2 \quad e_6], [e_3 \quad e_7], [e_4 \quad e_8]\}$$

For Rank 5 to Rank 8, X corresponding to a block of a block diagonal matrix W1 can be configured with DFT matrix in size of 4×4 and one W1 matrix can be defined. W2 may be defined as a product of a matrix $$\begin{bmatrix} I & I \\ I & -I \end{bmatrix}$$

and a row selection matrix in a fixed size of 8×r. For each of Rank 5 to Rank 8, since selection of 1 kind of a matrix is possible, one W2 matrix can be defined. In this case, the matrix $$\begin{bmatrix} I & I \\ I & -I \end{bmatrix}$$

is introduced to enable all polarized groups for each transmission layer to be identically used and good performance may be expected for a transmission of a high rank having a spatial channel having more scattering. In this case, the I means an identity matrix.

For instance, the W1 codebook and the W2 codebook for Rank 5 to Rank 8 can be defined as Formula 53.

$$X = \frac{1}{2} \times \begin{bmatrix} 1 & 1 & 1 & 1 \\ 1 & j & -1 & -j \\ 1 & -1 & 1 & -1 \\ 1 & -j & -1 & j \end{bmatrix}, \quad \text{[Formula 53]}$$

$$W_1 \in C_1 = \left\{ \begin{bmatrix} X & 0 \\ 0 & X \end{bmatrix} \right\}$$

-continued $$W_2 \in C_2 = \left\{ \frac{1}{\sqrt{2}} Y \right\}$$

In Formula 53, the W1 codebook for Rank 5 to Rank 8 is configured with one W1 matrix only. In Formula 53, Y matrix defined in the W2 codebook can be defined as one of Formula 54 to Formula 57 for example. In Formula 54 to Formula 57, the $\tilde{e}_n$ indicates 4×1 vector and means a selection vector having $n^{th}$ element set to a value of 1 and having the rest of the elements set to 0.

The matrix Y for Rank 5 can be defined as Formula 54.

$$Y = \begin{bmatrix} \tilde{e}_1 & \tilde{e}_1 & \tilde{e}_2 & \tilde{e}_2 & \tilde{e}_5 \\ \tilde{e}_1 & -\tilde{e}_1 & \tilde{e}_2 & -\tilde{e}_2 & -\tilde{e}_5 \end{bmatrix}$$ [Formula 54]

The matrix Y for Rank 6 can be defined as Formula 55.

$$Y = \begin{bmatrix} \tilde{e}_1 & \tilde{e}_1 & \tilde{e}_2 & \tilde{e}_2 & \tilde{e}_3 & \tilde{e}_3 \\ \tilde{e}_1 & -\tilde{e}_1 & \tilde{e}_2 & -\tilde{e}_2 & \tilde{e}_3 & -\tilde{e}_3 \end{bmatrix}$$ [Formula 55]

The matrix Y for Rank 7 can be defined as Formula 56.

$$Y = \begin{bmatrix} \tilde{e}_1 & \tilde{e}_1 & \tilde{e}_2 & \tilde{e}_2 & \tilde{e}_3 & \tilde{e}_3 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 \end{bmatrix}$$ [Formula 56]

The matrix Y for Rank 8 can be defined as Formula 57.

$$Y = \begin{bmatrix} \tilde{e}_1 & \tilde{e}_1 & \tilde{e}_2 & \tilde{e}_2 & \tilde{e}_3 & \tilde{e}_3 & \tilde{e}_4 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 & -\tilde{e}_4 \end{bmatrix}$$ [Formula 57]

As mentioned in the foregoing description, the numbers of W1's, which can be defined for each of Rank 1 to Rank 8, are added up to result in 28 (=8+8+4+4+1+1+1+1).

4$^{th}$ Embodiment

The present embodiment relates to a method of configuring codebooks for Rank 1 to Rank 4. According to the present embodiment, which is similar to the aforementioned codebook structure (2), W1 is configured as a block diagonal matrix and a portion of a block matrix X of W1 is multiplied by a linear phase value. To this end, 16 4Tx DFT vectors are generated from W1 and W2 and the block matrix X of the W1 can be configured with 2×Nb matrix. In the following description, detailed examples of the codebook structure according to the present embodiment are explained.

First of all, in case that a precoding weight W is configured with a combination of 2 base matrixes W1 and W2, it may be defined as W=W1*W2. In this case, for Rank 1 to Rank 4, the W1 may have such a form of a block diagonal matrix as $$\begin{bmatrix} X & 0 \\ 0 & X \end{bmatrix}.$$

Using the W1 in form of the block diagonal matrix for a precoding matrix, even of an antenna interval has a prescribed value (e.g., λ/2, 4λ, etc.) in a dual-polarized antenna configuration, it is able to meet the spatial covariance indicating correlation of a spatial channel created by each antenna of the antenna configuration. Moreover, by at least 16 4Tx DFT vectors generated from the W1 and the co-phase component via the W2, it is able to meet the spatial covariance in the ULA antenna configuration. Hence, it may be able to expect good performance for both an antenna configuration having high spatial correlation and an antenna configuration having low spatial correlation.

For Rank 1 to Rank 4, X corresponding to a block of a block diagonal matrix W1 may be configured with a matrix in size of 2×Nb. And, 16 2Tx DFT beams can be defined for the X. In this case, beams indexes may be given as 0, 1, 2, ..., and 15, respectively. For each W1, the adjacent overlapping beams may be usable to reduce an edge effect in frequency-selective precoding. Hence, even if a codebook is configured using the same W1 for an identical or different W2, optimal performance can be secured for several subbands.

For Rank 1 and Rank 2, X corresponding to a block diagonal matrix W1 may be configured with a matrix in size of 2×4 (i.e., Nb=4). For each of Rank 1 and Rank 2, 8 W1 matrixes can be defined. And, one W1 may include beams overlapping with the adjacent W1. In case that beam indexes are given as 0, 1, 2, ..., and 15, respectively, for example, it is able to configure 8 W1 matrixes, of which beams overlapping with the adjacent W1 matrix, such as {0, 1, 2, 3}, {2, 3, 4, 5}, {4, 5, 6, 7}, {6, 7, 8, 9}, {8, 9, 10, 11}, {10, 11, 12, 13}, {12, 13, 14, 15}, and {14, 15, 0, 1}. For instance, a W1 codebook for Rank 1 or Rank 2 may be defined as Formula 58.

$$B^i = [b_0^i \quad b_1^i \quad \ldots \quad b_{15}^i],$$ [Formula 58]

$$[B^i]_{1+m, 1+n} = e^{j\frac{2\pi(m+2i)n}{16}},$$

$$m = 0, 1, 2, 3, n = 0, 1, \ldots 15$$

$$X_i^{(k)} \in$$

$$\{[b_{2k \bmod 16}^i \quad b_{(2k+1) \bmod 16}^i \quad b_{(2k+2) \bmod 16}^i \quad b_{(2k+3) \bmod 16}^i] : k = 0, 1, \ldots, 7\}$$

$$W_1^{(k)} = \begin{bmatrix} X_0^{(k)} & 0 \\ 0 & X_1^{(k)} \end{bmatrix}$$

Codebook 1: $C_1 = \{W_1^{(0)}, W_1^{(1)}, W_1^{(2)}, W_1^{(7)}\}$

In Formula 58, an expression for a beam vector $B^i$ is $$e^{j\frac{2\pi(m+2i)n}{16}},$$

which is different from $$e^{j\frac{2\pi(m+4i)n}{16}}$$

in Formula 47 that defines the beam vector for Rank 1 and Rank 2 in the 3$^{rd}$ embodiment. In Formula 58, the $B^i$ corresponds to 16 beam vectors. $X_i^{(k)}$ may be defined as a matrix containing 4 beam vectors. Moreover, $X_i^{(k)}$ corresponding to a block of a block diagonal matrix W1$^{(k)}$ is defined. Since one block matrix is defined as $X_0^{(k)}$ and the other block matrix is defined as $X_1^{(k)}$, the block matrixes differ from each other in phase. Thus, the W1 codebook ($C_1$) can be configured with 8 different W1's.

Considering the selection and common-phase component of W2, the selection of 4 kinds of different matrixes is possible for Rank 1 and 4 kinds of different QPSK co-phases are applicable for Rank 1. Hence, total 16 W2 matrixes can be defined. For instance, the W2 codebook ($CB_2$) for Rank 1 can be configured as Formula 59.

$$W_2 \in C_2 = \left\{ \frac{1}{\sqrt{2}}\begin{bmatrix} Y \\ Y \end{bmatrix}, \frac{1}{\sqrt{2}}\begin{bmatrix} Y \\ jY \end{bmatrix}, \frac{1}{\sqrt{2}}\begin{bmatrix} Y \\ -Y \end{bmatrix}, \begin{bmatrix} Y \\ -jY \end{bmatrix} \right\} \quad \text{[Formula 59]}$$

$$Y \in \{\tilde{e}_1, \tilde{e}_2, \tilde{e}_3, \tilde{e}_4\}$$

In Formula 59 and Formula 60 in the following, the $\tilde{e}_n$ indicates 4×1 vector and means a selection vector having $n^{th}$ element set to a value of 1 and having the rest of the elements set to 0.

For Rank 2, the selection of 8 kinds of different matrixes is possible and 2 kinds of different QPSK co-phases are applicable. Hence, total 16 W2 matrixes can be defined. For instance, the W2 codebook ($CB_2$) for Rank 2 can be configured as Formula 60.

$$W_2 \in C_2 = \left\{ \frac{1}{\sqrt{2}}\begin{bmatrix} Y_1 & Y_2 \\ Y_1 & -Y_2 \end{bmatrix}, \frac{1}{\sqrt{2}}\begin{bmatrix} Y_1 & Y_2 \\ jY_1 & -jY_2 \end{bmatrix} \right\} \quad \text{[Formula 60]}$$

$$(Y_1, Y_2) \in \{(\tilde{e}_1, \tilde{e}_1), (\tilde{e}_2, \tilde{e}_2), (\tilde{e}_3, \tilde{e}_3),$$
$$(\tilde{e}_4, \tilde{e}_4), (\tilde{e}_1, \tilde{e}_2), (\tilde{e}_2, \tilde{e}_3), (\tilde{e}_1, \tilde{e}_4), (\tilde{e}_2, \tilde{e}_4)\}$$

Subsequently, for Rank 3 and Rank 4, X corresponding to a block diagonal matrix W1 may be configured with a matrix in size of 2×8 (i.e., Nb=8). For each of Rank 3 and Rank 4, 4 W1 matrixes can be defined. And, one W1 may include beams overlapping with the adjacent W1. In case that beam indexes are given as 0, 1, 2, . . . , and 15, respectively, for example, it is able to configure 4 W1 matrixes, of which beams overlapping with the adjacent W1 matrix, such as {0,1,2, . . . ,7}, {4,5,6, . . . ,11}, {8,9,10, . . . ,15}, and {12, . . . , 15,0, . . . ,3}. For instance, a W1 codebook for Rank 3 or Rank 4 may be defined as Formula 61.

$$B^i = [b_0^i \ b_1^i \ \ldots \ b_{15}^i], \ [B^i]_{1+m, 1+n} = e^{j\frac{2\pi(m+2i)n}{16}}, \quad \text{[Formula 61]}$$

$$m = 0, 1, 2, 3, n = 0, 1, \ldots 15$$

$$X_i^{(k)} \in \{[b_{4k \bmod 16}^i \ b_{(4k+1) \bmod 16}^i \ \ldots \ b_{(4k+7) \bmod 16}^i] : k = 0, 1, 2, 3\}$$

$$W_1^{(k)} = \begin{bmatrix} X_0^{(k)} & 0 \\ 0 & X_1^{(k)} \end{bmatrix}$$

Codebook 1: $C_1 = \{W_1^{(0)}, W_1^{(1)}, W_1^{(2)}, W_1^{(3)}\}$

In Formula 61, an expression for a beam vector $B^i$ is $$e^{j\frac{2\pi(m+2i)n}{16}},$$

which is different from $$e^{j\frac{2\pi(m+2i)n}{16}}$$

in Formula 50 that defines the beam vector for Rank 3 and Rank 4 in the $3^{rd}$ embodiment. In Formula 61, the $B^i$ corresponds to 16 beam vectors. $X_i^{(k)}$ may be defined as a matrix containing 8 beam vectors. Moreover, $X_i^{(k)}$ corresponding to a block of a block diagonal matrix $W1^{(k)}$ is defined. Since one block matrix is defined as $X_0^{(k)}$ and the other block matrix is defined as $X_1^{(k)}$, the block matrixes differ from each other in phase. Thus, the W1 codebook ($C_1$) can be configured with 4 different W1's.

Considering the selection and common-phase component of W2, the selection of 16 kinds of different matrixes is possible for Rank 3 and 1 kind of QPSK co-phase is applicable for Rank 3. Hence, total 16 W2 matrixes can be defined. For instance, the W2 codebook for Rank 3 can be configured as Formula 62.

$$W_2 \in C_2 = \left\{ \frac{1}{\sqrt{2}}\begin{bmatrix} Y_1 & Y_2 \\ Y_1 & -Y_2 \end{bmatrix} \right\} \quad \text{[Formula 62]}$$

$$(Y_1, Y_2) \in \begin{Bmatrix} (e_1, [e_1 \ e_5]), (e_2, [e_2 \ e_6]), (e_3, [e_3 \ e_7]), (e_4, [e_4 \ e_8]), \\ (e_5, [e_1 \ e_5]), (e_6, [e_2 \ e_6]), (e_7, [e_3 \ e_7]), (e_8, [e_4 \ e_8]), \\ ([e_1 \ e_5], e_5), ([e_2 \ e_6], e_6), ([e_3 \ e_7], e_7), ([e_4 \ e_8], e_8), \\ ([e_5 \ e_1]), e_1, ([e_6 \ e_2], e_2), ([e_7 \ e_3], e_3), ([e_8 \ e_4], e_4) \end{Bmatrix}$$

In Formula 62 and Formula 63 in the following, the $e_n$ indicates 8×1 vector and means a selection vector having $n^{th}$ element set to a value of 1 and having the rest of the elements set to 0.

For Rank 4, the selection of 4 kinds of different matrixes is possible and 2 kinds of different QPSK co-phases are applicable. Hence, total 8 W2 matrixes can be defined. For instance, the W2 codebook and the W1 codebook for Rank 4 can be defined as Formula 63.

$$W_2 \in C_2 = \left\{ \frac{1}{\sqrt{2}}\begin{bmatrix} Y & Y \\ Y & -Y \end{bmatrix}, \frac{1}{\sqrt{2}}\begin{bmatrix} Y & Y \\ jY & -jY \end{bmatrix} \right\} \quad \text{[Formula 63]}$$

$$Y \in \{[e_1 \ e_5], [e_2 \ e_6], [e_3 \ e_7], [e_4 \ e_8]\}$$

As mentioned in the foregoing description, the numbers of W1's, which can be defined for each of Rank 1 to Rank 4, are added up to result in 24 (=8+8+4+4).

Regarding a precoding weight to be applied in an MOMO transmitting end (e.g., a base station) according to various embodiments of the present invention mentioned in the foregoing description, an MIMO receiving end (e.g., a user equipment) selects a 1st PMI (W1) and a $2^{nd}$ PMI (W2) preferred by itself based on channel state and the like measured by the receiving end and is then able to report them to the MIMO transmitting end. In some cases, the MIMO transmitting end determines an appropriate precoding weight in consideration of the W1 and W2 reported by the MIMO receiving end and is then able to apply it to MIMO transmission (yet, in aspect of the transmitting end, it may not be necessary to use the W1 and W2 reported by the receiving end).

In case that W1 ($1^{st}$ PMI) and/or W2 ($2^{nd}$ PMI) is periodically fed back via a physical uplink control channel (PUCCH), a transmission mode mentioned in the following description can be set. This shall be named CSI (channel state information) mode 1 or CSI mode 2.

In CSI mode1, an MIMO receiving end (e.g., a user equipment) is able to transmit W1 and W2 in separate subframes, respectively. For instance, the W1 is transmitted in a $1^{st}$ subframe together with a rank indicator (RI) and the W2 is transmitted in a $2^{nd}$ subframe. In this case, the W1 and the RI can be jointly-encoded and the jointly-encoded W1 and RI can have a size of 5 bits. Having received the W1 and the W2 in different subframes, respectively, an MIMO transmitting end (e.g., a base station) is able to select a precoder (W) to apply to MIMO transmission in consideration of the received W1 and W2.

In CSI mode2, it may be able to determine a precoder (W), which is to be applied to MIMO transmission, based on a single report transmitted limitedly in a single subframe. So to speak, an MIMO receiving end (e.g., a user equipment) is able to transmit both W1 and W2 in a single subframe. In doing so, when control information is transmitted on PUCCH, if W1 and W2 are transmitted together with CQI, a payload size is limited to maximum 11 bits. Hence, sub-sampling may be applied to the W1 and/or the W2 to prevent a total payload size from exceeding 11 bits. For instance, different subsets capable of having the common-phase in any codebooks are usable for different groups at beam angle.

According to the various embodiments mentioned in the foregoing description, in configuring a precoder codebook applied to maximum 8-Tx antenna transmission using 2 base matrixes, a codebook having good performance can be provided by reducing feedback overhead. And, a codebook capable of securing good performance in various antenna configurations can be provided.

An uplink MIMO transmission and reception method according to one preferred embodiment of the present invention is described with reference to FIG. 24 as follows.

Figure 24:
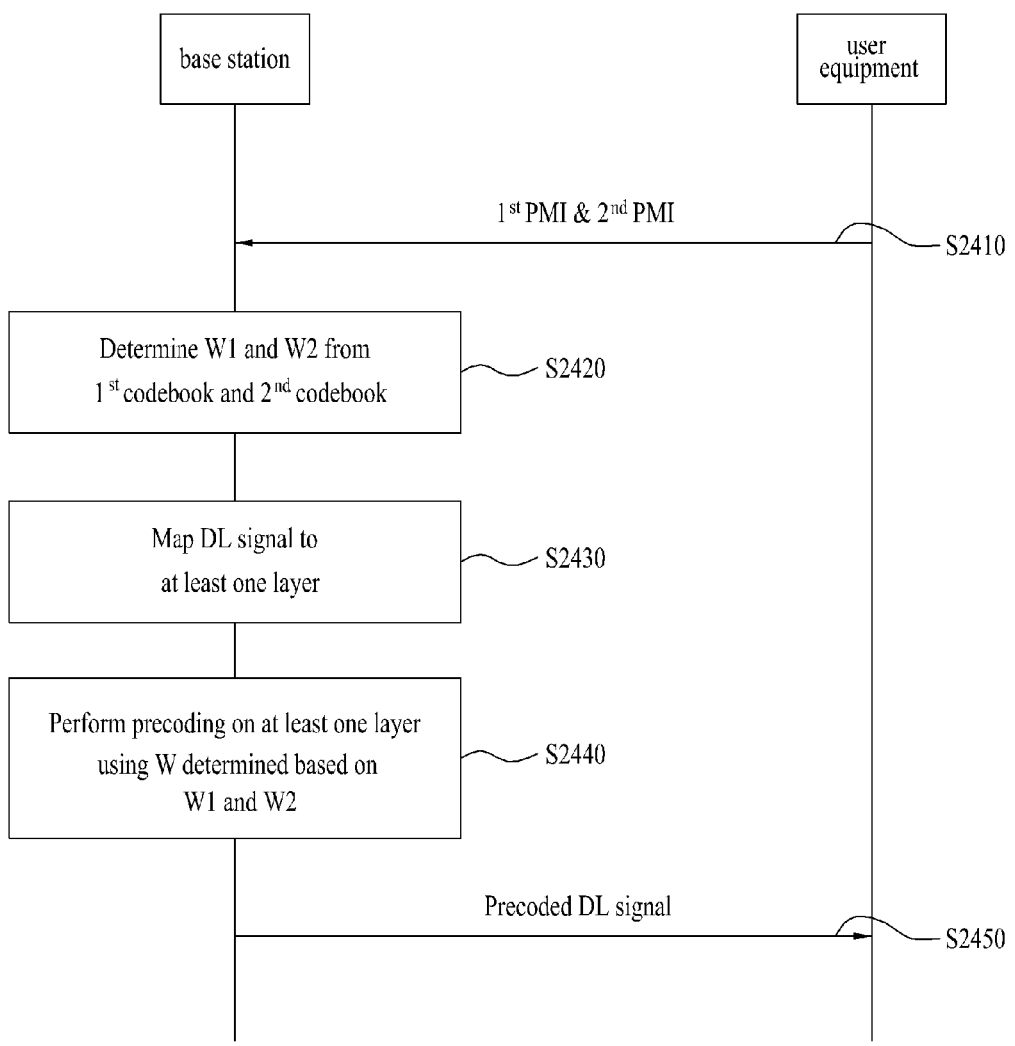
FIG. 24 is a flowchart for a multi-antenna transmission and reception method according to the present invention.

Referring to FIG. 24, a user equipment may transmit a $1^{st}$ PMI and a $2^{nd}$ PMI to a base station and the base station may receive them [S2410]. Before the step S2410, the user equipment may be able to create channel state information by measuring a DL channel from the base station. In this case, the channel state information (CSI) may include RI, PMI and CQI. In particular, the PMI may include the $1^{st}$ PMI (e.g., W1) and the $2^{nd}$ PMI (e.g., W2). In the step S2410, the PMI may be transmitted to the base station. In doing so, the user equipment may be able to transmit the $1^{st}$ PMI and the $2^{nd}$ PMI in the same UL subframe. Alternatively, the user equipment may transmit the $1^{st}$ PMI and the $2^{nd}$ PMI in different UL subframes, respectively.

The base station may be able to determine a precoding matrix to apply to a DL transmission in consideration of the received $1^{st}$ PMI and the received $2^{nd}$ PMI [S2420]. Each of the $1^{st}$ PMI and the $2^{nd}$ PMI transmitted by the user equipment includes the information indicating the precoding matrix preferred by the user equipment and candidates of the precoding matrixes configure a codebook. In this case, the codebooks according to the aforementioned various embodiments of the present invention may available. For instance, both of the user equipment and the base station share the codebook including the precoding matrixes W1's indicated by the $1^{st}$ PMI with each other in advance. Each of the W1's may include block diagonal matrixes. And, one of the block matrixes (X) of the W1 may be multiplied by a phase value. Both of the user equipment and the base station share the codebook including W2's of the precoding matrixes indicated by the $2^{nd}$ PMI with each other in advance and the W2's may be configured by the method according to one of the various embodiments of the present invention mentioned in the foregoing description.

A DL signal may be mapped to at least one layer by the base station [S2430].

The base station may be able to perform a precoding on the at least one layer, to which the DL signal is mapped, using the precoding matrix (W) [S2440]. In doing so, it is able to determine the precoding matrix based on the W1 and the W2.

The base station may transmit the precoded DL signal to the user equipment and the user equipment may then receive it [S2450]. After the step S2450, the user equipment may be able to reconstruct the DL signal by processing the received DL signal based on the same precoding matrix (W) applied to the DL signal by the base station [e.g., an inverse precoding is performed on the received DL signal].

In the codebook based signal transmitting/receiving method according to the present invention described with reference to FIG. 24, the matters of the various embodiments of the present invention mentioned in the foregoing description are independently applicable or at least two of the various embodiments of the present invention may be simultaneously applicable. And, duplicate contents may be omitted for clarity.

The principle of the present invention described through various embodiments of the present invention may be identically applicable to UL MIMO transmission and reception for MIMO transmission between a base station and a relay node (e.g., backhaul UL and backhaul DL) or MIMO transmission between a relay node and a user equipment (e.g., access UL and access DL).

Figure 25:
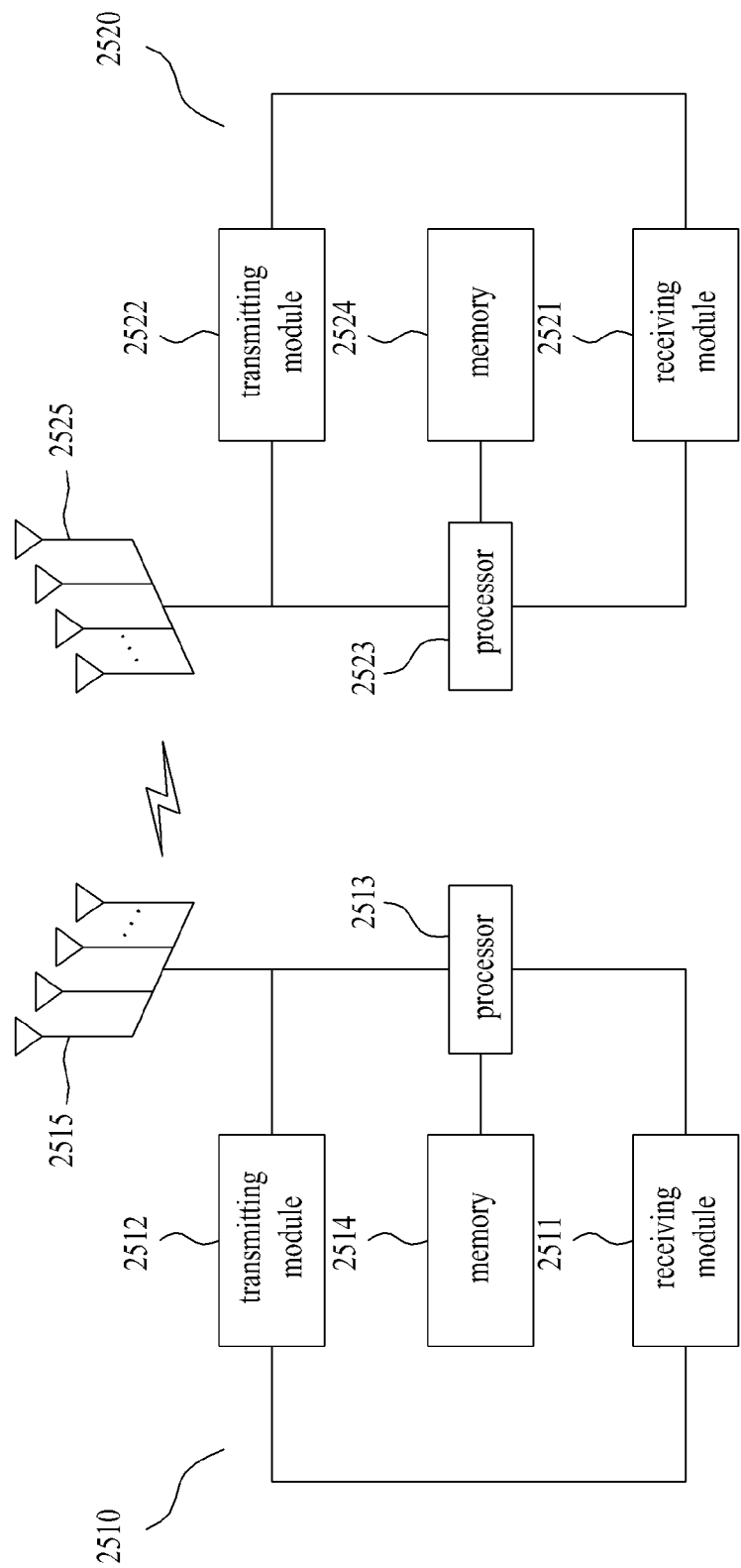
FIG. 25 is a diagram for configurations of a base station device and a user equipment device according to the present invention.

FIG. 25 is a diagram for configurations of a base station device and a user equipment device according to the present invention.

Referring to FIG. 25, a base station device 2510 according to the present invention may include a receiving module 2511, a transmitting module 2512, a processor 2513, a memory 2514 and a plurality of antennas 2515. In this case, a plurality of the antennas 2515 may mean a base station device that supports MIMO transmission and reception. The receiving module 2511 may be able to receive various signals, data, information and the like in uplink from a user equipment. The transmitting module 2512 may be able to transmit various signals, data, information and the like in downlink to the user equipment. Moreover, the processor 2513 may be configured to control overall operations of the base station device 2510.

The base station device 2510 according to one embodiment of the present invention may be configured to transmit a DL signal. And, the memory 2514 of the base station device may store a codebook including precoding matrixes. The processor 2513 of the base station device 2510 may be configured to receive a $1^{st}$ precoding matrix indicator (PMI) and a $2^{nd}$ PMI from the user equipment via the receiving module 2511. The processor 2513 may be configured to determine a $1^{st}$ matrix (W1) from a $1^{st}$ codebook including the precoding matrixes indicated by the $1^{st}$ PMI and determine a $2^{nd}$ matrix (W2) from a $2^{nd}$ codebook including the precoding matrixes indicated by the $2^{nd}$ PMI. The processor 2513 may be configured to determine a precoding matrix (W) based on the $1^{st}$ matrix (W1) and the $2^{nd}$ matrix (W2). The processor 2513 may be configured to perform a precoding on at least one layer, to which the DL signal is mapped, using the determined precoding matrix (W). The processor 2513 may be configured to transmit the precoded signal to the user equipment via the transmitting module 2512. In this case, each of the precoding matrixes included in the $1^{st}$ codebook includes a block diagonal matrix. And, one block may have a form multiplied by a prescribed phase value, which is different from the other.

The processor 2513 of the base station device 2510 performs a function of operating information received by the user equipment device, information to be externally transmitted and the like. The memory 2514 may be able to store the operated information and the like for prescribed duration and may be substituted with such a component as a buffer (not shown in the drawing) and the like.

Referring to FIG. 25, a user equipment device (UE) 2520 according to the present invention may include a receiving module 2521, a transmitting module 2522, a processor 2523, a memory 2524 and a plurality of antennas 2525. In this case, a plurality of the antennas 2525 may mean a user equipment device that supports MIMO transmission and reception. The receiving module 2521 may be able to receive various signals, data, information and the like in downlink from the base station. The transmitting module 2522 may be able to transmit various signals, data, information and the like in UL to the base station. Moreover, the processor 2523 may be configured to control overall operations of the user equipment device 2520.

The user equipment device 2520 according to one embodiment of the present invention may be configured to receive and process a DL signal. And, the memory 2524 of the user equipment device may store a codebook including precoding matrixes. The processor 2523 of the user equipment device 2520 may be configured to transmit a $1^{st}$ precoding matrix indicator (PMI) and a $2^{nd}$ PMI to the base station via the transmitting module 2522. The processor 2523 may be configured to receive the DL signal via the receiving module 2521. In this case, the DL signal received by the user equipment corresponds to the DL signal precoded by the base station using the precoding matrix (W). In particular, the precoding may be performed on at least one layer to which the DL signal is mapped by the base station. In this case, the precoding matrix (W) may be determined based on the $1^{st}$ matrix (W1) determined from the $1^{st}$ codebook including the precoding matrixes indicated by the $1^{st}$ PMI and the $2^{nd}$ matrix (W2) determined from the $2^{nd}$ codebook including the precoding matrixes indicated by the $2^{nd}$ PMI. The processor 2513 may be configured to determine a precoding matrix (W) based on the $1^{st}$ matrix (W1) and the $2^{nd}$ matrix (W2). The processor 2513 may be configured to process the received DL signal using the determined precoding matrix (W). In this case, each of the precoding matrixes included in the $1^{st}$ codebook includes a block diagonal matrix. And, one block may have a form multiplied by a prescribed phase value, which is different from the other.

The processor 2523 of the user equipment device 2520 performs a function of operating information received by the user equipment device, information to be externally transmitted and the like. The memory 2524 may be able to store the operated information and the like for prescribed duration and may be substituted with such a component as a buffer (not shown in the drawing) and the like.

The detailed configurations of the base station device and the user equipment device mentioned in the above description may be implemented in a manner that the matters of the various embodiments of the present invention mentioned in the foregoing description are independently applicable or that at least two of the various embodiments of the present invention are simultaneously applicable. And, duplicate contents may be omitted for clarity.

In the description with reference to FIG. 25, the description of the base station device 2510 may be identically applicable to a relay device as a DL transmission entity or a UL reception entity. And, the description of the user equipment device 2520 may be identically applicable to a relay device as a DL reception entity or a UL transmission entity.

Embodiments of the present invention may be implemented using various means. For instance, embodiments of the present invention can be implemented using hardware, firmware, software and/or any combinations thereof.

In the implementation by hardware, a method according to each embodiment of the present invention can be implemented by at least one selected from the group consisting of ASICs (application specific integrated circuits), DSPs (digital signal processors), DSPDs (digital signal processing devices), PLDs (programmable logic devices), FPGAs (field programmable gate arrays), processor, controller, microcontroller, microprocessor and the like.

In case of the implementation by firmware or software, a method according to each embodiment of the present invention can be implemented by modules, procedures, and/or functions for performing the above-explained functions or operations. Software code is stored in a memory unit and is then drivable by a processor. The memory unit is provided within or outside the processor to exchange data with the processor through the various means known to the public.

As mentioned in the foregoing description, the detailed descriptions for the preferred embodiments of the present invention are provided to be implemented by those skilled in the art. While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents. For instance, the respective configurations disclosed in the aforesaid embodiments of the present invention can be used by those skilled in the art in a manner of being combined with one another. Therefore, the present invention is non-limited by the embodiments disclosed herein but intends to give a broadest scope matching the principles and new features disclosed herein.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents. And, it is apparently understandable that an embodiment is configured by combining claims failing to have relation of explicit citation in the appended claims together or can be included as new claims by amendment after filing an application.

INDUSTRIAL APPLICABILITY

The embodiments of the present invention mentioned in the foregoing description may be applicable to various kinds of mobile communication systems.

What is claimed is:

1. A method of transmitting a downlink signal, which is transmitted by a base station, comprising the steps of:
receiving a $1^{st}$ PMI (precoding matrix indicator) and a $2^{nd}$ PMI from a user equipment;
determining a $1^{st}$ matrix (W1) from a $1^{st}$ codebook including precoding matrixes indicated by the $1^{st}$ PMI, determining a $2^{nd}$ matrix (W2) from a $2^{nd}$ codebook including precoding matrixes indicated by the $2^{nd}$ PMI, determining a precoding matrix (W) based on the $1^{st}$ matrix (W1) and the $2^{nd}$ matrix (W2);

performing a precoding on at least one layer having the downlink signal mapped thereto using the determined precoding matrix (W); and transmitting the precoded signal to the user equipment, wherein each of the precoding matrixes included in the $1^{st}$ code book is configured with a block diagonal matrix, the block diagonal matrix including a first block and a second block on a diagonal, wherein the second block is multiplied by a prescribed phase value while the first block is not multiplied by the prescribed phase value, and wherein the $1^{st}$ matrix (W1) is configured as a following formula:

$$W_1^{(n)} = \begin{bmatrix} X^{(n)} & 0 \\ 0 & \alpha^{(n)} X^{(n)} \end{bmatrix},$$

wherein the $X^{(n)}$ and the $\alpha^{(n)} X^{(n)}$ respectively correspond to the first and the second blocks of the block diagonal matrix, and wherein the $\alpha^{(n)}$ corresponds to the prescribed phase value.

2. The method of claim 1, wherein the $X^{(n)}$ is configured with a DFT (Discrete Fourier Transform) vector defined as a following formula:

$$X^{(n)} = \frac{1}{\sqrt{K}} e^{j\frac{2\pi nk}{N}} \, n = 0, \ldots, N-1 \, k = 0, \ldots, K-1,$$

wherein the N indicates the number of the DFT vectors, and wherein the K indicates a length of the DFT vector.

3. The method of claim 1, wherein the $\alpha^{(n)}$ is defined as a following formula:

$$\alpha^{(n)} = e^{j\frac{2\pi nk}{N}} \, n = 0, \ldots, N-1.$$

4. The method of claim 1, wherein the $\alpha^{(n)}$ is defined as a phase diagonal matrix represented as a following formula:

$$\alpha^{(n)} = \text{diag}(e^{j\theta_0(n)} \ldots e^{j\theta_{K-1}(n)}) = \begin{bmatrix} e^{j\theta_0(n)} & 0 & \ldots & 0 \\ 0 & e^{j\theta_1(n)} & \ldots & 0 \\ \vdots & \vdots & \ddots & \vdots \\ 0 & 0 & \ldots & e^{j\theta_{K-1}(n)} \end{bmatrix}.$$

5. A method of receiving a downlink signal, which is received by a user equipment, comprising the steps of:

transmitting a $1^{st}$ PMI (precoding matrix indicator) and a $2^{nd}$ PMI to a base station;

receiving a signal having a precoding performed on at least one layer having the downlink signal mapped thereto from the base station using a precoding matrix (W) determined based on a $1^{st}$ matrix (W1) determined from a $1^{st}$ codebook including precoding matrixes indicated by the $1^{st}$ PMI and a $2^{nd}$ matrix (W2) determined from a $2^{nd}$ codebook including precoding matrixes indicated by the $2^{nd}$ PMI; and processing the received downlink signal using the precoding matrix (W), wherein each of the precoding matrixes included in the $1^{st}$ code book is configured with a block diagonal matrix, the block diagonal matrix including a first block and a second block on a diagonal, wherein the second block is multiplied by a prescribed phase value while the first block is not multiplied by the prescribed phase value, and wherein the $1^{st}$ matrix (W1) is configured as a following formula:

$$W_1^{(n)} = \begin{bmatrix} X^{(n)} & 0 \\ 0 & \alpha^{(n)} X^{(n)} \end{bmatrix},$$

wherein the $X^{(n)}$ and the $\alpha^{(n)} X^{(n)}$ respectively correspond to the first and the second blocks of the block diagonal matrix, and wherein the $\alpha^{(n)}$ corresponds to the prescribed phase value.

6. The method of claim 5, wherein the $X^{(n)}$ is configured with a DFT (Discrete Fourier Transform) vector defined as a following formula:

$$X^{(n)} = \frac{1}{\sqrt{K}} e^{j\frac{2\pi nk}{N}} \, n = 0, \ldots, N-1 \, k = 0, \ldots, K-1,$$

wherein the N indicates the number of the DFT vectors, and wherein the K indicates a length of the DFT vector.

7. The method of claim 5, wherein the $\alpha^{(n)}$ is defined as a following formula:

$$\alpha^{(n)} = e^{j\frac{2\pi nk}{N}} \, n = 0, \ldots, N-1.$$

8. The method of claim 5, wherein the $\alpha^{(n)}$ is defined as a phase diagonal matrix represented as a following formula:

$$\alpha^{(n)} = \text{diag}(e^{j\theta_0(n)} \ldots e^{j\theta_{K-1}(n)}) = \begin{bmatrix} e^{j\theta_0(n)} & 0 & \ldots & 0 \\ 0 & e^{j\theta_1(n)} & \ldots & 0 \\ \vdots & \vdots & \ddots & \vdots \\ 0 & 0 & \ldots & e^{j\theta_{K-1}(n)} \end{bmatrix}.$$

9. A base station, which transmits a downlink signal, comprising:

a transmitting module transmitting a downlink signal to a user equipment;

a receiving module receiving an uplink signal from the user equipment;

a memory storing a codebook including precoding matrixes; and a processor controlling the base station, the processor configured to receive a $1^{st}$ PMI (precoding matrix indicator) and a $2^{nd}$ PMI from the user equipment via the receiving module, the processor configured to determine a $1^{st}$ matrix (W1) from a $1^{st}$ codebook including precoding matrixes indicated by the $1^{st}$ PMI, determine a $2^{nd}$ matrix (W2) from a $2^{nd}$ codebook including precoding matrixes indicated by the $2^{nd}$ PMI, and determine a precoding matrix (W) based on the $1^{st}$ matrix (W1) and the $2^{nd}$ matrix (W2), the processor configured to perform a precoding on at least one layer having the downlink signal mapped thereto using the determined precoding matrix (W), the processor configured to transmit the precoded signal to the user equipment, wherein each of the precoding matrixes included in the $1^{st}$ code book is configured with a block diagonal matrix, the block diagonal matrix including a first block and a second block on a diagonal and wherein the second block is multiplied by a prescribed phase value while the first block is not multiplied by the prescribed phase value, wherein the $1^{st}$ matrix (W1) is configured as a following formula:

$$W_1^{(n)} = \begin{bmatrix} X^{(n)} & 0 \\ 0 & \alpha^{(n)} X^{(n)} \end{bmatrix},$$

wherein the $X^{(n)}$ and the $\alpha^{(n)} X^{(n)}$ respectively correspond to the first and the second blocks of the block diagonal matrix, and wherein the $\alpha^{(n)}$ corresponds to the prescribed phase value.

10. A user equipment, which receives a downlink signal, comprising:

a receiving module receiving the downlink signal from a base station;

a transmitting module transmitting an uplink signal to the base station;

a memory storing a codebook including precoding matrixes; and a processor controlling the user equipment, the processor configured to transmit a $1^{st}$ PMI (precoding matrix indicator) and a $2^{nd}$ PMI to the base station via the transmitting module, the processor configured to receive a signal having a precoding performed on at least one layer having the downlink signal mapped thereto from the base station via the receiving module using a precoding matrix (W) determined based on a $1^{st}$ matrix (W1) determined from a $1^{st}$ codebook including precoding matrixes indicated by the $1^{st}$ PMI and a $2^{nd}$ matrix (W2) determined from a $2^{nd}$ codebook including precoding matrixes indicated by the $2^{nd}$ PMI, the processor configured to process the received downlink signal using the precoding matrix (W), wherein each of the precoding matrixes included in the $1^{st}$ code book is configured with a block diagonal matrix, the block diagonal matrix including a first block and a second block on a diagonal and wherein the second block is multiplied by a prescribed phase value while the first block is not multiplied by the prescribed phase value, wherein the $1^{st}$ matrix (W1) is configured as a following formula:

$$W_1^{(n)} = \begin{bmatrix} X^{(n)} & 0 \\ 0 & \alpha^{(n)} X^{(n)} \end{bmatrix},$$

wherein the $X^{(n)}$ and the $\alpha^{(n)} X^{(n)}$ respectively correspond to the first and the second blocks of the block diagonal matrix, and wherein the $\alpha^{(n)}$ corresponds to the prescribed phase value.

* * * * *